US008569827B2

(12) United States Patent
Lee et al.

(10) Patent No.: US 8,569,827 B2
(45) Date of Patent: Oct. 29, 2013

(54) THREE-DIMENSIONAL SEMICONDUCTOR MEMORY DEVICES

(75) Inventors: Changhyun Lee, Suwon-si (KR);
Byoungkeun Son, Suwon-si (KR);
Hyejin Cho, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 155 days.

(21) Appl. No.: 13/220,376

(22) Filed: Aug. 29, 2011

(65) Prior Publication Data

US 2012/0068255 A1 Mar. 22, 2012

(30) Foreign Application Priority Data

Sep. 16, 2010 (KR) .................. 10-2010-0091140

(51) Int. Cl.
*H01L 29/792* (2006.01)
(52) U.S. Cl.
USPC .......... 257/324; 257/4; 257/5; 257/315; 257/326; 257/E29.309; 365/185.06; 365/185.18; 365/185.26; 438/261; 438/279; 438/581; 438/591

(58) Field of Classification Search
None
See application file for complete search history.

(56) References Cited

U.S. PATENT DOCUMENTS

| | | | |
|---|---|---|---|
| 3,724,065 | A | 4/1973 | Carbajal et al. |
| 5,403,435 | A | 4/1995 | Cathey et al. |
| 5,946,230 | A | 8/1999 | Shimizu et al. |
| 6,274,413 | B1 | 8/2001 | Fang et al. |
| 6,380,032 | B1 | 4/2002 | Lee et al. |
| 6,483,749 | B1 | 11/2002 | Choi et al. |
| 8,008,722 | B2 | 8/2011 | Kim et al. |
| 8,102,711 | B2 | 1/2012 | Maejima |
| 8,193,054 | B2 | 6/2012 | Alsmeier |
| 8,247,857 | B2 | 8/2012 | Ozawa et al. |
| 8,278,170 | B2 | 10/2012 | Lee et al. |
| 2006/0125029 | A1 | 6/2006 | Kanda |
| 2007/0158736 | A1 | 7/2007 | Arai et al. |
| 2007/0173000 | A1 | 7/2007 | Yamazaki |
| 2008/0179659 | A1 | 7/2008 | Enda et al. |
| 2009/0212351 | A1 | 8/2009 | Chen |
| 2009/0242968 | A1 | 10/2009 | Maeda et al. |
| 2009/0267135 | A1 | 10/2009 | Tanaka et al. |

(Continued)

FOREIGN PATENT DOCUMENTS

| | | |
|---|---|---|
| JP | 10-093083 | 4/1998 |
| JP | 2008-186868 | 8/2008 |

(Continued)

*Primary Examiner* — Yasser Abdelaziez
(74) *Attorney, Agent, or Firm* — Myers Bigel Sibley & Sajovec, P.A.

(57) ABSTRACT

Three-dimensional (3D) nonvolatile memory devices include a substrate having a well region of second conductivity type (e.g., P-type) therein and a common source region of first conductivity type (e.g., N-type) on the well region. A recess is provided, which extends partially (or completely) through the common source region. A vertical stack of nonvolatile memory cells are provided on the substrate. This vertical stack of nonvolatile memory cells includes a vertical stack of spaced-apart gate electrodes and a vertical active region, which extends on sidewalls of the vertical stack of spaced-apart gate electrodes and on a sidewall of the recess. Gate dielectric layers are provided, which extend between respective ones of the vertical stack of spaced-apart gate electrodes and the vertical active region. The gate dielectric layers may include a composite of a tunnel insulating layer, a charge storage layer, a relatively high bandgap barrier dielectric layer and a blocking insulating layer having a relatively high dielectric strength.

14 Claims, 60 Drawing Sheets

(56) References Cited

U.S. PATENT DOCUMENTS

| | | |
|---|---|---|
| 2009/0268524 A1 | 10/2009 | Maejima |
| 2009/0278193 A1 | 11/2009 | Murata et al. |
| 2010/0120214 A1 | 5/2010 | Park et al. |
| 2010/0133599 A1 | 6/2010 | Chae et al. |
| 2010/0155810 A1 | 6/2010 | Kim et al. |
| 2010/0155818 A1 | 6/2010 | Cho et al. |
| 2010/0163968 A1* | 7/2010 | Kim et al. ............... 257/324 |
| 2010/0178755 A1 | 7/2010 | Lee et al. |
| 2010/0181610 A1 | 7/2010 | Kim et al. |
| 2010/0213527 A1 | 8/2010 | Shim et al. |
| 2010/0213537 A1 | 8/2010 | Fukuzumi et al. |
| 2010/0240205 A1 | 9/2010 | Son et al. |
| 2010/0246257 A1 | 9/2010 | Ito et al. |
| 2011/0065270 A1 | 3/2011 | Shim et al. |
| 2011/0076819 A1 | 3/2011 | Kim et al. |
| 2011/0147824 A1 | 6/2011 | Son et al. |
| 2011/0156132 A1 | 6/2011 | Kiyotoshi |
| 2011/0291178 A1 | 12/2011 | Sasaki et al. |
| 2011/0316069 A1 | 12/2011 | Tanaka et al. |
| 2012/0001250 A1 | 1/2012 | Alsmeier |
| 2012/0039130 A1 | 2/2012 | Yoon et al. |
| 2012/0049148 A1 | 3/2012 | Fukano |
| 2012/0068255 A1 | 3/2012 | Lee et al. |
| 2012/0267699 A1 | 10/2012 | Kiyotoshi |
| 2012/0327715 A1 | 12/2012 | Lee et al. |

FOREIGN PATENT DOCUMENTS

| | | |
|---|---|---|
| JP | 2009-272513 | 11/2009 |
| KR | 1020080070583 A | 7/2008 |
| KR | 1020100024096 A | 3/2010 |
| KR | 1020100028827 A | 3/2010 |
| KR | 1020100034612 A | 4/2010 |

* cited by examiner

THREE-DIMENSIONAL SEMICONDUCTOR MEMORY DEVICES

REFERENCE TO PRIORITY APPLICATION

This U.S. non-provisional patent application claims priority under 35 U.S.C. §119 to Korean Patent Application 10-2010-0091140, filed Sep. 16, 2010, the entire contents of which are hereby incorporated herein by reference.

BACKGROUND

The present disclosure herein relates to a semiconductor device and a method of fabricating the same and, more particularly, to a three-dimensional (3D) semiconductor memory device and a method of fabricating the same.

Due to characteristics such as miniaturization, multifunction and/or low-fabricating cost, semiconductor devices are getting the spotlight as an important factor in electronic industries. With the advance of electronic industries, requirements for the superior performances and/or low costs of semiconductor devices are increasing. For satisfying such requirements, high-integrating of semiconductor devices is growing. Particularly, high-integrating of semiconductor memory devices storing logical data is growing more.

In a degree of integration of typical Two-Dimensional (2D) semiconductor memory devices, planar areas that unit memory cells occupy may be main factors for deciding the degree of integration. Therefore, a degree of integration of the typical 2D semiconductor memory devices may be largely affected by the level of a technology for forming fine patterns. However, the technology for forming the fine patterns may be gradually reaching limitations, and also, the fabricating costs of semiconductor memory devices may increase because high-cost equipment is required. For solving such limitations, 3D semiconductor memory devices including three dimensionally-arranged memory cells have been proposed.

SUMMARY

Three-dimensional (3D) nonvolatile memory devices according to embodiments of the invention include a substrate having a well region of second conductivity type (e.g., P-type) therein and a common source region of first conductivity type (e.g., N-type) on the well region. A recess is provided in the substrate. In some embodiments of the invention, the recess extends partially through the common source region. A vertical stack of nonvolatile memory cells are provided on the substrate. This vertical stack of nonvolatile memory cells includes a vertical stack of spaced-apart gate electrodes and a vertical active region, which extends on sidewalls of the vertical stack of spaced-apart gate electrodes and on a sidewall of the recess. Gate dielectric layers are provided, which extend between respective ones of the vertical stack of spaced-apart gate electrodes and the vertical active region.

In other embodiments of the invention, the recess extends entirely through the common source region, which forms a P-N rectifying junction with the well region, and a sidewall of the recess defines an interface between the vertical active region and the well region. In addition, each of the gate dielectric layers may include a composite of: (i) a tunnel insulating layer in contact with the vertical active region, (ii) a charge storage layer on the tunnel insulating layer, (iii) a barrier dielectric layer on the charge storage layer; and (iv) a blocking insulating layer extending between the barrier dielectric layer and a respective gate electrode. In some of these embodiments of the invention, the barrier dielectric layer may be formed of a material having a greater bandgap relative to the blocking insulating layer. According to still further embodiments of the invention, a protective dielectric layer is provided on a sidewall of the recess. This protective dielectric layer extends between the vertical active region and the common source region. A bottom of the recess may also define an interface between the vertical active region and the well region. This vertical active region, which may have a cylindrical shape, may include a plurality of concentrically-arranged semiconductor layers of first conductivity type having equivalent or different dopant concentrations therein.

According to additional embodiments of the invention, the vertical stack of spaced-apart gate electrodes has an opening extending therethrough that is aligned to the recess. In addition, the gate dielectric layers may have a cylindrical shape, and may be concentrically-arranged relative to the plurality of concentrically-arranged semiconductor layers.

According to still further embodiments of the invention, the vertical active region includes an active region plug filling the recess and a cylindrically-shaped active layer on the active region plug. The cylindrically-shaped active layer includes a plurality of concentrically-arranged semiconductor layers of first conductivity type having equivalent or different doping concentrations therein. A vertical stack of at least two spaced-apart gate electrodes of respective ground selection transistors may also be provided, which extend opposite the active region plug. These ground selection transistors include respective gate dielectric layers that extend on sidewalls of the active region plug. The gate dielectric layers of the vertical stack of nonvolatile memory cells may be formed of different materials relative to the gate dielectric layers of the stacked ground selection transistors.

Methods of forming three-dimensional (3D) nonvolatile memory devices according to embodiments of the invention may include forming a vertical stack of a plurality of sacrificial layers and a plurality of insulating layers arranged in an alternating sequence, on a substrate. A selective etching step is then performed to etch through the vertical stack to define a first opening therein and a recess in the substrate. The recess is filled with an electrically conductive active region plug, which is electrically connected to a well region in the substrate. A sidewall of the first opening is then lined with a first vertical active layer before the first opening is filled with a dielectric pattern that extends on the first vertical active layer. Another selective etching step is performed to selectively etch through the vertical stack to define a second opening therein that exposes the substrate. Portions of the sacrificial layers extending between each of the plurality of insulating layers in the vertical stack are then replaced with gate dielectric layers and gate electrodes of respective memory cells. The step of lining a sidewall of the first opening may include lining a sidewall of the first opening with a first vertical active layer that contacts an upper surface of the active region plug. The step of filling the recess with an active region plug may also include filling the recess with an active region plug having an upper surface that is elevated relative to surface of the substrate. In particular, the substrate may include a well region of second conductivity type and a common source region of first conductivity type extending between the well region and a surface of the substrate, and the recess containing the active region plug may extend entirely through the common source region.

According to still further embodiments of the invention, the step of lining a sidewall of the first opening with a first vertical active layer may be preceded by a step of lining the sidewall of the first opening with a first electrically insulating sub-layer that contacts an upper surface of the active region plug. A step may also be performed to selectively etching through the first vertical active layer and the first electrically insulating sub-layer in sequence to expose the upper surface of the active region plug. In addition, the step of filling the first opening with a dielectric pattern may be preceded by lining an inner sidewall of the first vertical active layer with a second vertical active layer that contacts the upper surface of the active region plug. These first and second vertical active layers may be formed as doped or undoped cylindrically-shaped silicon layers.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1A:
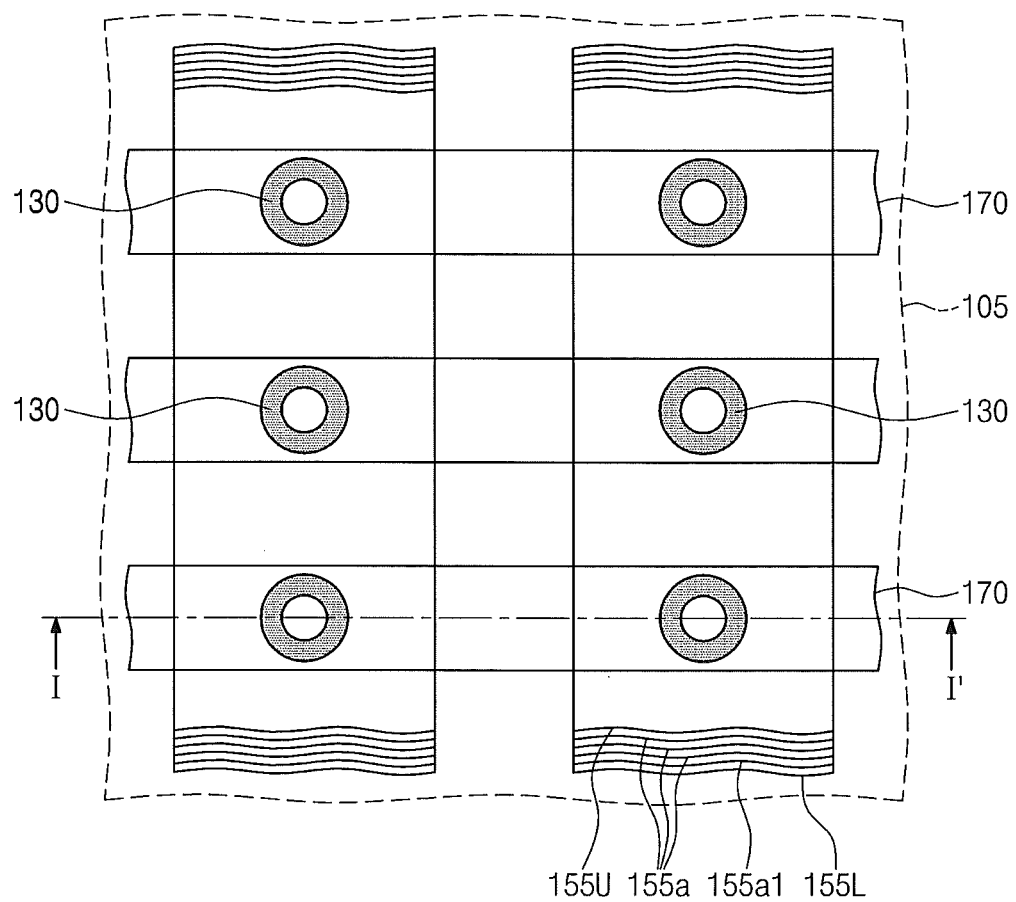
FIG. 1A is a plan view illustrating a three-dimensional (3D) semiconductor memory device according to an embodiment of the inventive concept.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
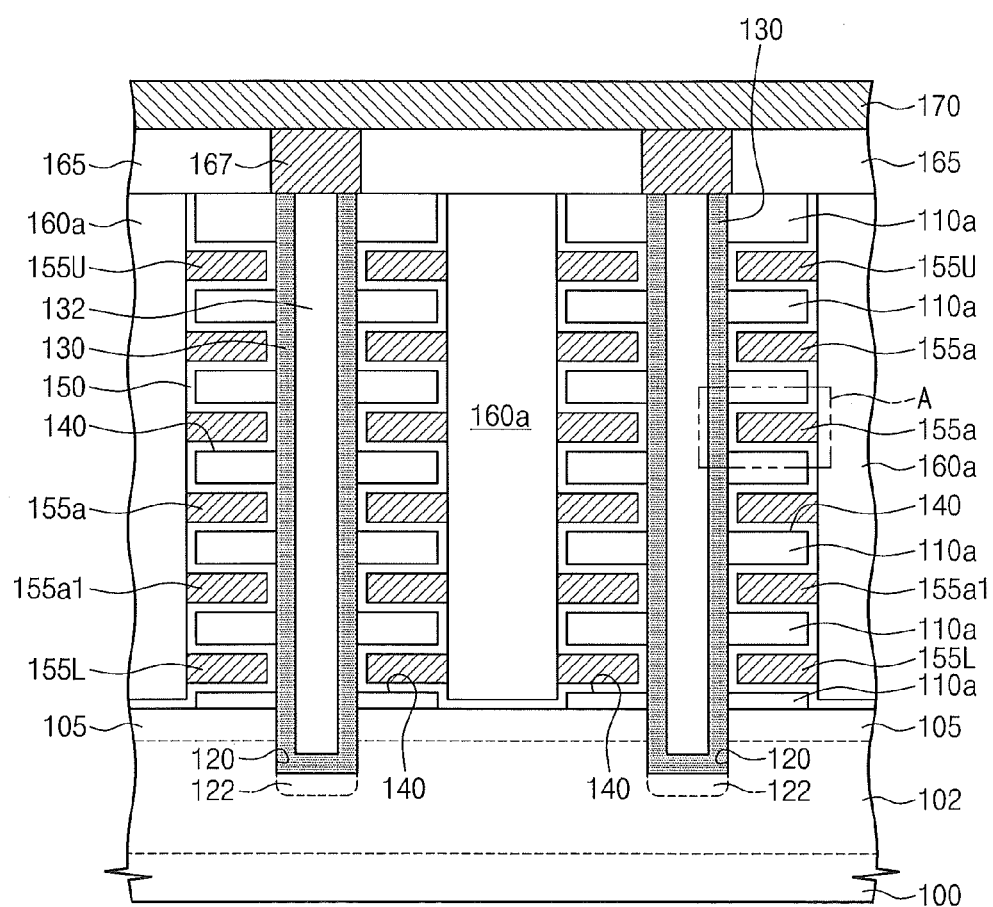
FIG. 1B is a cross-sectional view taken along line I-I' of FIG. 1A.
Figure 1C:
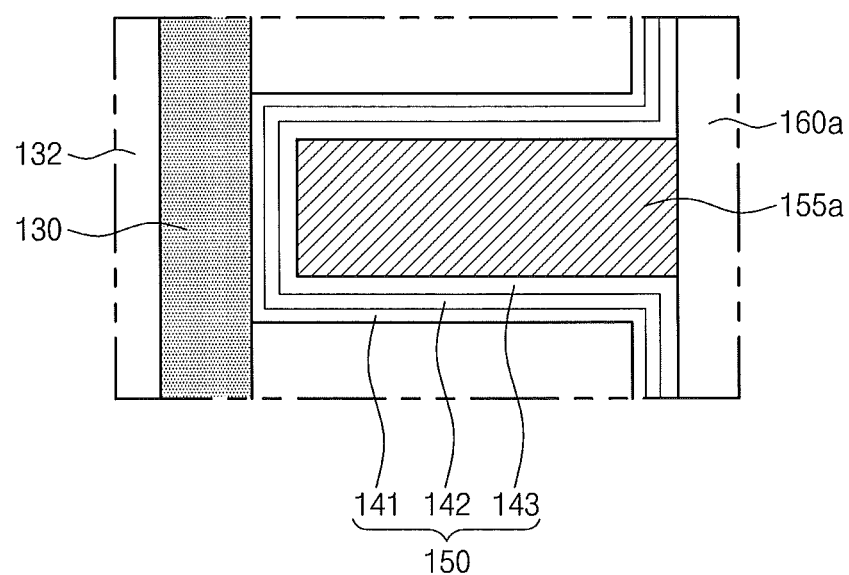
FIG. 1C is a magnified view of a portion A of FIG. 1B.

FIG. 1A is a plan view illustrating a 3D semiconductor memory device according to an embodiment of the inventive concept. FIG. 1B is a cross-sectional view taken along line I-I' of FIG. 1A. FIG. 1C is a magnified view of a portion A of FIG. 1B. Referring to FIGS. 1A and 1B, a well region 102 doped with a first conductive dopant may be disposed in a semiconductor substrate 100 (hereinafter referred to as a substrate). The substrate 100 may be a silicon substrate, a germanium substrate or a silicon-germanium substrate, for example a common source region 105 doped with a second conductive dopant may be formed in the well region 102. An upper surface of the common source region 105 may be disposed on the substantially same level as that of the upper surface of the substrate 100. A lower surface of the common source region 105 may be disposed on a level higher than that of a lower surface of the well region 102. One of the first and second conductive dopants may be an n-type dopant, and the other may be a p-type dopant. For example, the well region 102 may be doped with a p-type dopant, and the common source region 105 may be doped with an n-type dopant.

A stack-structure, including insulation patterns 110a and gate patterns 155L, 155a1, 155a and 155U that are stacked alternately and repeatedly, may be disposed on the common source region 105. A plurality of the stack-structures may be disposed on the common source region 105. As illustrated in FIG. 1A, the stack-structures may be extended side by side in a first direction. The stack-structures may be spaced apart in a second direction perpendicular to the first direction. The first and second directions may be parallel with the upper surface of the substrate 100.

A vertical active pattern 130 may pass through the stack-structure. The vertical active pattern 130 may be extended into a recess region 120 that is formed in the common source region 105 under the vertical active pattern 130. Therefore, the vertical active pattern 130 may be connected to the well region 102 under the vertical active pattern 130. As illustrated in FIG. 1B, the recess region 120 may vertically pass through the common source region 105. A bottom surface of the recess region 120 may be disposed on a level lower than that of the lower surface of the common source region 105. The vertical active pattern 130 may contact the bottom surface of the recess region 120. Accordingly, the vertical active pattern 130 may contact the well region 102. Also, the vertical active pattern 130 may contact a sidewall of the recess region 120. As a result, the vertical active pattern 130 may directly contact the common source region 105.

According to an embodiment of the inventive concept, a portion 122 of the well region 102 just under the bottom surface of the recess region 120 may have a high dopant concentration. In other words, the first conductive dopant concentration of the portion 122 of the well region 102 may be higher than the first conductive dopant concentration of another portion of the well region 102.

According to an embodiment of the inventive concept, the vertical active pattern 130 may have a hollow pipe shape or a macaroni shape. Herein, the lower end of the vertical active pattern 130 may be in a closed state. The inside of the vertical active pattern 130 may be filled with a filling dielectric pattern 132.

A gate dielectric layer 150 may be disposed between a sidewall of the vertical active pattern 130 and each of the gate patterns 155L, 155a1, 155a and 155U. According to an embodiment of the inventive concept, as illustrated in FIG. 1B, the gate dielectric layer 150 may be extended to cover an upper surface and a lower surface of each of the gate patterns 155L, 155a1, 155a and 155U. That is, the extended portion of the gate dielectric layer 150 may be disposed between each of the gate patterns 155L, 155a1, 155a and 155U and the insulation pattern 110a adjacent to each of the gate patterns 155L, 155a1, 155a and 155U.

The gate dielectric layer 150 will be described below in more detail with reference to FIG. 1C. Referring to FIG. 1C, according to an embodiment of the inventive concept, the gate dielectric layer 150 may include a tunnel dielectric layer 141, a charge storage layer 142 and a blocking dielectric layer 143. The tunnel dielectric layer 141 may be adjacent to the sidewall of the vertical active pattern 130, and the blocking dielectric layer 143 may be adjacent to each of the gate patterns 155L, 155a1, 155a and 155U. The charge storage layer 142 may be disposed between the tunnel dielectric layer 141 and the blocking dielectric layer 143. According to an embodiment of the inventive concept, as illustrated in FIG. 1C, the entirety of the gate dielectric layer 150 (i.e., the tunnel dielectric layer 141, the charge storage layer 142 and the blocking dielectric layer 143) may be extended to cover the upper and lower surfaces of each of the gate patterns 155L, 155a1, 155a and 155U.

The tunnel dielectric layer 141 may include oxide and/or oxynitride. The tunnel dielectric layer 141 may be single-layered or multi-layered. The charge storage layer 142 may include a dielectric material having traps for storing electric charges, for example, the charge storage layer 142 may include nitride and/or metal-oxide. The blocking dielectric layer 143 may include a high-k dielectric layer having a dielectric constant higher than that of the tunnel dielectric layer 141. For example, the high-k dielectric layer in the blocking dielectric layer 143 may include metal-oxide such as aluminum-oxide or hafnium-oxide. Furthermore, the blocking dielectric layer 143 may further include a barrier dielectric layer. The barrier dielectric layer in the blocking dielectric layer 143 may include a dielectric material having a greater band gap than the high-k dielectric layer in the blocking dielectric layer 143. For example, the barrier dielectric layer may include oxide. The barrier dielectric layer may be disposed between the high-k dielectric layer and the charge storage layer 142.

A lowermost gate pattern 155L in the stack-structure may correspond to a ground selection gate. A ground selection transistor including the lowermost gate pattern 155L may include a vertical channel region that is defined in the sidewall of the vertical active pattern 130. As illustrated in FIGS. 1A and 1B, the entire lower surface of the lowermost gate pattern 155L may substantially overlap with the common source region 105.

An uppermost gate pattern 155U in the stack-structure may correspond to a string selection gate. Gate patterns 155a1 and 155a between the uppermost gate pattern 155U and the lowermost gate pattern 155L may correspond to cell gates. A string selection transistor including the uppermost gate pattern 155U and cell transistors including the cell gates may also include vertical channel regions that are defined in the sidewall of the vertical active pattern 130a. The vertical channel regions of the ground selection transistor, the cell transistor and the string selection transistor configuring one cell string may be defined in the vertical active pattern 130.

According to an embodiment of the inventive concept, among gate patterns used as the cell gates in the stack-structure, a gate pattern most adjacent to the lowermost gate pattern 155L may correspond to a dummy cell gate. For example, the gate pattern 155a1 disposed just on the lowermost gate pattern 155L may be a dummy gate pattern. For example, the gate pattern 155a1 that is stacked secondly from the substrate 100 may be a dummy cell gate. Naturally, one of the insulation pattern 110a is disposed between the lowermost gate pattern 155L and the secondly-stacked gate pattern 155a1. For example, a dummy cell transistor including the secondly-stacked gate pattern 155a1 may have the same shape as that of a cell transistor storing data, but may not serve as the cell transistor. For example, the dummy cell transistor may perform only a turn-on/off function. Thus, the secondly-stacked gate pattern 155a1 may be a second ground selection gate. In this case, the cell string may include a plurality of stacked ground selection transistors.

A plurality of the vertical active patterns 130 may pass through each of the stack-structures. As illustrated in FIG. 1A, the vertical active patterns 130 passing though each of the stack-structures may be arranged in the first direction to form one column. Alternatively, the vertical active patterns 130 passing though each of the stack-structures may be arranged in a zigzag shape in the first direction.

The vertical active pattern 130 may include a semiconductor material. For example, the vertical active pattern 130 may include the same semiconductor material as that of the substrate 100. The vertical active pattern 130 may have an undoped state, or may be doped with the first conductive dopant. The vertical active pattern 130 may have a polycrystalline state or a single crystalline state. The gate patterns 155L, 155a1, 155a and 155U include a conductive material. For example, the gate patterns 155L, 155a1, 155a and 155U may include at least one of a doped semiconductor (for example, doped silicon and others), a metal (for example, tungsten, aluminum, copper and others), a transition metal (for example, titanium, tantalum and others) or a conductive metal nitride (for example, a titanium nitride, a tantalum nitride and others). The insulation patterns 110a may include oxide.

A device isolation pattern 160a may be disposed between the stack-structures. An upper surface of the device isolation pattern 160a and an upper surface of the stack-structure may substantially be coplanar. An interlayer dielectric 165 may be disposed on the substrate 100. A contact plug 167 may be connected to an upper end of the vertical active pattern 130 through the interlayer dielectric 165. A drain being doped with the second conductive dopant may be formed in the upper portion of the vertical active pattern 130. A lower surface of the drain may be disposed on a level adjacent to an upper surface of the uppermost gate pattern 155U. A bit line 170 may be disposed on the interlayer dielectric 165, and may be connected to the contact plug 167. The bit line 170 may be extended in the second direction and cross over the stack-structure. The interlayer dielectric 165 may include oxide. The contact plug 167 includes a conductive material. For example, the contact plug 167 may include tungsten. The bit line 170 also includes a conductive material. As an example, the bit line 170 may include tungsten, copper, aluminum or the like.

According to the above-described 3D semiconductor memory device, the vertical active pattern 130 may be disposed in the recess region 120 passing though the common source region 105 and be connected to the well region 102. Moreover, the common source region 105 may be disposed under the lowermost gate pattern 155L. Therefore, a distance between the vertical active pattern 130 and the common source region can be minimized, and also the vertical active pattern 130 can be connected to the well region 102. Consequently, a current flowing through the vertical active pattern 130 can quickly flow to the common source region 105. Accordingly, the reduction of an amount of current in a cell transistor can be minimized. Also, the vertical active pattern 130 is connected to the well region 102, such that the erasing operation of cell transistors is very easy. As a result, the 3D semiconductor memory device can be implemented which has excellent reliability and is optimized for high integration.

Next, the modification examples of the 3D semiconductor memory device according to an embodiment of the inventive concept will be described below with reference to the accompanying drawings. In the modification examples, a description on the same elements as the above-described elements will be omitted for avoiding a repetitive description.

Figure 2A:
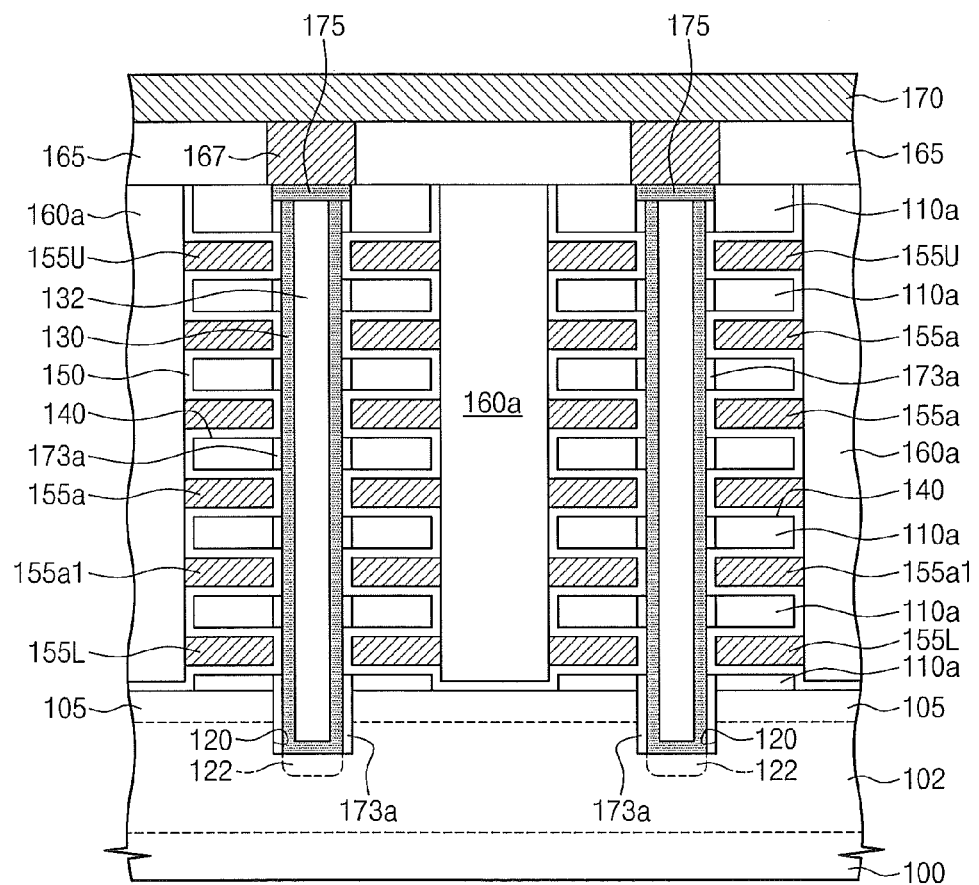
FIG. 2A is a cross-sectional view taken along line I-I' of FIG. 1A for describing a modification example of a 3D semiconductor memory device according to an embodiment of the inventive concept.

FIG. 2A is a cross-sectional view taken along line I-I' of FIG. 1A for describing a modification example of a 3D semiconductor memory device according to an embodiment of the inventive concept. Referring to FIG. 2A and according to the modification example, protection dielectric patterns 173a may be disposed between the insulation patterns 110a and the vertical active pattern 130 and between the inner sidewall of the recess region 120 and the vertical active pattern 130. The protection dielectric pattern 173a may include a dielectric material for protecting the vertical active pattern 130 in a fabricating process. For example, the protection dielectric pattern 173a may include oxide. According to the modification example, a capping semiconductor pattern 175 may be disposed on the vertical active pattern 130. The capping semiconductor pattern 175 may also be disposed on the protection dielectric pattern 173a that is disposed between an uppermost insulation pattern 110a and the vertical active pattern 130. The upper end of the vertical active pattern 130 may be disposed on a level lower than an upper surface of the uppermost insulation pattern 110a. The upper surface of the capping semiconductor pattern 175 and the upper surface of the uppermost insulation pattern 110a may be substantially coplanar. The capping semiconductor pattern 175 may include the same semiconductor material as that of the vertical active pattern 130. The capping semiconductor pattern 175 may be doped with the second conductive dopant. The contact plug 167 may be connected to the capping semiconductor pattern 175.

Figure 2B:
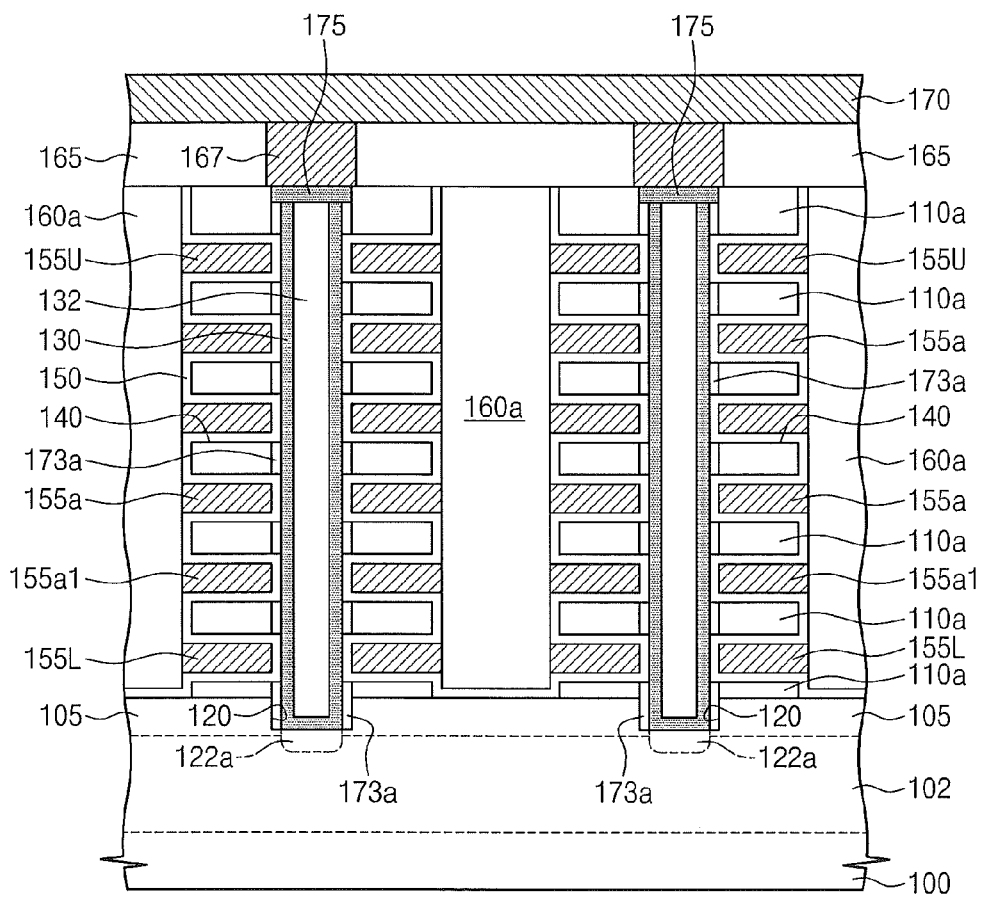
FIG. 2B is a cross-sectional view taken along line I-I' of FIG. 1A for describing other modification example of a 3D semiconductor memory device according to an embodiment of the inventive concept.

FIG. 2B is a cross-sectional view taken along line I-I' of FIG. 1A for describing other modification example of a 3D semiconductor memory device according to an embodiment of the inventive concept. Referring to FIG. 2B and according to the modification example, a bottom surface of the recess region 120 may be disposed on a level higher than the lower surface of the common source region 105. In this case, a region 122a being counter-doped with the first conductive dopant may be disposed under the bottom surface of the recess region 120a. The counter-doped region 122a may contact the vertical active pattern 130 and the well region 102. Therefore, the vertical active pattern 130 may be connected to the well region 102 through the counter-doped region 122a.

Figure 3A:
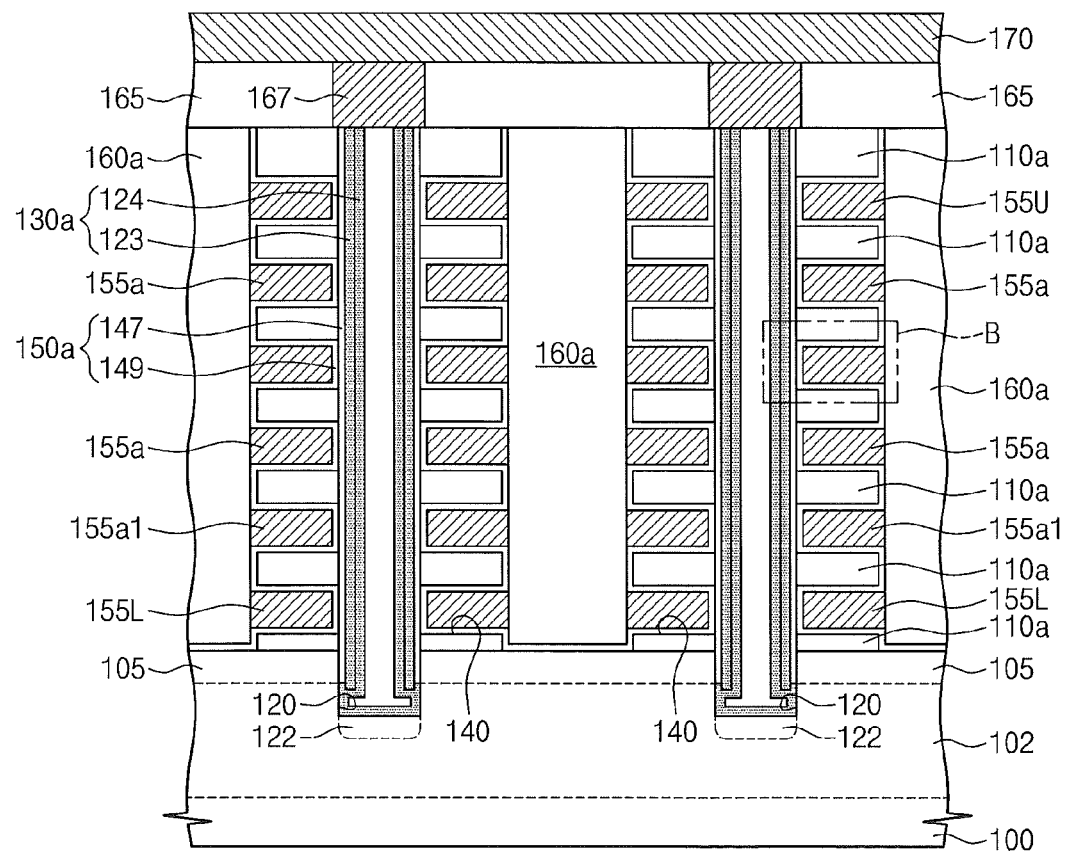
FIG. 3A is a cross-sectional view taken along line I-I' of FIG. 1A for describing still other modification example of a 3D semiconductor memory device according to an embodiment of the inventive concept.
Figure 3B:
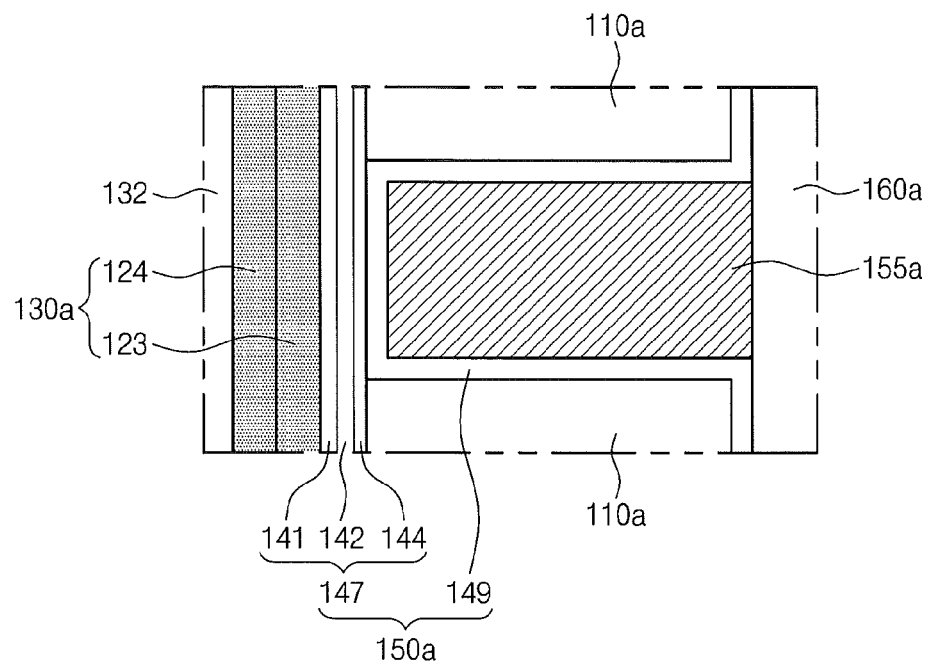
FIG. 3B is a magnified view of a portion B of FIG. 3A.

FIG. 3A is a cross-sectional view taken along line I-I' of FIG. 1A for describing still other modification example of a 3D semiconductor memory device according to an embodiment of the inventive concept. FIG. 3B is a magnified view of a portion B of FIG. 3A. Referring to FIG. 3A, a gate dielectric layer 150a according to the modification example may be disposed between a vertical active pattern 130a and each of the gate patterns 155L, 155a1, 155a and 155U. The gate dielectric layer 150a may include a first sub-layer 147 and a second sub-layer 149. The first sub-layer 147 may be substantially extended vertically and be disposed between the vertical active pattern 130a and the insulation pattern 110a. The second sub-layer 149 may be substantially extended horizontally and cover the lower surface and upper surface of each of the gate patterns 155L, 155a1, 155a and 155U. The gate dielectric layer 150a may include the tunnel dielectric layer, the charge storage layer and the blocking dielectric layer. Herein, the first sub-layer 147 may include at least a portion of the tunnel dielectric layer, and the second sub-layer 149 may include at least a portion of the blocking dielectric layer. One of the first and second sub-layers 147 and 149 may include the charge storage layer. In other words, a portion of the gate dielectric layer 150a including the tunnel dielectric layer, the charge storage layer and the blocking dielectric layer may be extended vertically, and another portion of the gate dielectric layer 150a may be extended horizontally.

The vertical active pattern 130a may include first and second semiconductor patterns 123 and 124. The first semiconductor pattern 123 may be disposed between the second semiconductor pattern 124 and the first sub-layer 147. The first semiconductor pattern 123 may contact the first sub-layer 147. According to an embodiment of the inventive concept, the first semiconductor pattern 123 may have a macaroni shape or a pipe shape where an upper end and a lower end are opened. The first semiconductor pattern 123 may not contact the inner surface of the recess region 120 by the first sub-layer 147. The second semiconductor pattern 124 may contact the first semiconductor pattern 123 and the inner surface of the recess region 120. The second semiconductor pattern 124 may have a macaroni shape or a pipe shape where a lower end is closed. A filling dielectric pattern 132 may fill the inside of the second semiconductor pattern 124. The first and second semiconductor patterns 123 and 124 may have an undoped state or be doped with a dopant (i.e., the first conductive dopant) having the same type as that of the well region 102.

According to an embodiment of the inventive concept, as illustrated in FIG. 3B, the first sub-layer 147 of the gate dielectric layer 150a may include a tunnel dielectric layer 141, a charge storage layer 142 and a barrier dielectric layer 144. In this case, the second sub-layer 149 may include a high-k dielectric material (for example, metal-oxide such as aluminum oxide or hafnium oxide) having a dielectric constant higher than that of the tunnel dielectric layer 141. The barrier dielectric layer 144 may include a dielectric material having a greater band gap than that of the high-k dielectric material. For example, the barrier dielectric layer 144 may include oxide. The second sub-layer 149 and the barrier dielectric layer 144, disposed between the charge storage layer 142 and each of the gate patterns 155L, 155a1, 155a and 155U, may included in the blocking dielectric layer. In other words, the first sub-layer 147 may include the tunnel dielectric layer 141, the charge storage layer 142 and a portion (i.e., the barrier dielectric layer 144) of the blocking dielectric layer, and the second sub-layer 149 may include another portion (i.e., the high-k dielectric layer) of the blocking dielectric layer. However, an embodiment of the inventive concept is not limited thereto. The first and second sub-layers of the gate dielectric layer may be combined differently.

Figure 3C:
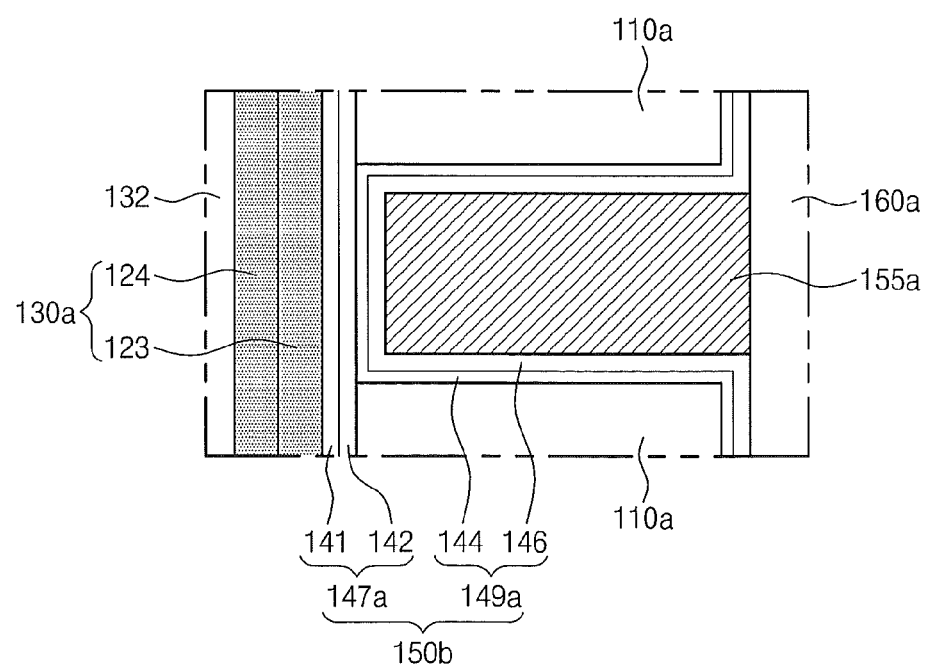
FIG. 3C is a magnified view of a portion B of FIG. 3A for describing even other modification example of a 3D semiconductor memory device according to an embodiment of the inventive concept.

FIG. 3C is a magnified view of a portion B of FIG. 3A for describing even other modification example of a 3D semiconductor memory device according to an embodiment of the inventive concept. Referring to FIG. 3C, a first sub-layer 147a of a gate dielectric layer 150b according to the modification example may include a tunnel dielectric layer 141 and a charge storage layer 142, and a second sub-layer 149a of the gate dielectric layer 150b may include a barrier dielectric layer 144 and a high-k dielectric layer 146. The high-k dielectric layer 146 may be formed of the same material as the high-k dielectric material that has been described above with reference to FIG. 3B. According to the modification example, the second sub-layer 149b may correspond to a blocking dielectric layer. According to the modification example, the first sub-layer 147a may include the tunnel dielectric layer 141 and the charge storage layer 142, and the second sub-layer 149a may include the blocking dielectric layer.

Figure 3D:
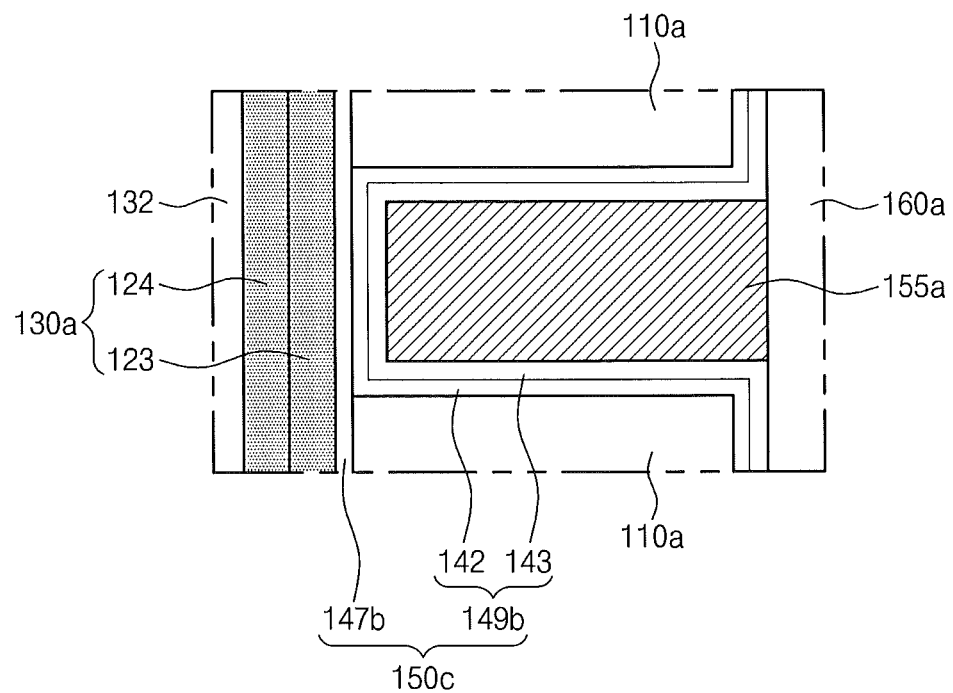
FIG. 3D is a magnified view of a portion B of FIG. 3A for describing yet other modification example of a 3D semiconductor memory device according to an embodiment of the inventive concept.

FIG. 3D is a magnified view of a portion B of FIG. 3A for describing yet other modification example of a 3D semiconductor memory device according to an embodiment of the inventive concept. Referring to FIG. 3D, a first sub-layer 147b of a gate dielectric layer 150c according to the modification example may include the tunnel dielectric layer, and a second sub-layer 149b of the gate dielectric layer 150c may include the charge storage layer 142 and the blocking dielectric layer 143. According to the modification example, the tunnel dielectric layer in the gate dielectric layer 150c may be extended vertically and be disposed between the vertical active pattern 130a and the insulation pattern 110a, and the charge storage layer 142 and the blocking dielectric layer 143 in the gate dielectric layer 150c may be extended horizontally and cover the upper surface and lower surface of each of the gate patterns 155L, 155a1, 155a and 155U.

The first and second sub-layers according to an embodiment of the inventive concept are not limited to the modification examples that have been described above with reference to FIGS. 3B, 3C and 3D. The first and second sub-layers may be combined differently.

Figure 4A:
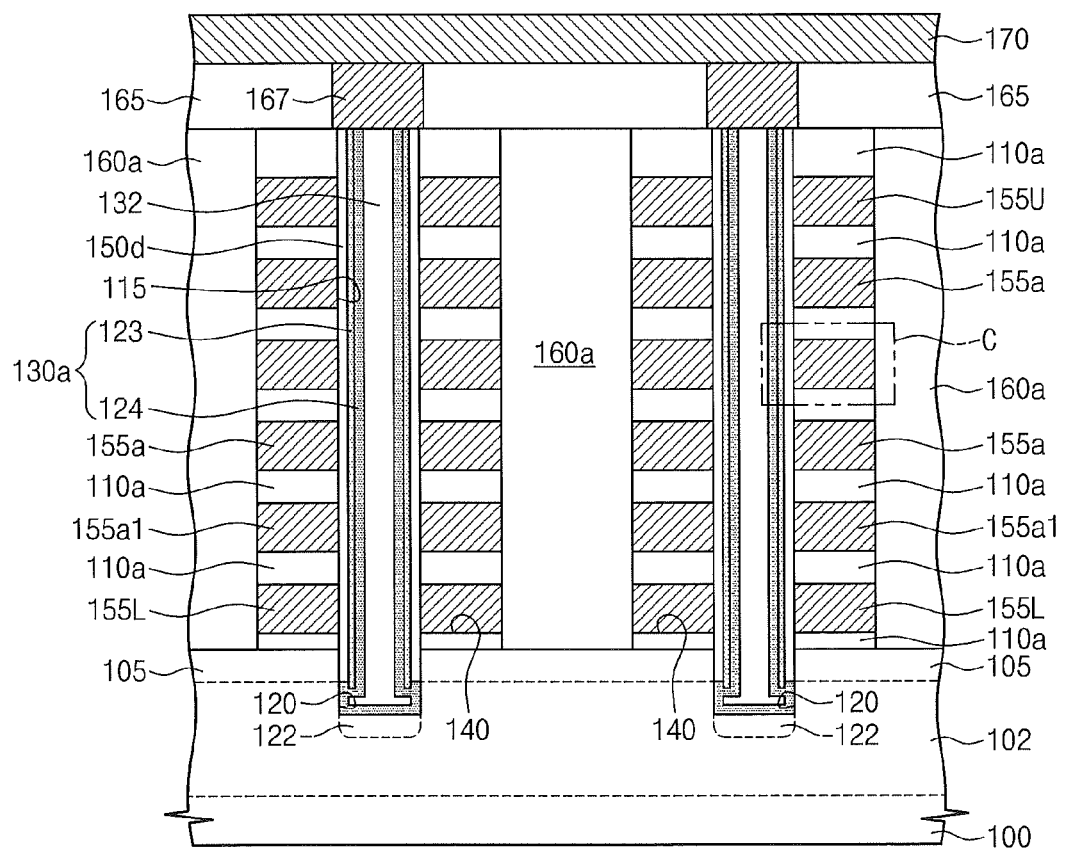
FIG. 4A is a cross-sectional view taken along line I-I' of FIG. 1A for describing further modification example of a 3D semiconductor memory device according to an embodiment of the inventive concept.
Figure 4B:
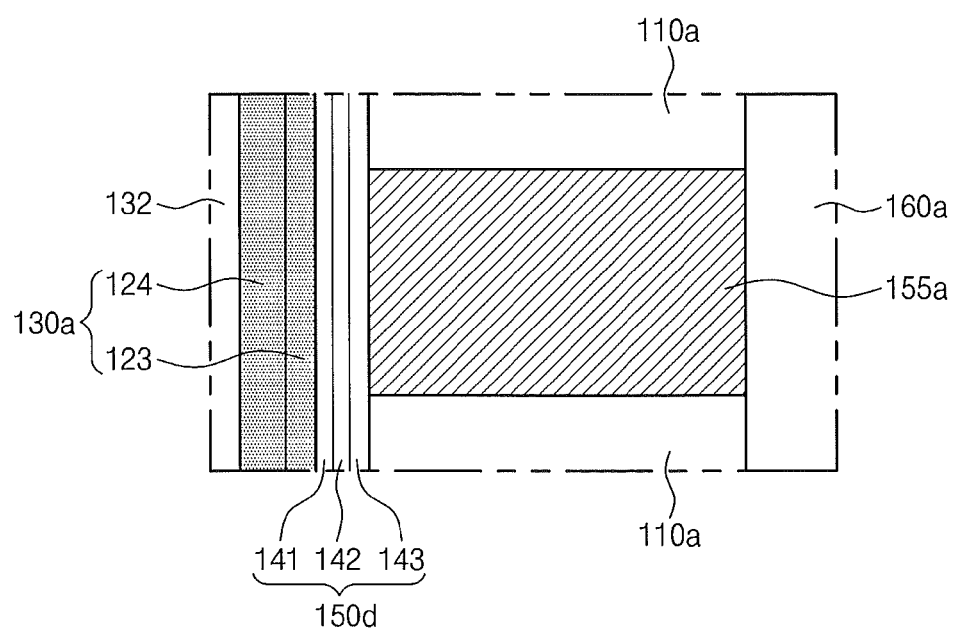
FIG. 4B is a magnified view of a portion C of FIG. 4A.

FIG. 4A is a cross-sectional view taken along line I-I' of FIG. 1A for describing further modification example of a 3D semiconductor memory device according to an embodiment of the inventive concept. FIG. 4B is a magnified view of a portion C of FIG. 4A. Referring to FIGS. 4A and 4B, the entirety of a gate dielectric layer 150d between the vertical active pattern 130a and each of the gate patterns 155L, 155a1, 155a and 155U may be substantially extended vertically. That is, the tunnel dielectric layer 141, charge storage layer 142 and blocking dielectric layer 143 of the gate dielectric layer 150d may be substantially extended vertically. An extended portion of the gate dielectric layer 150d may be disposed between the vertical active pattern 130a and the insulation pattern 110a. The stack-structure of FIGS. 1A and 1B may have a line shape that is extended in the first direction. Unlike this, the stack-structure may include gate patterns having a flat plate shape. This will be described below with reference to the accompanying drawings.

Figure 5A:
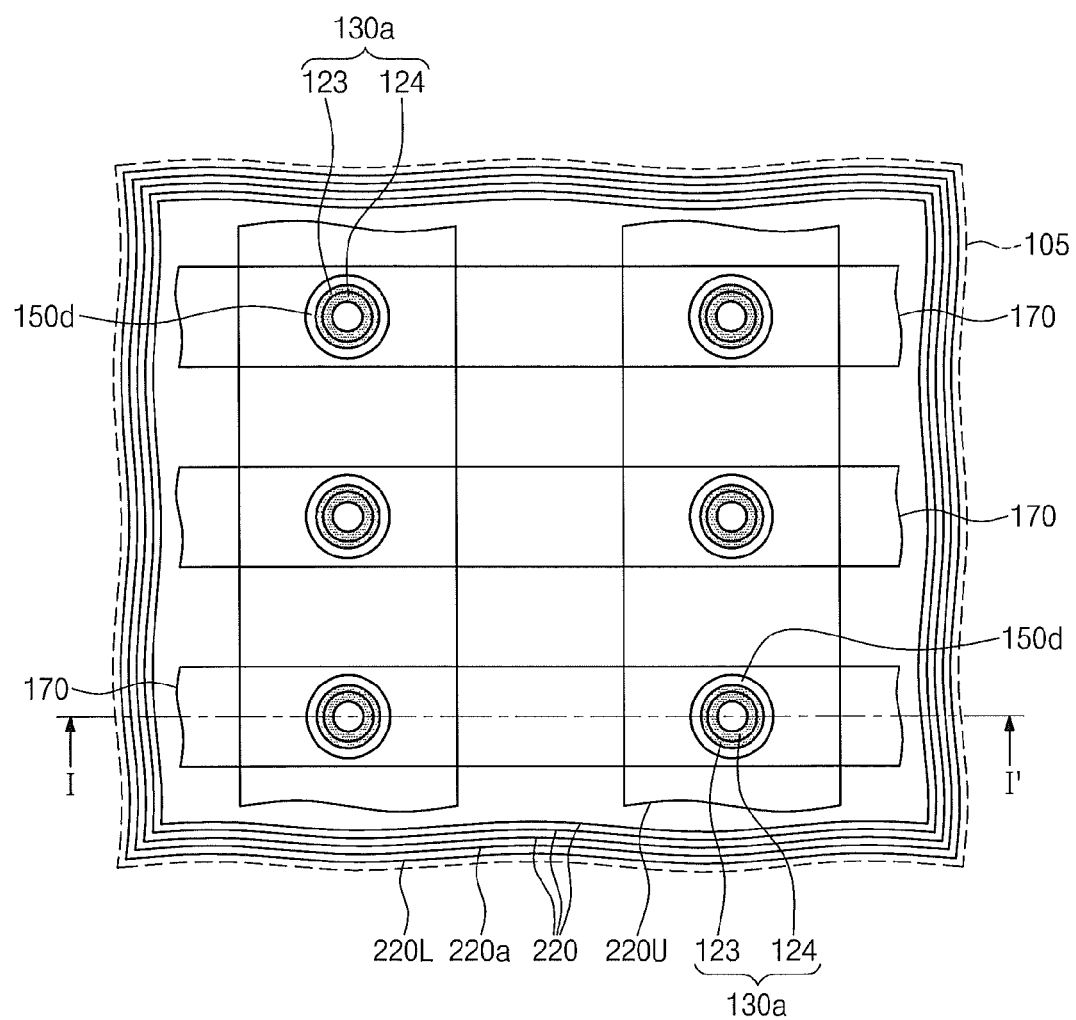
FIG. 5A is a plan view illustrating still further modification example of a 3D semiconductor memory device according to an embodiment of the inventive concept.
Figure 5B:
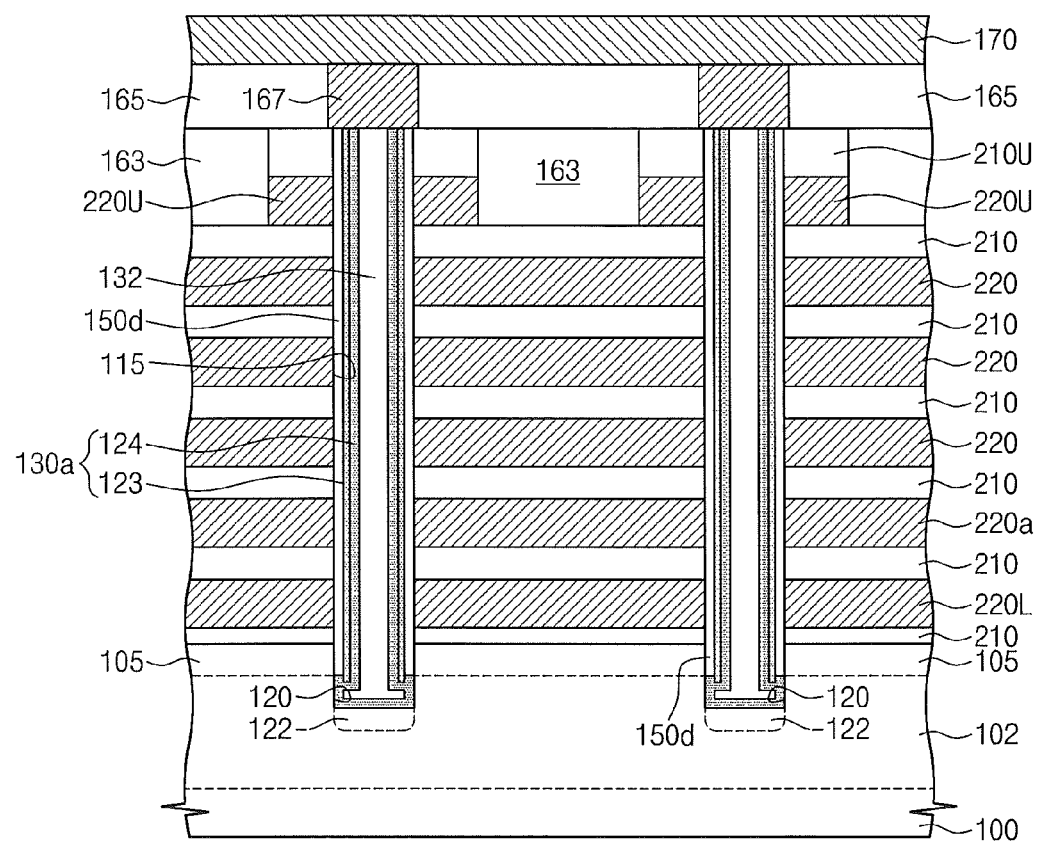
FIG. 5B is a cross-sectional view taken along line II-II' of FIG. 5A.

FIG. 5A is a plan view illustrating still further modification example of a 3D semiconductor memory device according to an embodiment of the inventive concept. FIG. 5B is a cross-sectional view taken along line II-II' of FIG. 5A. Referring to FIGS. 5A and 5B, a stack-structure according to the modification example may include gate patterns 220L, 220a, 220 and 220U and insulation patterns 210 and 210U that are stacked alternately and repeatedly. A lowermost gate pattern 220L in the stack-structure may be a ground selection gate, and an uppermost gate pattern 220U in the stack-structure may be a string selection gate. The gate pattern 220a just on the lowermost gate pattern 220L may be used as a cell gate, a dummy cell gate or a second ground selection gate. The gate patterns 220 between the gate pattern 220a just on the lowermost gate pattern 220L and the upper gate pattern 220U may be used as cell gates.

The gate patterns 220L, 220a and 220 under a string selection gate, as illustrated in FIGS. 5A and 5B, may have a flat plate shape. The uppermost gate pattern 220U corresponding to the string selection gate may have a line shape that is extended in the first direction. The uppermost gate pattern 220U may be provided in plurality, and the uppermost gate patterns 220U may be extended side by side in the first direction. The bit line 170 may be extended in the second direction and cross over the uppermost gate pattern 220U. Like the uppermost gate pattern 220U, an uppermost insulation pattern 210U on the uppermost gate pattern 220U may also be extended in the first direction.

The vertical active pattern 130a may pass through the stack-structure and be extended into the recess region 120 under it. The lowermost gate pattern 220L corresponding to the ground selection gate may be disposed on the common source region 105 in the substrate 100. The entire lower surface of the lowermost gate pattern 220L may substantially overlap with the common source region 105. According to the modification example, the gate dielectric layer 150d may be disposed between the vertical active pattern 130a and the inner sidewall of an opening 115 passing through the stack-structure. The gate dielectric layer 150d may be substantially extended vertically. The opening 115 and the recess region 120 may be self-aligned. The gate dielectric layer 150d may be extended into the recess region 120. According to an embodiment of the inventive concept, the lower end of the gate dielectric layer 150d in the recess region 120 may be disposed on a level higher than the lower surface of the recess region 120.

A lower interlayer dielectric 163 may be disposed between the uppermost gate patterns 220U. An upper surface of the lower interlayer dielectric 163 may be coplanar with an upper surface of the uppermost insulation pattern 210U. An upper interlayer dielectric 165 may be disposed on the lower interlayer dielectric 163 and the uppermost gate patterns 220U. The insulation patterns 210 and 210U may include oxide, nitride and/or oxynitride. The gate patterns 220L, 220a, 220 and 220U may include at least one of a doped semiconductor (for example, doped silicon), a metal (for example, tungsten and others) or a conductive metal nitride (for example, a titanium nitride, a tantalum nitride and others).

The elements of the above-described modification examples may be combined or replaced. For example, the capping semiconductor pattern 175 of FIG. 2A may be disposed on the vertical active pattern 130 or 130a that has been disclosed in FIG. 1B, 3A, 4A or 5B.

Figure 6A:
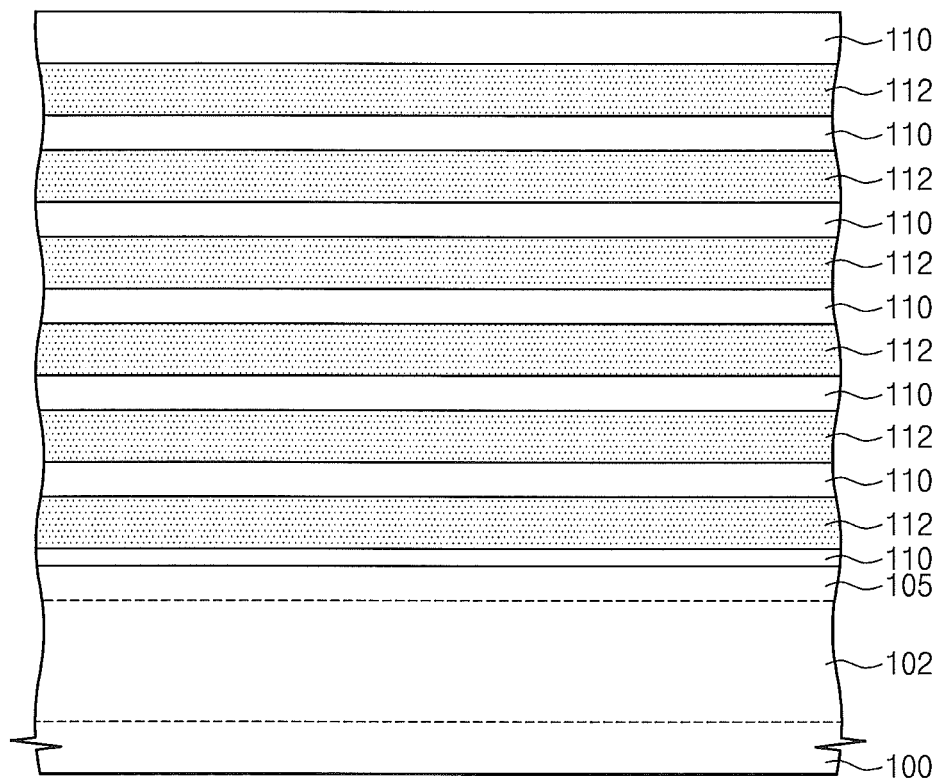
FIGS. 6A to 6H are cross-sectional views taken along line I-I' of FIG. 1A for describing a method of fabricating 3D semiconductor memory device according to an embodiment of the inventive concept.

FIGS. 6A to 6H are cross-sectional views taken along line I-I' of FIG. 1A for describing a method of fabricating 3D semiconductor memory device according to an embodiment of the inventive concept. Referring to FIG. 6A, a well region 102 may be formed by providing a first conductive dopant into the substrate 100. A common source region 105 may be formed by providing a second conductive dopant into the upper portion of the well region 102. Insulation layers 110 and sacrificial layers 112 may be alternately and repeatedly stacked on the common source region 105. For example, the insulation layers 110 may be formed as oxide layers. The sacrificial layers 112 may be formed of materials having an etch selectivity with respect to the insulation layers 112. For example, the sacrificial layers 112 may be formed as nitride layers.

Figure 6B:
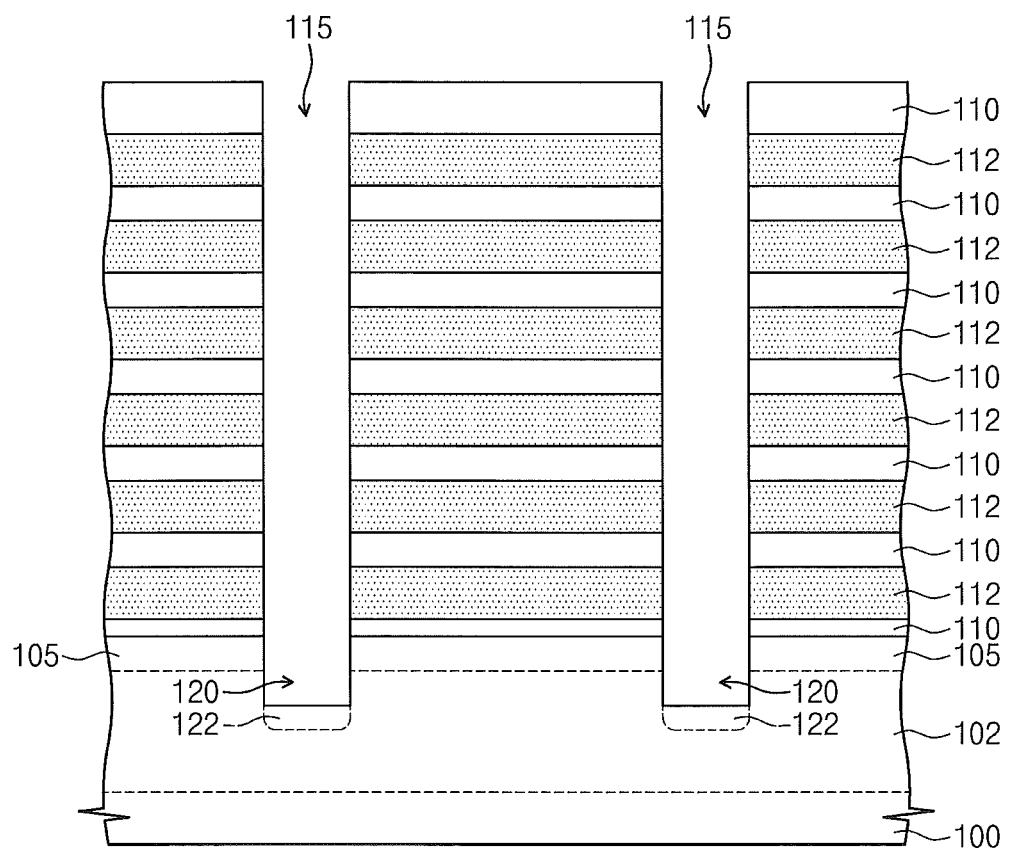

Referring to FIG. 6B, an opening 115 and a recess region 120 may be formed by sequentially patterning the insulation layers 110, sacrificial layers 112 and the substrate 100. The opening 115 may pass through the insulation layers 110 and sacrificial layers 112, and the recess region 120 may be formed in the common source region 102 under the opening 115 (i.e., in a portion of the substrate 100). The recess region 120 is self-aligned in the opening 115 by sequentially patterning the insulation layers 110 and sacrificial layers 112 and the substrate 100. The recess region 120 may pass through the common source region 105, and the bottom surface of the recess region 120 may be disposed on a level lower than the lower surface of the common source region 105. Therefore, the well region 102 may be exposed to the bottom surface of the recess region 120, and the common source region 105 may be exposed to the inner sidewall of the recess region 120. A high concentration region 122 may be formed by providing the first conductive dopant into the well region 102 through the bottom surface of the recess region 120. The high concentration region 122 of the first conductive dopant may be higher than another portion of the well region 102. That is, due to the high concentration region 122, the well region 102 may partially have a high dopant concentration.

Figure 6C:
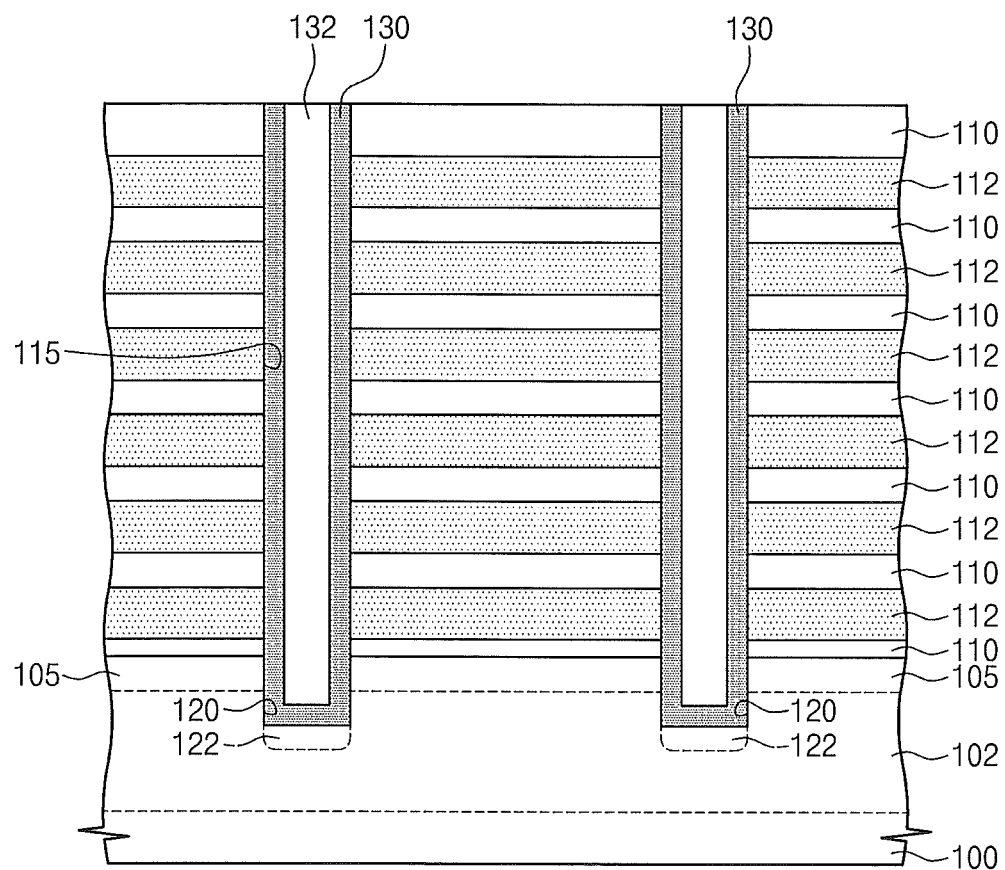

Referring to FIG. 6C, a semiconductor layer may be conformally formed on the substrate 100 having the opening 115 and the recess region 120. Therefore, the semiconductor layer may be formed to have a substantially uniform thickness on the inner surface of the recess region 120 and an inner sidewall of the opening 115. The semiconductor layer may contact the inner surface (i.e., an inner sidewall and a bottom surface) of the recess region 120. The semiconductor layer may be formed in a chemical vapor deposition process and/or an atomic layer deposition process. A filling dielectric layer may be formed on the semiconductor layer to fill the opening 115. For example, the filling dielectric layer may be formed as an oxide layer. By planarizing the filling dielectric layer and the semiconductor layer until the uppermost insulation layer 110 is exposed, a vertical active pattern 130 and a filling dielectric pattern 132 may be formed in the opening 115 and the recess region 120.

Figure 6D:
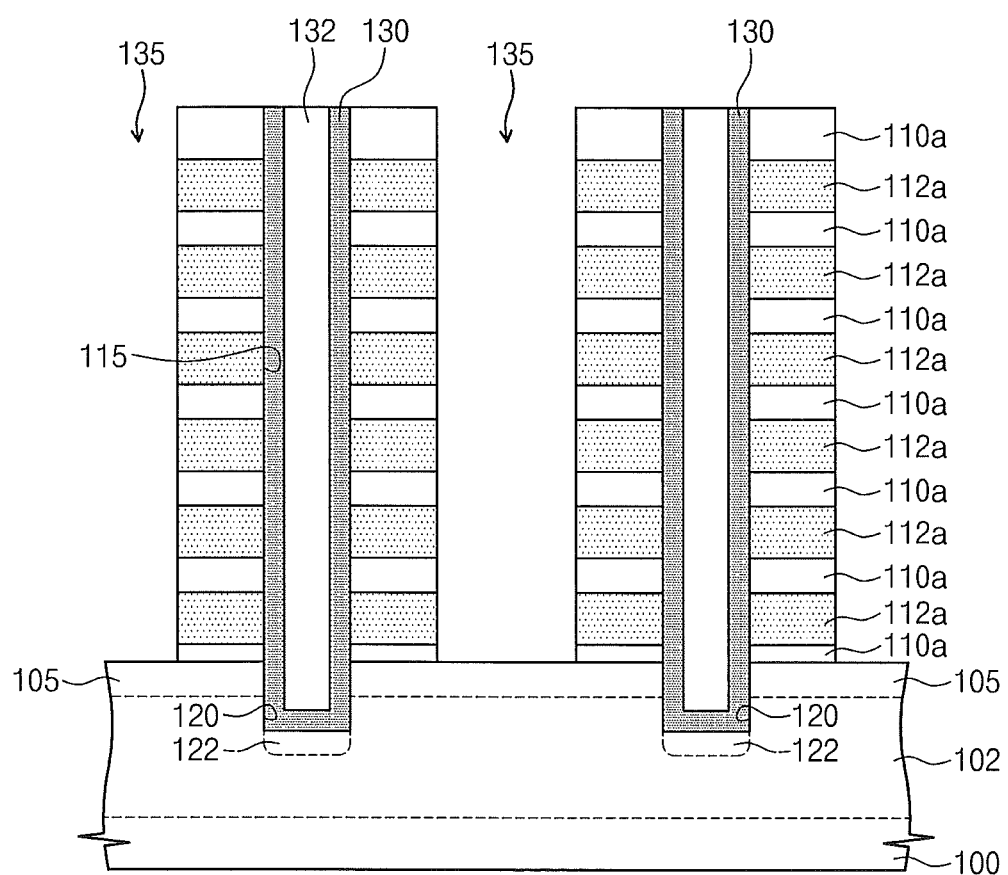

Referring to FIG. 6D, a trench 135 may be formed by sequentially patterning the insulation layers 110 and sacrificial layers 112, such that insulation patterns 110a and the sacrificial patterns 112a being alternately and repeatedly stacked may be formed at a side of the trench 135. The insulation patterns 110a and sacrificial patterns 112a may include the opening 115. That is, the vertical active patterns 130 may sequentially pass through the insulation patterns 110a and the sacrificial patterns 112a being alternately and repeatedly stacked on the substrate 100. Sidewalls of the sacrificial patterns 112a and the insulation patterns 110a are exposed to the trench 135.

Figure 6E:
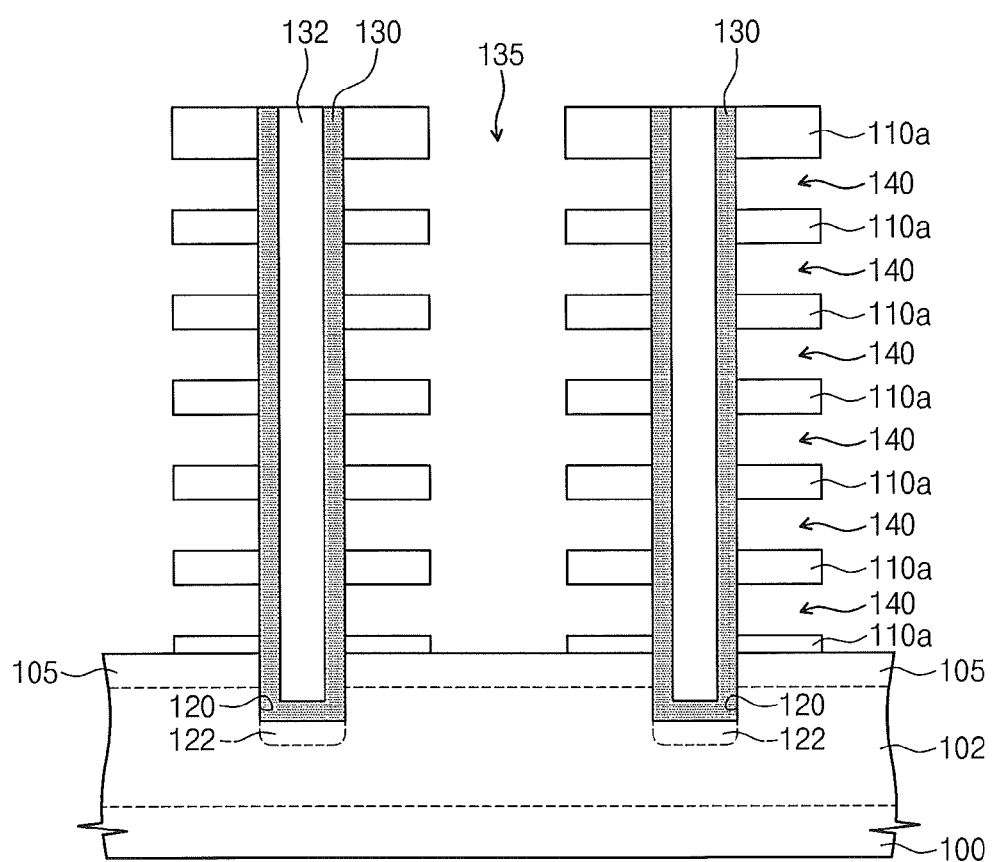

Referring to FIG. 6E, empty regions 140 may be formed by removing the sacrificial patterns 112a exposed to the trench 135. Each of the empty regions 140 corresponds to a region from which the each sacrificial pattern 112a is removed. The empty regions 140 may expose some portions of the sidewall of the vertical active pattern 130, respectively.

Figure 6F:
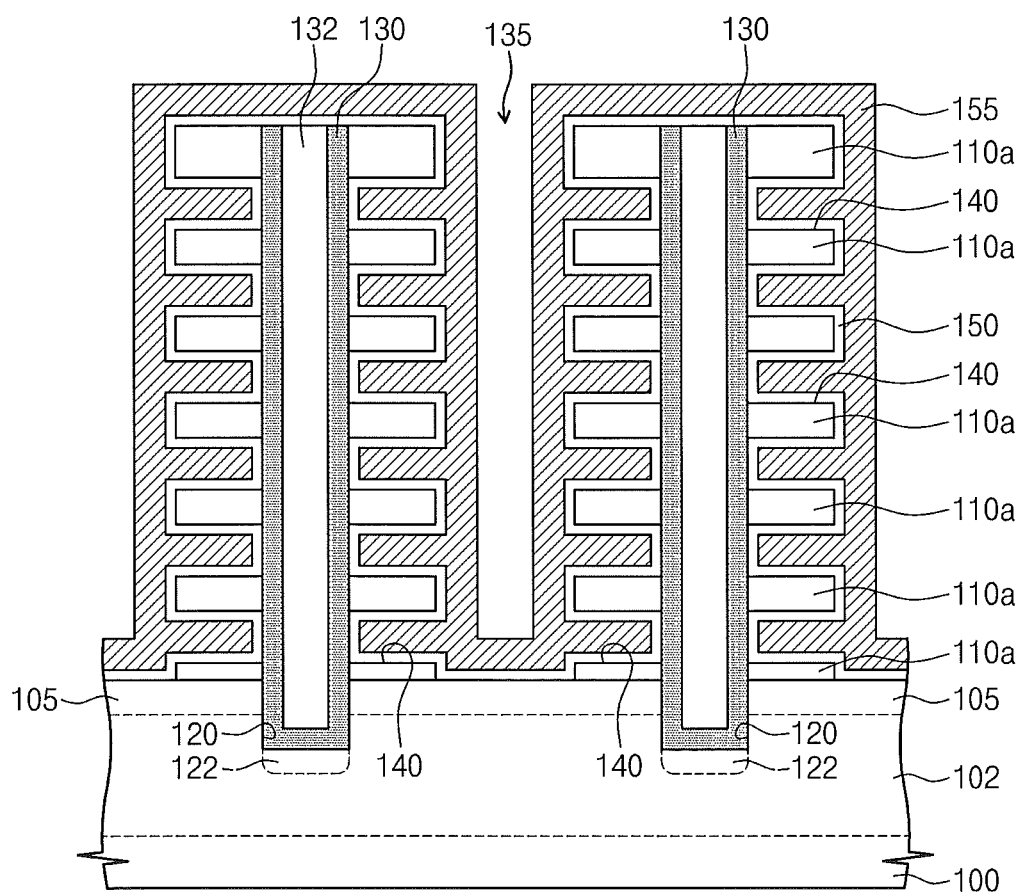

Referring to FIG. 6F, a gate dielectric layer 150 may be conformally formed on the substrate 100 having the empty regions 140. Therefore, the gate dielectric layer 150 may be conformally formed on the inner surfaces of the empty regions 140. The gate dielectric layer 150, as described above with reference to FIGS. 1B and 1C, may include the tunnel dielectric layer, the charge storage layer and the blocking dielectric layer.

A gate conductive layer 155 filling the empty regions 140 may be formed on the substrate 100 having the gate dielectric layer 150. The gate conductive layer 155 may also be formed in the trench 135. Herein, the gate conductive layer 155 may partially fill the trench 135. Therefore, a space surrounded by the gate conductive layer 155 may be formed in the trench 135. A bottom surface of the space may be lower than an inner-upper surface of the lowermost empty region 140.

Figure 6G:
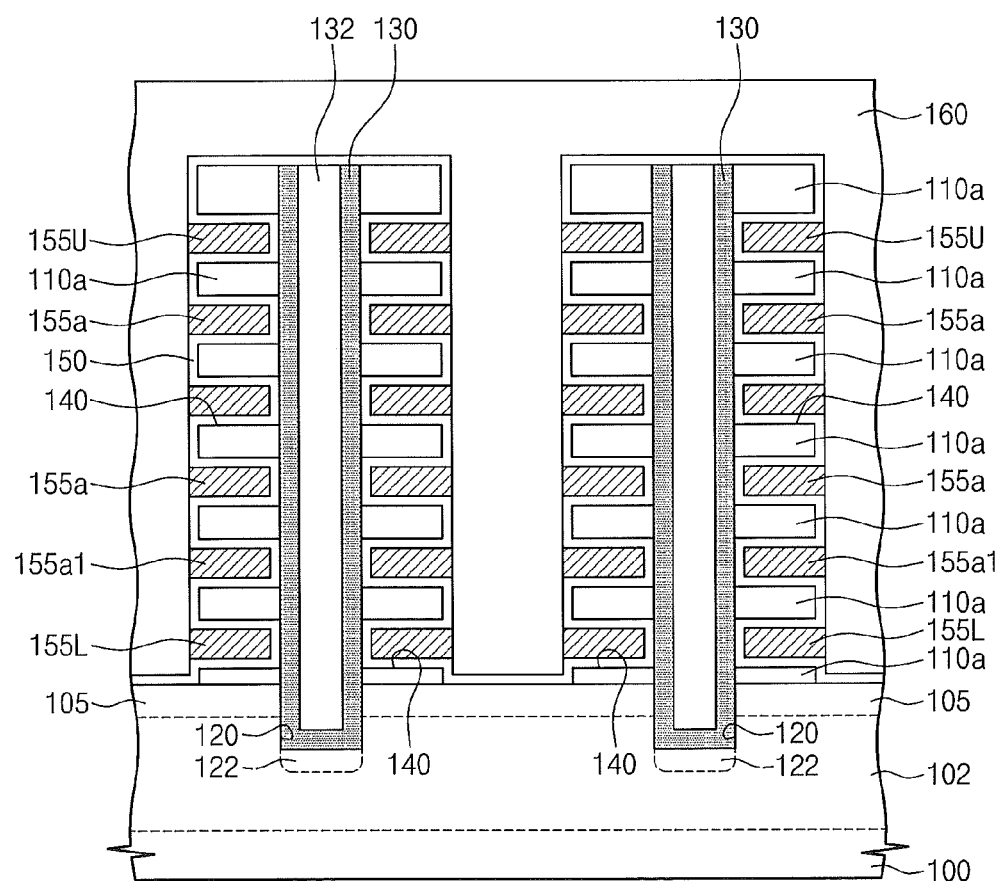

Referring to FIG. 6G, the gate patterns 155L, 155a1, 155a and 155U respectively filling the empty regions 140 may be formed by etching the gate conductive layer 155. The gate patterns 155L, 155a1, 155a and 155U are separated by the etching process of the gate conductive layer 155. According to an embodiment of the inventive concept, the etching process of the gate conductive layer 155 may be an isotropic etching process. The insulation patterns 110a and the gate patterns 155L, 155a1, 155a and 155U, being alternately and repeatedly stacked on the substrate 100, may be included in a stack-structure. Subsequently, a device isolation insulation layer 160 may be formed to fill the trench 135.

Figure 6H:
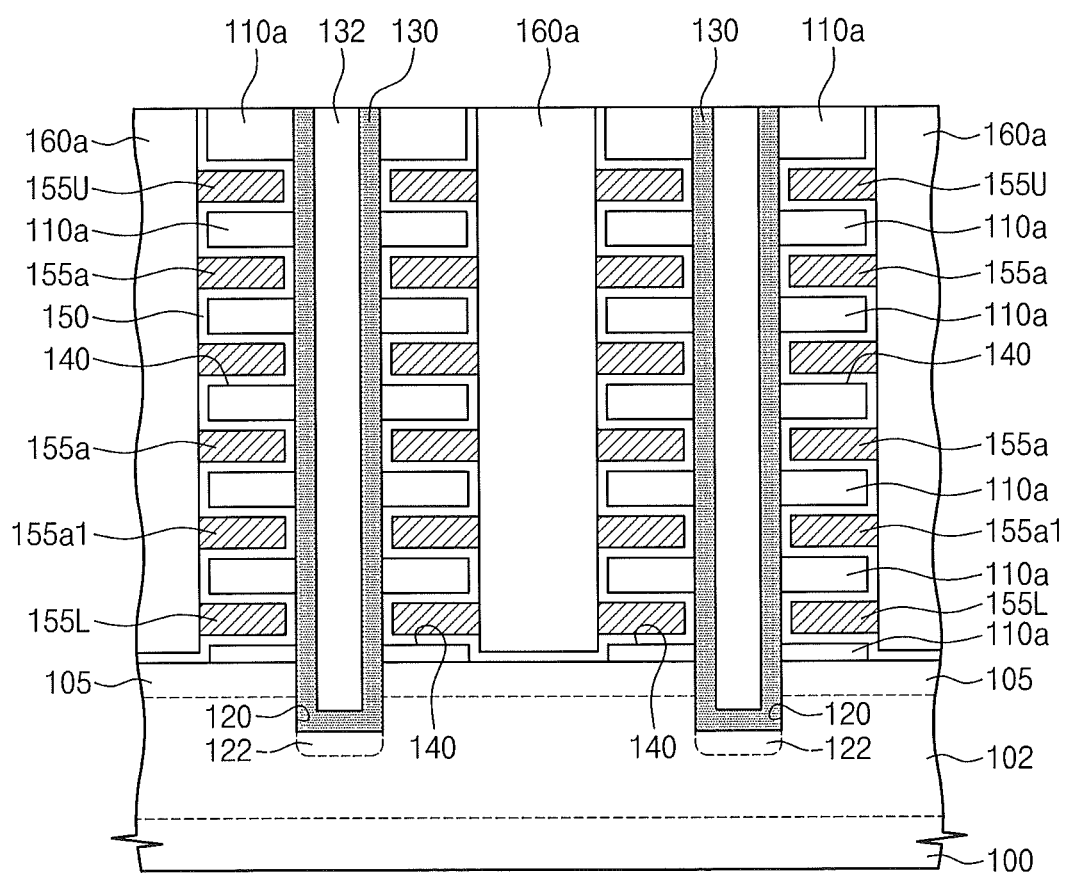

Referring to FIG. 6H, the device isolation insulation layer 160 and the gate dielectric layer 150 may be planarized until the uppermost insulation pattern among the insulation patterns 110a is exposed. Therefore, a device isolation pattern 160a may be formed in the trench 135. Subsequently, by forming the interlayer dielectric 165, contact plug 167 and bit line 170 of the FIG. 1B on the substrate 100, the 3D semiconductor memory device that has disclosed in FIGS. 1A, 1B and 1C may be implemented. According to the above-described 3D semiconductor memory device, the opening 115 and the recess region 120 can be formed in self-alignment by sequentially patterning the insulation layers 110, the sacrificial layers 112 and the substrate 100 (i.e. the common source region 105). Therefore, the 3D semiconductor memory device can be implemented which has excellent reliability and is optimized for high integration. Next, a method of fabricating the 3D semiconductor memory device that has been disclosed in FIG. 2A will be described below with reference to the accompanying drawings. The method may include the methods that have been described above with reference to FIGS. 6A and 6B.

FIGS. 7A to 7D are cross-sectional views taken along line I-I' of FIG. 1A for describing a modification example of a method of fabricating 3D semiconductor memory device according to an embodiment of the inventive concept.

Figure 7A:
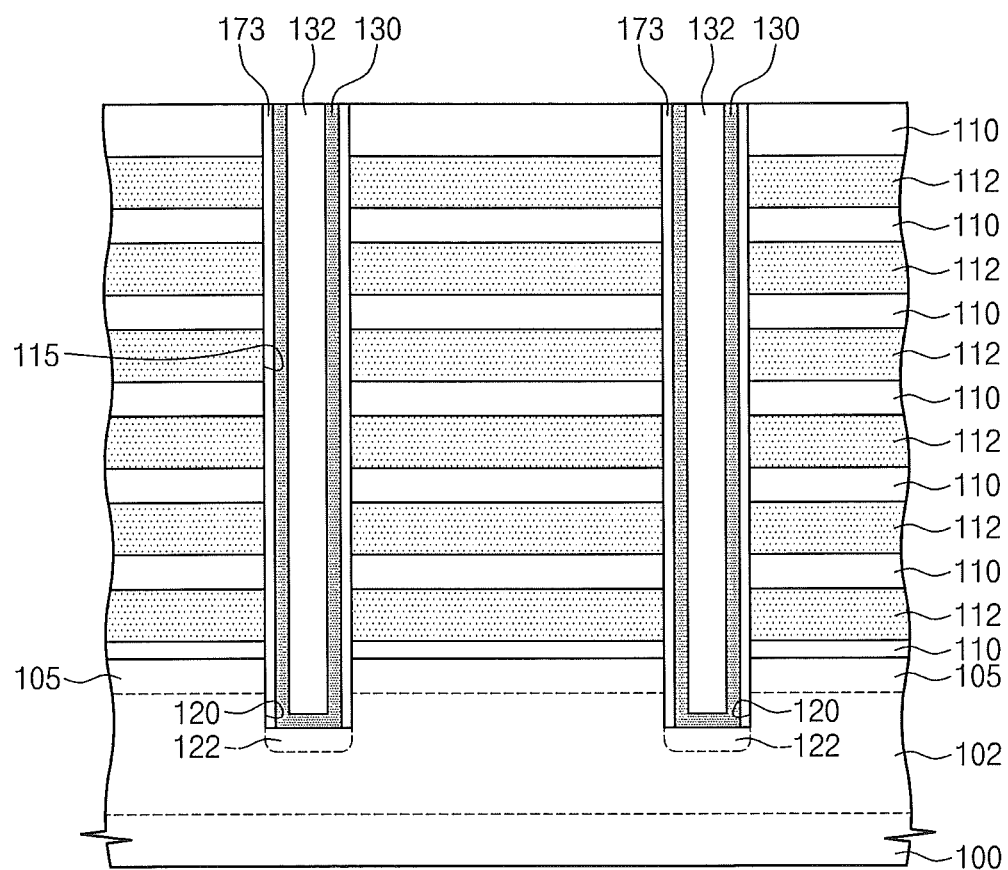
FIGS. 7A to 7D are cross-sectional views taken along line I-I' of FIG. 1A for describing a modification example of a method of fabricating 3D semiconductor memory device according to an embodiment of the inventive concept.

Referring to FIGS. 6B and 7A, a protection dielectric layer 173 may be conformally formed on the substrate 100 having the opening 115 and the recess region 120, and the protection dielectric layer 173 may be etched by a blanket anisotropic etching process until the bottom surface of the recess region 120 is exposed. As illustrated in FIG. 7A, therefore, the protection dielectric layer 173 may be formed on the sidewalls of the recess region 120 and the opening 115. The protection dielectric layer 173 may include a dielectric material having an etch selectivity with respect to the sacrificial layer 112. For example, the protection dielectric layer 173 may be formed of oxide.

Subsequently, a semiconductor layer may be formed, a filling dielectric layer may be formed on the semiconductor layer, and the filling dielectric layer and the semiconductor layer may be planarized. Therefore, the vertical active pattern 130 and the filling dielectric pattern 132 may be formed in the opening 115 and the recess region 120. The vertical active pattern 130 may contact the bottom surface of the recess region 120. The protection dielectric layer 173 may be disposed between the vertical active pattern 130 and the inner sidewalls of the opening 115 and the recess region 120.

Figure 7B:
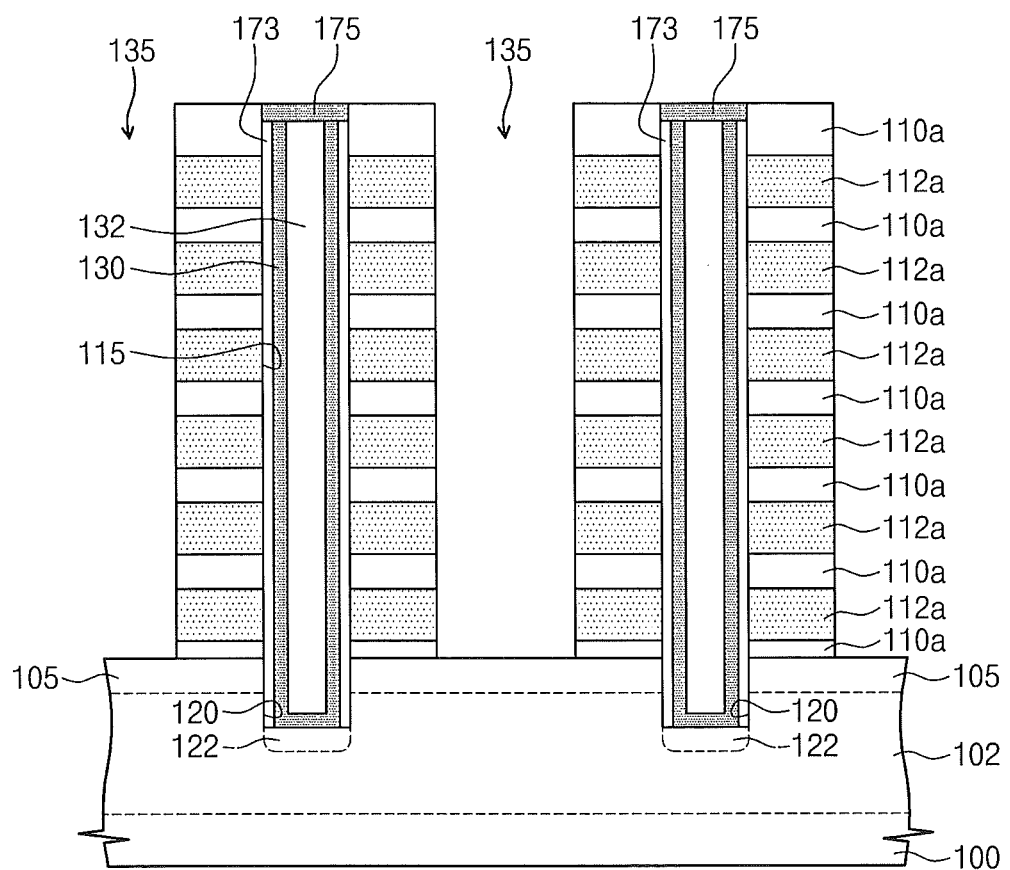

Referring to FIG. 7B, the upper ends of the vertical active pattern 130, filling dielectric pattern 132 and protection dielectric layer 175 may be recessed lower than the upper surface of the uppermost insulation layer 110. Subsequently, a capping semiconductor layer filling the opening 110 may be formed on the substrate 100, and a capping semiconductor pattern 175 may be formed by planarizing the capping semiconductor layer until the uppermost insulation layer 110 is exposed. The capping semiconductor pattern 175 may cover the recessed upper ends of the vertical active pattern 130, filling dielectric pattern 132 and protection dielectric layer 175.

Subsequently, the trench 135 may be formed by sequentially patterning the insulation layers 110 and the sacrificial layers 112. In this case, as described above, the insulation patterns 110 and the sacrificial patterns 112a that are alternately and repeatedly stacked may be formed at a side of the trench 135.

Figure 7C:
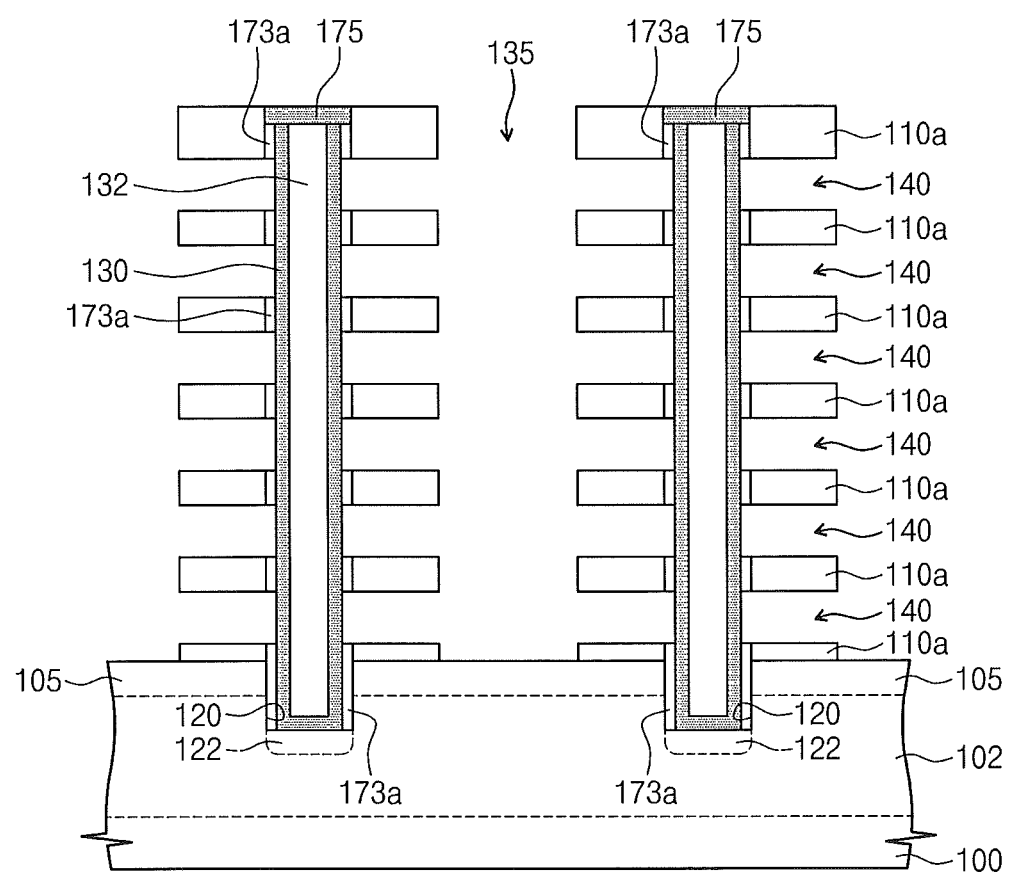

Referring to FIG. 7C, the sacrificial patterns 112a exposed to the trench 135 may be removed. Therefore, the empty regions 140 may be formed which respectively exposes some portions of the protection dielectric layer 173 disposed on the sacrificial patterns 112a and the vertical active patterns 130. As described above, the protection dielectric layer 173 has an etch selectivity with respect to the sacrificial patterns 112a, and thus it can protect the vertical active pattern 130 from a process of removing the sacrificial patterns 112a. The protection dielectric layer 173 may be used as an etch stop layer in the process of removing the sacrificial patterns 112a. Subsequently, the exposed portions of the protection dielectric layer 173 may be removed. Therefore, the empty regions 140 may expose some portions of the side wall of the vertical active pattern 130, respectively. When removing the exposed portions of the protection dielectric layer 173, the protection dielectric patterns 173a may be formed between the vertical active pattern 130 and the insulation patterns 110a and between the vertical active pattern 130 and the inner sidewall of the recess region 120. The protection dielectric patterns 173a correspond to remaining portions of protection dielectric layer 173.

Figure 7D:
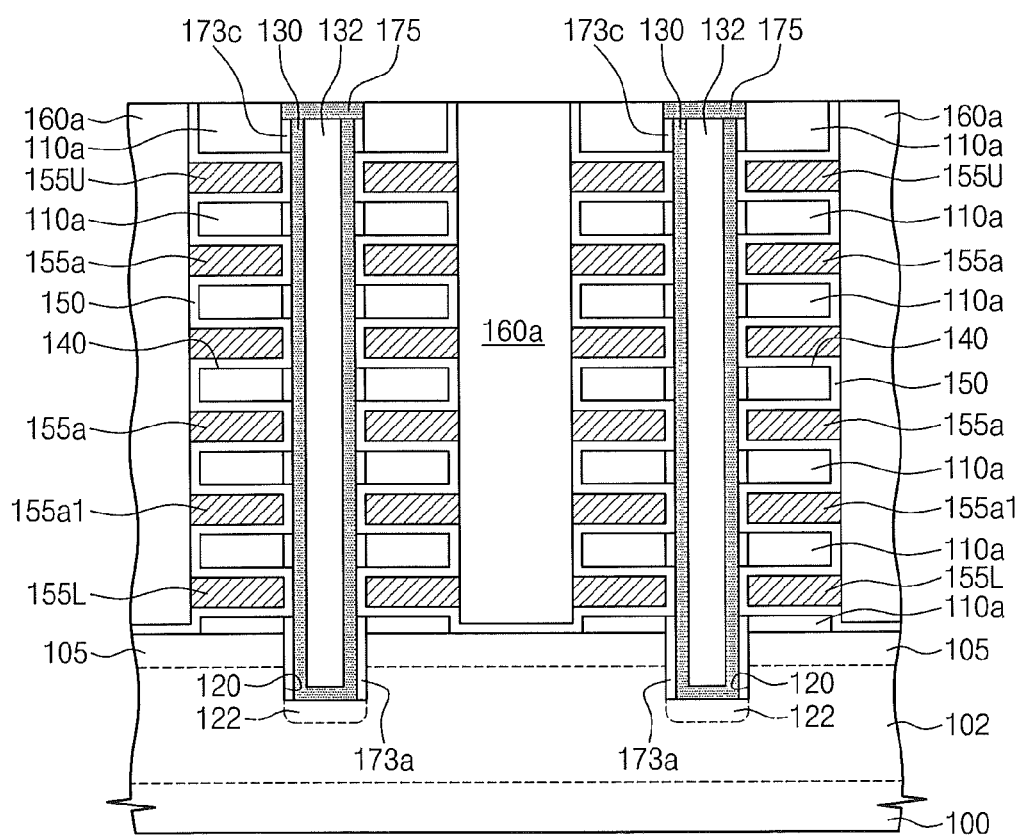

Referring to FIG. 7D, the gate dielectric layer 150 may be conformally formed on the substrate 100 having the empty regions 140, and the gate patterns 155L, 155a1, 155a and 155U respectively filling the empty regions 140 may be formed. Afterwards, the device isolation pattern 160a filling the trench 135 may be formed. Subsequently, by forming the interlayer dielectric 165, contact plug 167 and bit line 170 of FIG. 2A, the 3D semiconductor memory device of FIG. 2A can be implemented.

The features of a method, that fabricates the 3D semiconductor memory device that has been disclosed in FIG. 2B, may have a process of forming the lower surface of the recess region 120 higher than the lower surface of the common source region 105 and a process of forming the counter-doped region 122a by counter-doping the common source region 105 under the bottom surface of the recess region 120 with the first conductive dopant. Other processes may be the same as the processes that have been described above with reference to FIGS. 7A to 7D.

Next, a method of fabricating the 3D semiconductor memory device that has been disclosed in FIG. 3A will be described below with reference to the accompanying drawings. The method may include the methods that have been described above with reference to FIGS. 6A and 6B.

FIGS. 8A to 8F are cross-sectional views taken along line I-I' of FIG. 1A for describing other modification example of a method of fabricating 3D semiconductor memory device according to an embodiment of the inventive concept.

Figure 8A:
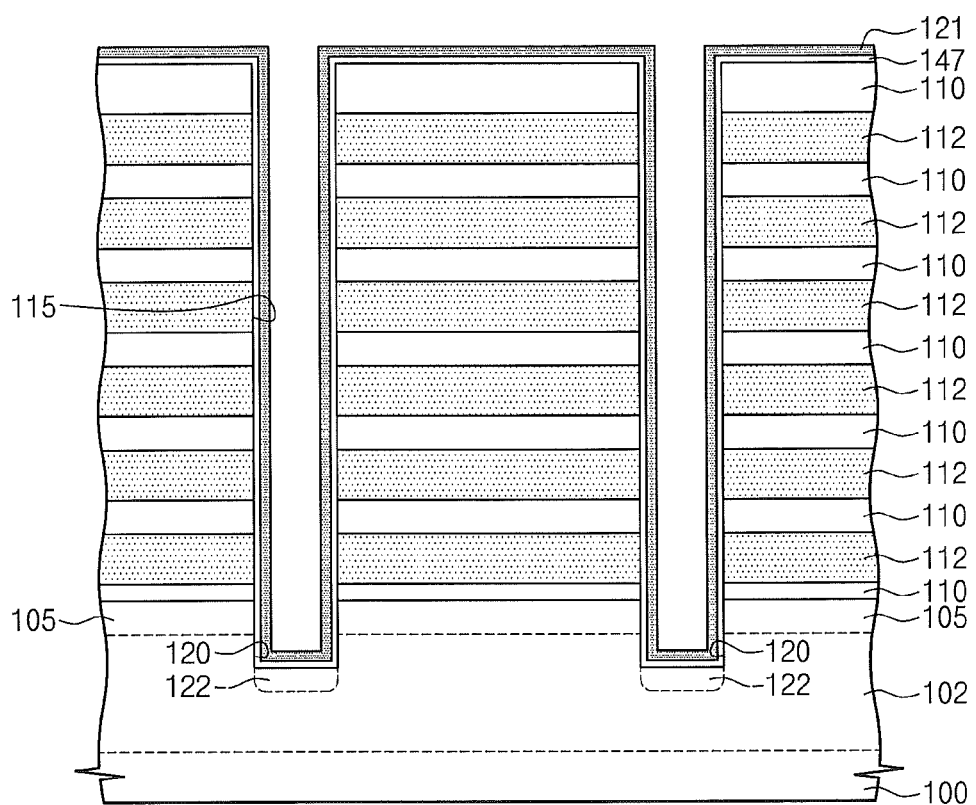
FIGS. 8A to 8F are cross-sectional views taken along line I-I' of FIG. 1A for describing other modification example of a method of fabricating 3D semiconductor memory device according to an embodiment of the inventive concept.

Referring to FIGS. 6B and 8A, a first sub-layer 147 may be conformally formed on the substrate 100 having the opening 115 and the recess region 120. The first sub-layer 147 may be conformally formed on the inner sidewall of the opening 115 and the inner surface of the recess region 120. A first semiconductor layer 121 may be conformally formed on the substrate 100 having the first sub-layer 147.

Figure 8B:
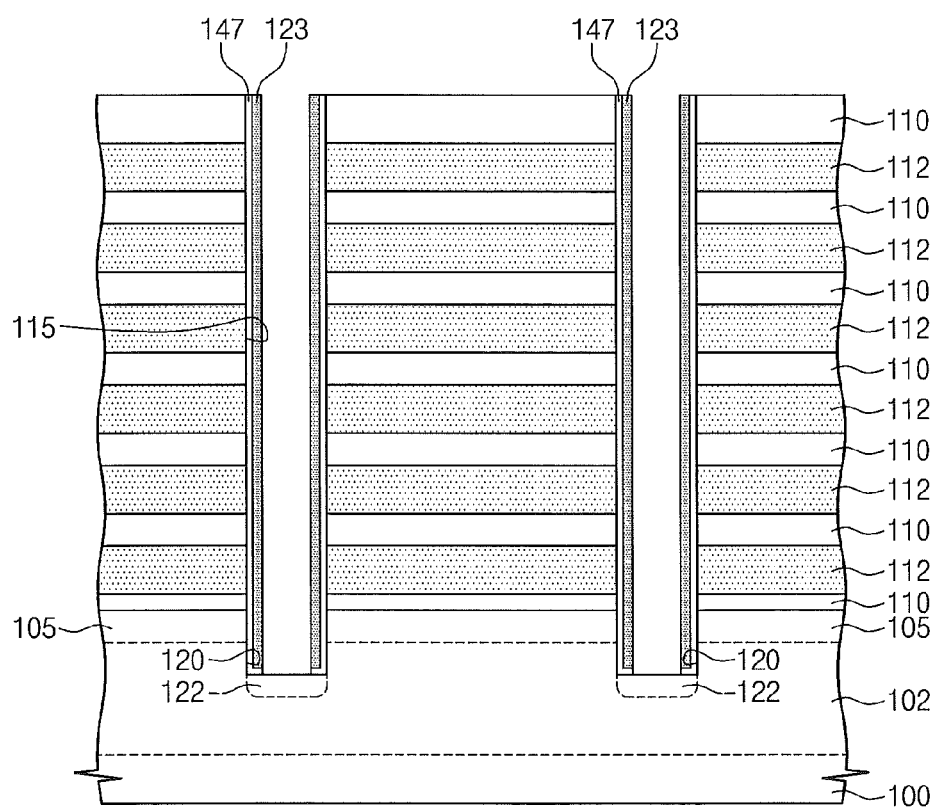

Referring to FIG. 8B, portions of the first sub-layer 147 and the first semiconductor layer 121 disposed on the bottom surface of the recess region 120 may be removed. At this point, portions of the first sub-layer 147 and the first semiconductor layer 121 disposed outside opening 115 may also be removed. Therefore, the first sub-layer 147 and the first semiconductor pattern 123 that are sequentially stacked on the sidewalls of the recess region 120 and opening 115 may be formed, the first semiconductor pattern 123 correspond to a portion of the first semiconductor layer 121. According to an embodiment of the inventive concept, by blanket-anisotropic-etching the first semiconductor layer 121 and the first sub-layer 147 until the bottom surface of the recess region 120 is exposed, the first semiconductor pattern 123 may be formed. The first semiconductor pattern 123 may not contact the inner surface of the recess region 120 by the first sub-layer 147.

Figure 8C:
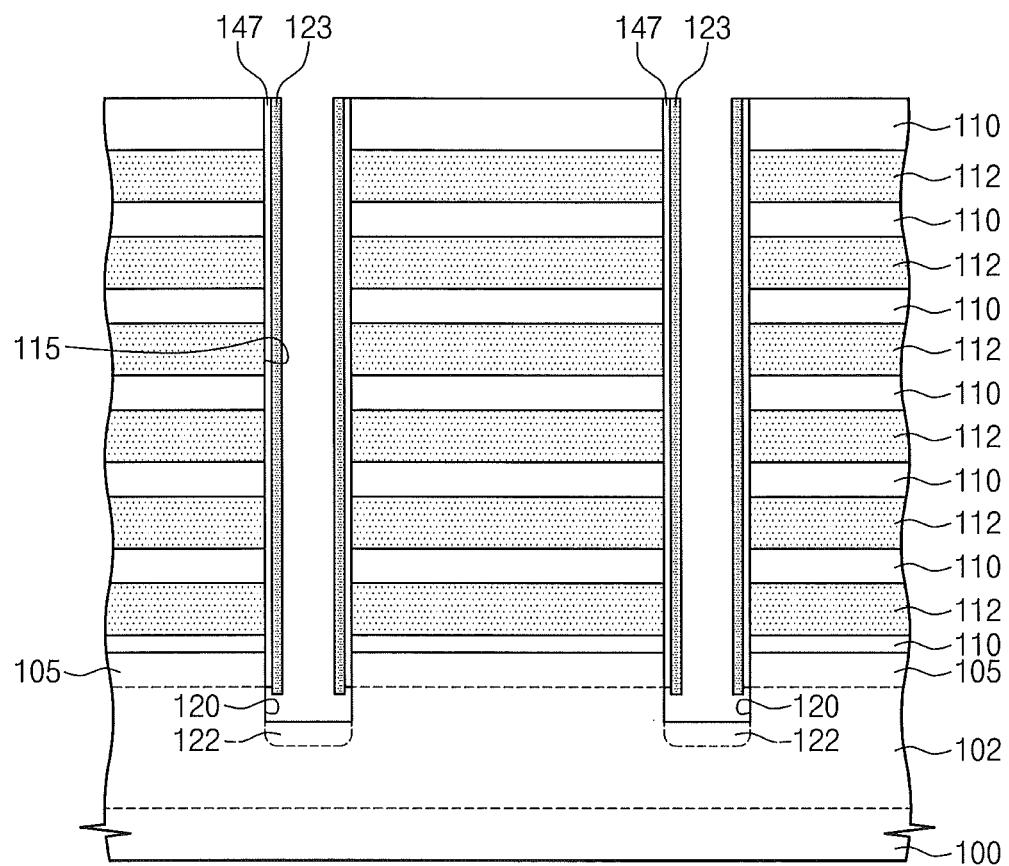

Referring to FIG. 8C, subsequently, by isotropic-etching the first sub-layer 147, at least one portion of the inner sidewall of the recess region 120 may be exposed. At this point, a portion of the first semiconductor pattern 123 in the recess region 120 may also be etched.

Figure 8D:
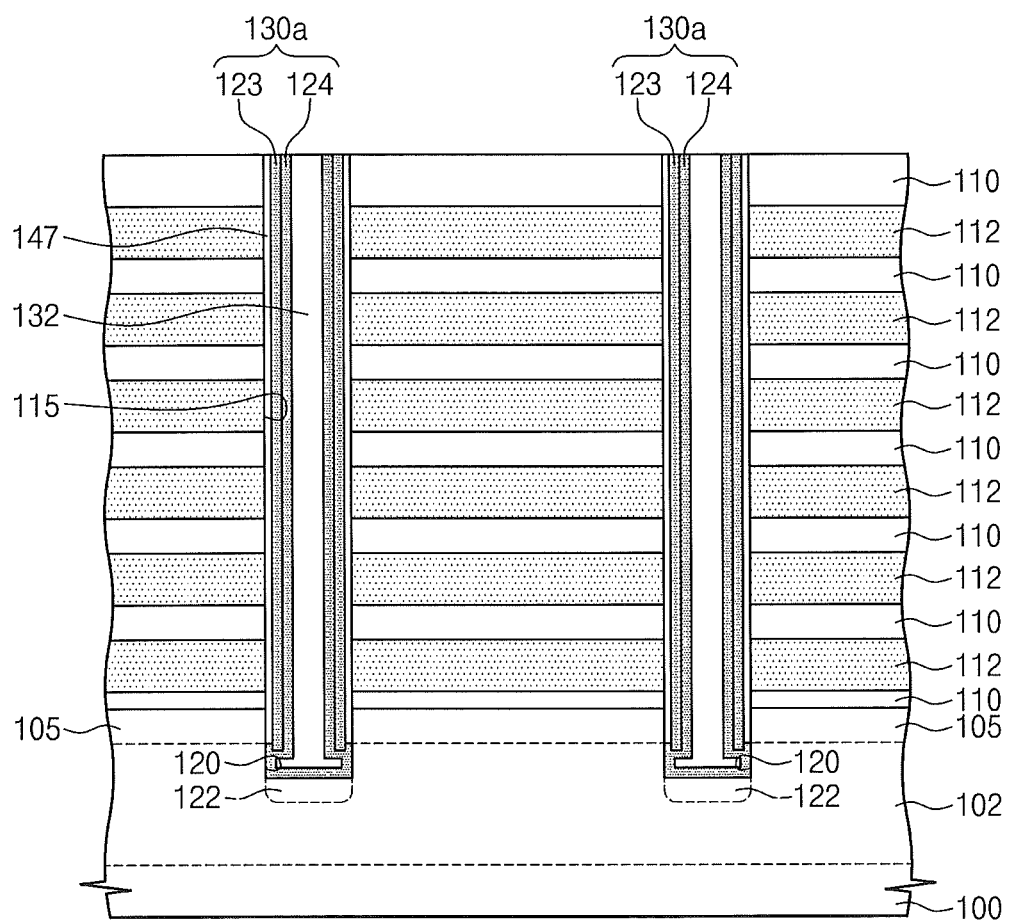

Referring to FIG. 8D, subsequently, a second semiconductor layer may be conformally formed on the substrate 100, a filling dielectric layer filling the opening 115 may be formed on the second semiconductor layer. The second semiconductor layer may contact the first semiconductor pattern 123, and also the second semiconductor layer may contact the bottom surface and exposed inner sidewall of the recess region 120. By planarizing the second semiconductor layer and the filling dielectric layer, a second semiconductor pattern 124 and a filling dielectric pattern 132 may be formed in the opening 115 and the recess region 120. The second semiconductor pattern 124 may contact the bottom surface and inner sidewall of the recess region 120 and the first semiconductor pattern 123. The first and second semiconductor patterns 123 and 124 may configure a vertical active pattern 130a.

Figure 8E:
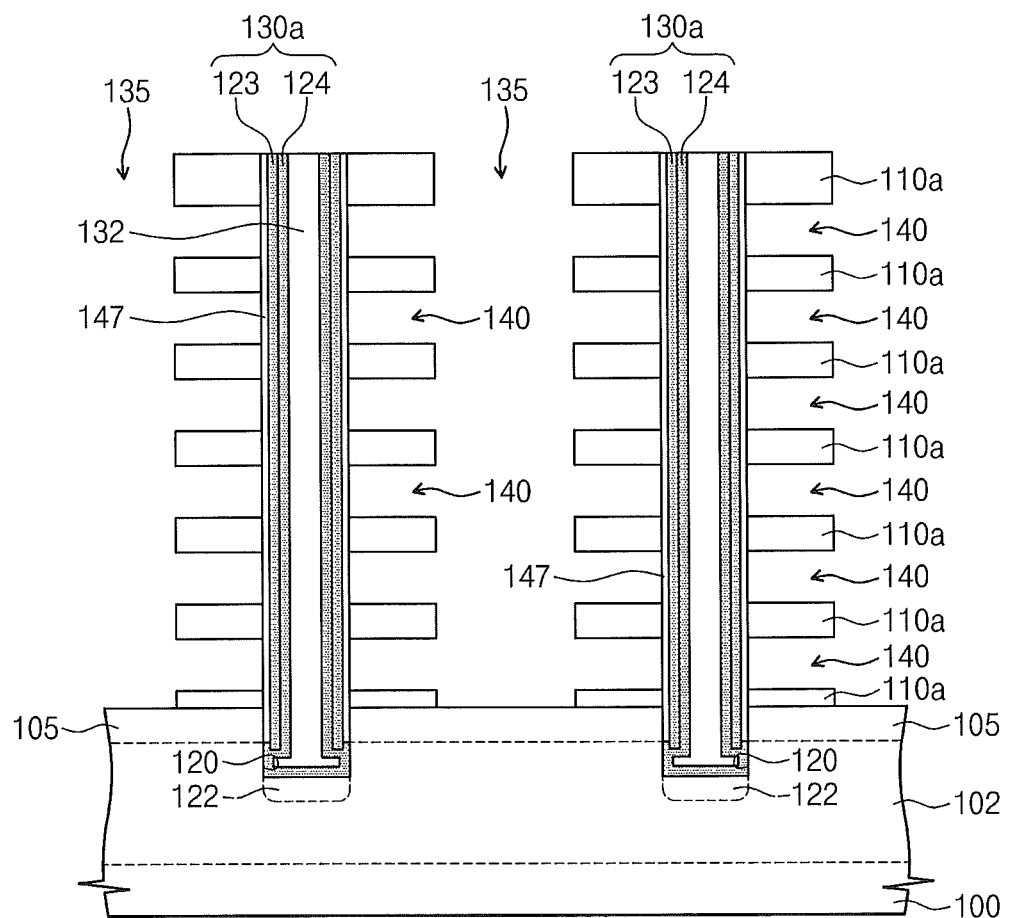

Referring to FIG. 8E, subsequently, the trench 135, the insulation patterns 110a and the sacrificial patterns 112 may be formed by sequentially patterning the insulation layers 110 and the sacrificial layers 112. The empty regions 140 may be formed by removing the sacrificial patterns 112. At this point, the empty regions 140 may expose some portions of the first sub-layer 147, respectively.

Figure 8F:
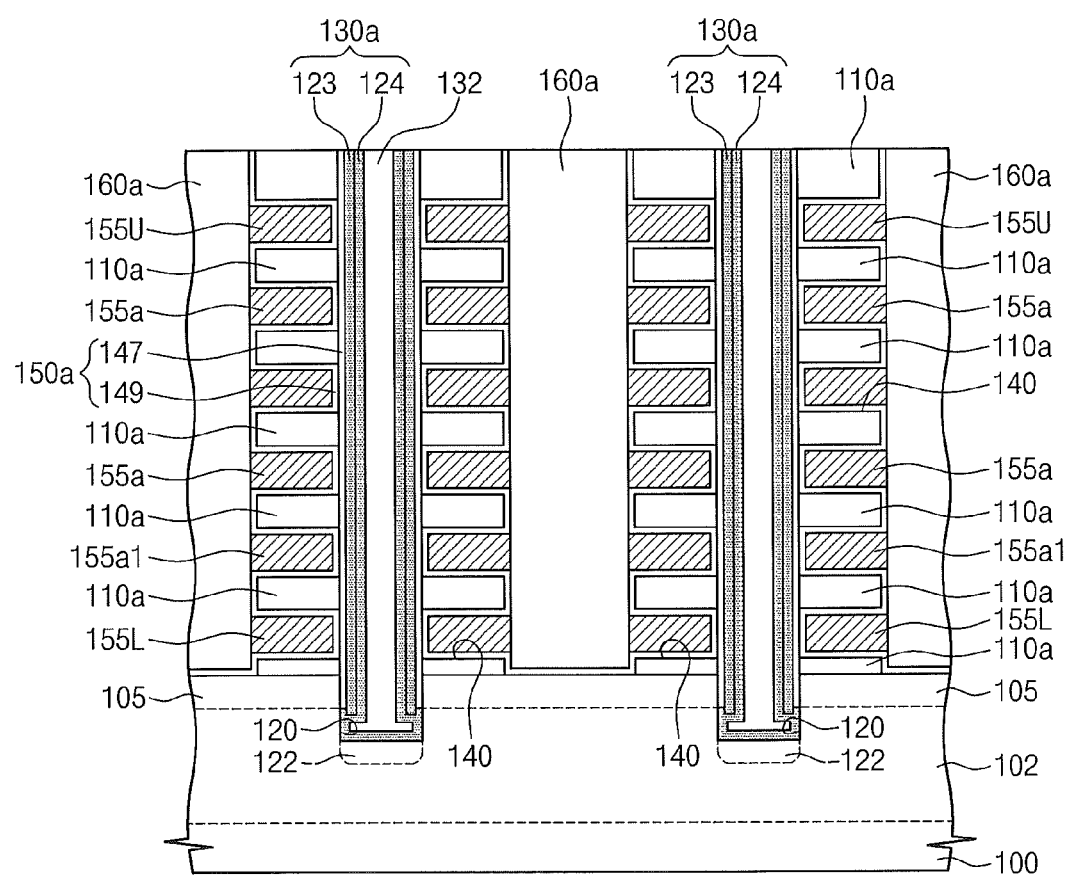

Referring to FIG. 8F, a second sub-layer 149 may be conformally formed on the substrate 100 having the empty regions 140. The second sub-layer 149 may be conformally formed on the inner surfaces of the empty regions 140. The second sub-layer 149 may contact the first sub-layer 147 exposed to the empty regions 140. The first and second sub-layers 147 and 149 may be included in the gate dielectric layer 150a. The first sub-layer 147 may include at least a portion of the tunnel dielectric layer, and the second sub-layer 149 may include at least a portion of the blocking dielectric layer. Herein, one of the first and second sub-layers 147 and 149 may include the charge storage layer. According to an embodiment of the inventive concept, the first and second sub-layers 147 and 149 may be the same as the layers that have been described above with reference to FIG. 3B. Unlike this, the first and second sub-layers 147 and 149 may be replaced with the first and second sub-layers 147a and 149a of the FIG. 3C, respectively. Unlike this, the first and second sub-layers 147 and 149 may be replaced with the first and second sub-layers 149b and 149c of the FIG. 3C, respectively. Subsequently, the gate patterns 155L, 155a1, 155a and 155U respectively filling the empty regions 140 may be formed, and the device isolation pattern 160a filling the trench 135 may be formed. Subsequently, the interlayer dielectric 165, the contact plug 167 and the bit line 170 that have been disclosed in FIG. 3A may be formed. Next, a method of fabricating the 3D semiconductor memory device that has been disclosed in FIGS. 4A and 4B will be described below with reference to the accompanying drawings. The method may include the methods that have been described above with reference to FIGS. 6A and 6B.

FIGS. 9A to 9D are cross-sectional views taken along line I-I' of FIG. 1A for describing still other modification example of a method of fabricating 3D semiconductor memory device according to an embodiment of the inventive concept. Referring to FIGS. 6B to 9A, a gate dielectric layer 150d may be conformally formed on the substrate 100 having the opening 115 and the recess region 120. A first semiconductor layer may be conformally formed on the gate dielectric layer 150d. Subsequently, the first semiconductor layer and the gate dielectric layer 150d may be etched by a blanket-anisotropic-etching process until the bottom of the recess region 120 is exposed, such that a first semiconductor pattern 123 may be formed in the opening 115 and the recess region 120. At this point, the gate dielectric layer 150d may also be restrictively disposed in the opening 115 and the recess region 120. The first semiconductor pattern 123 may not contact the side wall of the opening 115 and the inner surface of the recess region 120 by the gate dielectric layer 150d.

Figure 9A:
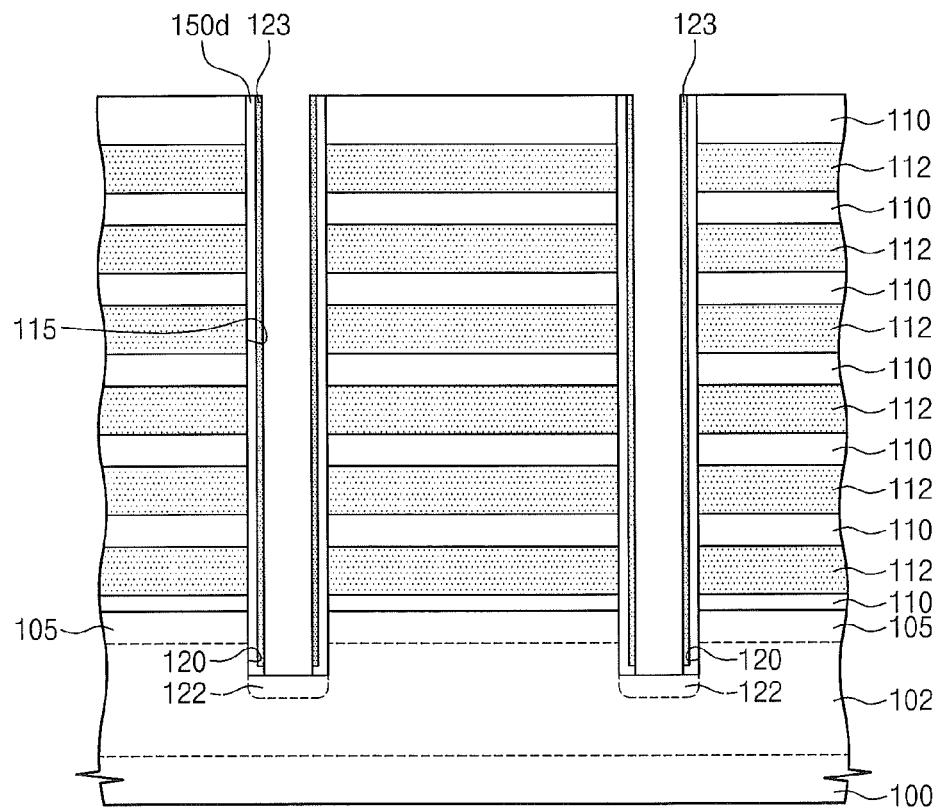
FIGS. 9A to 9D are cross-sectional views taken along line I-I' of FIG. 1A for describing still other modification example of a method of fabricating 3D semiconductor memory device according to an embodiment of the inventive concept.
Figure 9B:
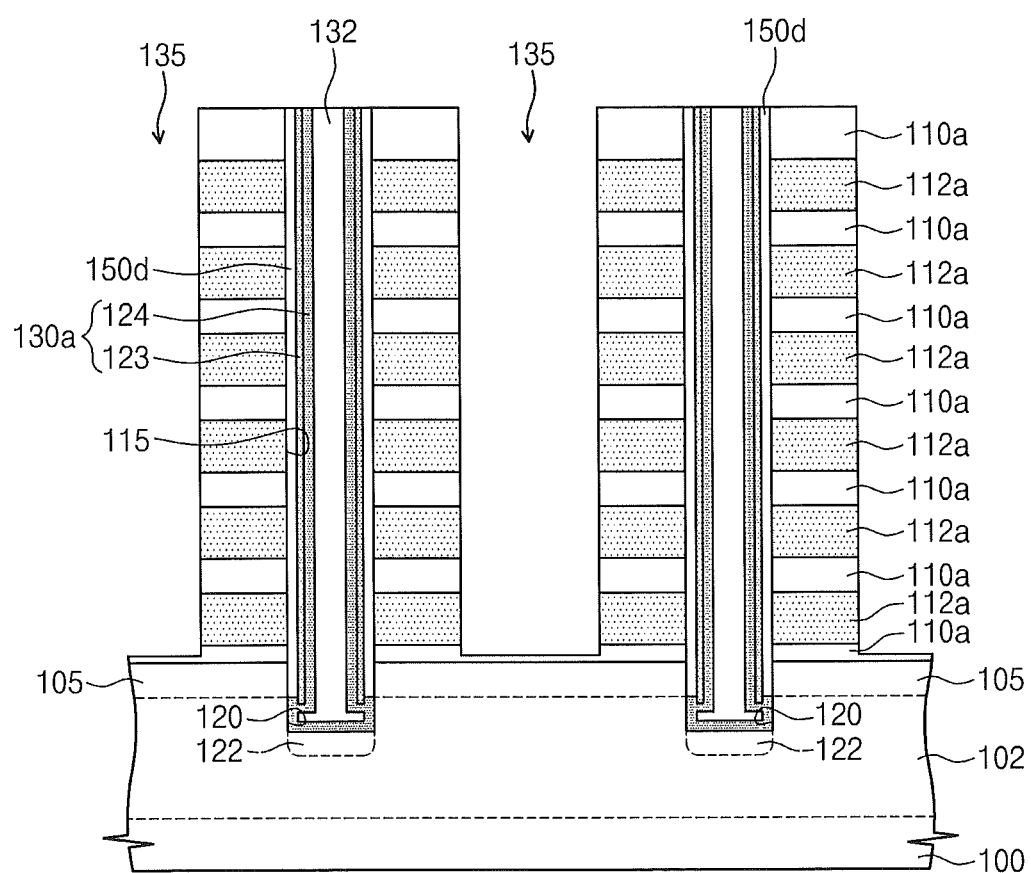

Referring to FIG. 9B, subsequently, a second semiconductor may be conformally formed over the substrate 100, and a filling dielectric layer may be formed on the second semiconductor layer. By planarizing the filling dielectric layer and the second semiconductor layer, a second semiconductor pattern 124 and a filling dielectric pattern 132 may be formed in the opening 115 and the recess region 120. The first and second semiconductor patterns 123 and 124 may configure a vertical active pattern 130a. Subsequently, a trench 135, insulation patterns 110a and sacrificial patterns 112a may be formed by sequentially patterning the insulation layers 110 and the sacrificial layers 112. According to the modification example, a portion of the lowermost insulation layer among the insulation layers 110 may remain under the trench 135.

Figure 9C:
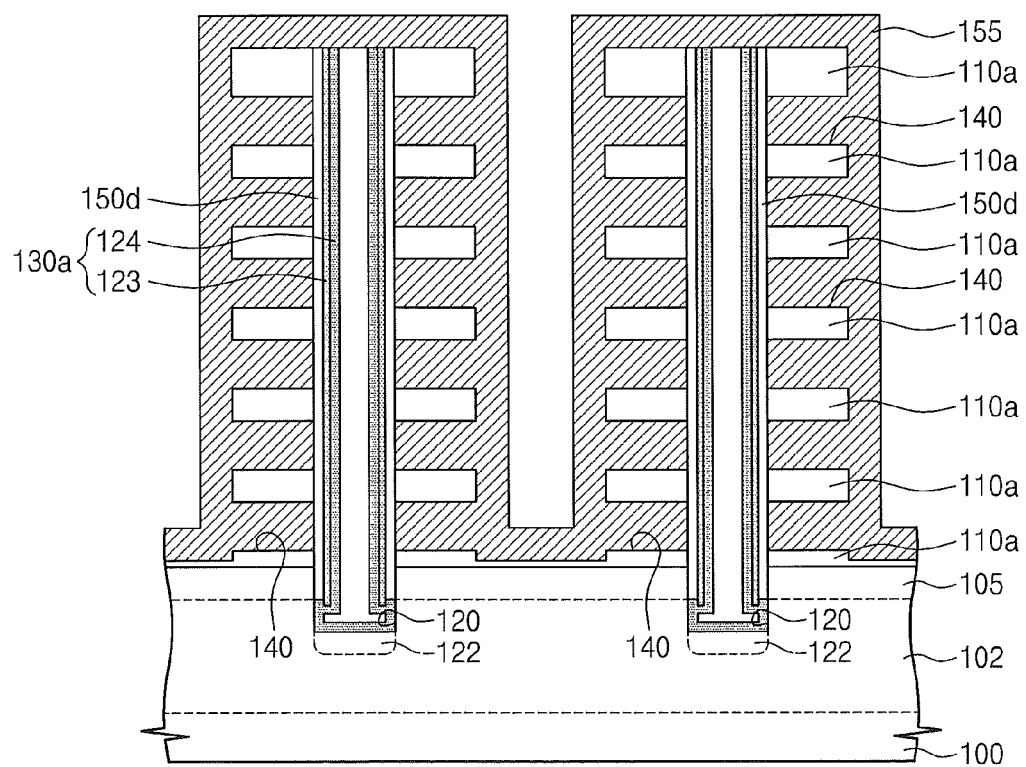

Referring to FIG. 9C, empty regions 140 may be formed by removing the sacrificial patterns 112a. The empty regions 140 may expose the gate dielectric layer 150d. Particularly, the blocking dielectric layer 143 (see FIG. 4B) in the gate dielectric layer 150d may be exposed. Subsequently, a gate conductive layer 155 filling the empty regions 140 may be formed on the substrate 100.

Figure 9D:
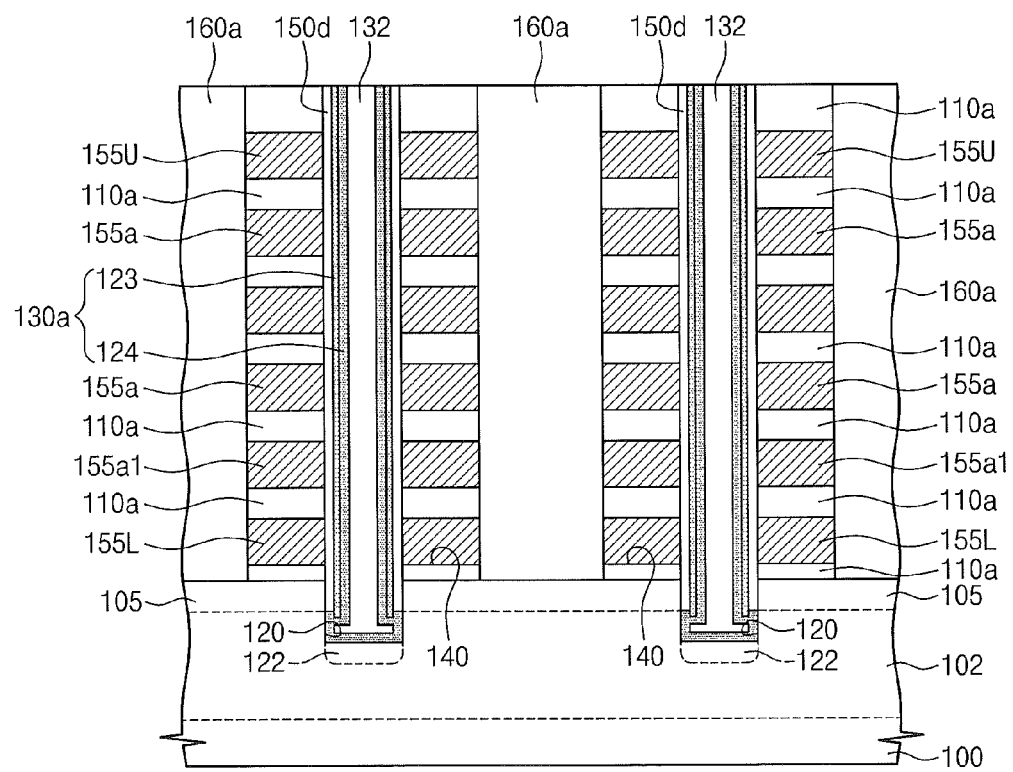

Referring to FIG. 9D, by removing the gate conductive layer outside the empty regions 140, gate patterns 155L, 155a1, 155a and 155U filling the empty regions 140 may be formed. Subsequently, the device isolation pattern 160a filling the trench 135 may be formed, and the interlayer dielectric 165, contact plug 167 and bit line 170 of FIG. 4A may be formed. Thus, the 3D semiconductor memory device of FIGS. 4A and 4B can be implemented. Next, a method of fabricating the 3D semiconductor memory device of FIGS. 5A and 5B will be described below with reference to the accompanying drawings.

Figure 10A:
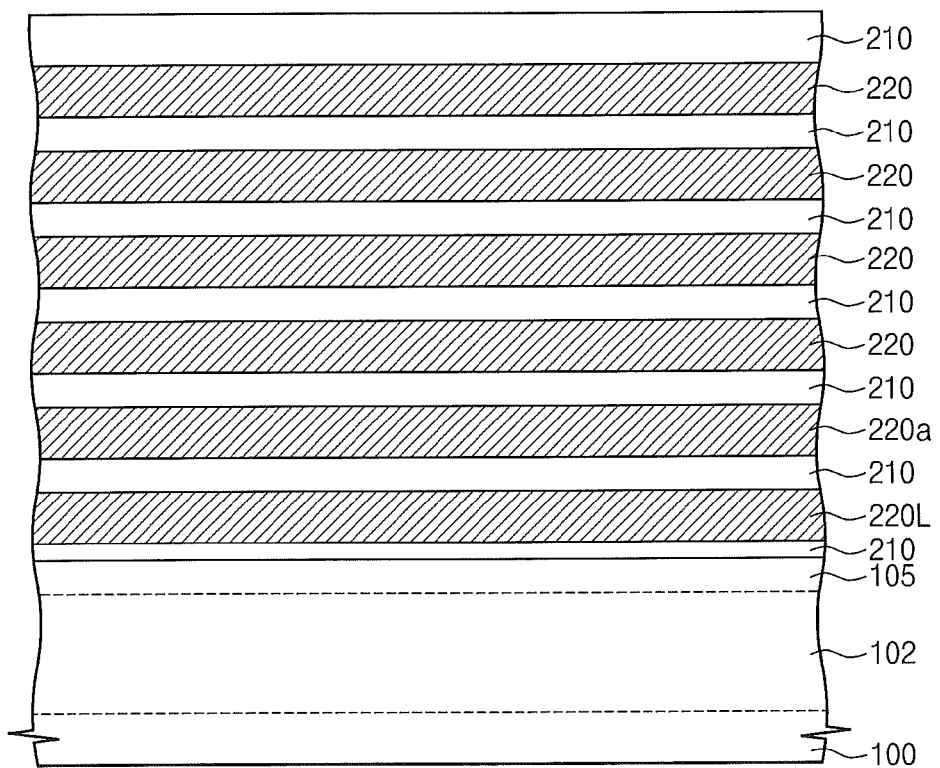
FIGS. 10A to 10C are cross-sectional views taken along line I-I' of FIG. 1A for describing even other modification example of a method of fabricating 3D semiconductor memory device according to an embodiment of the inventive concept.
Figure 10B:
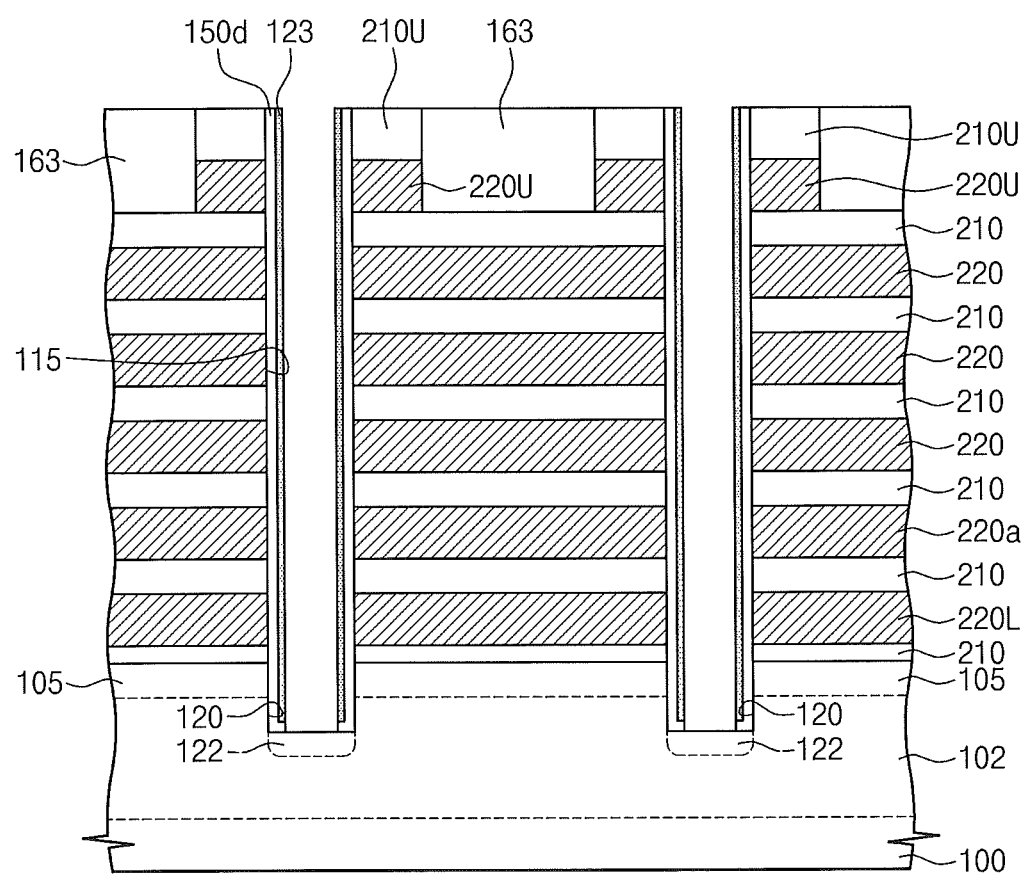
Figure 10C:
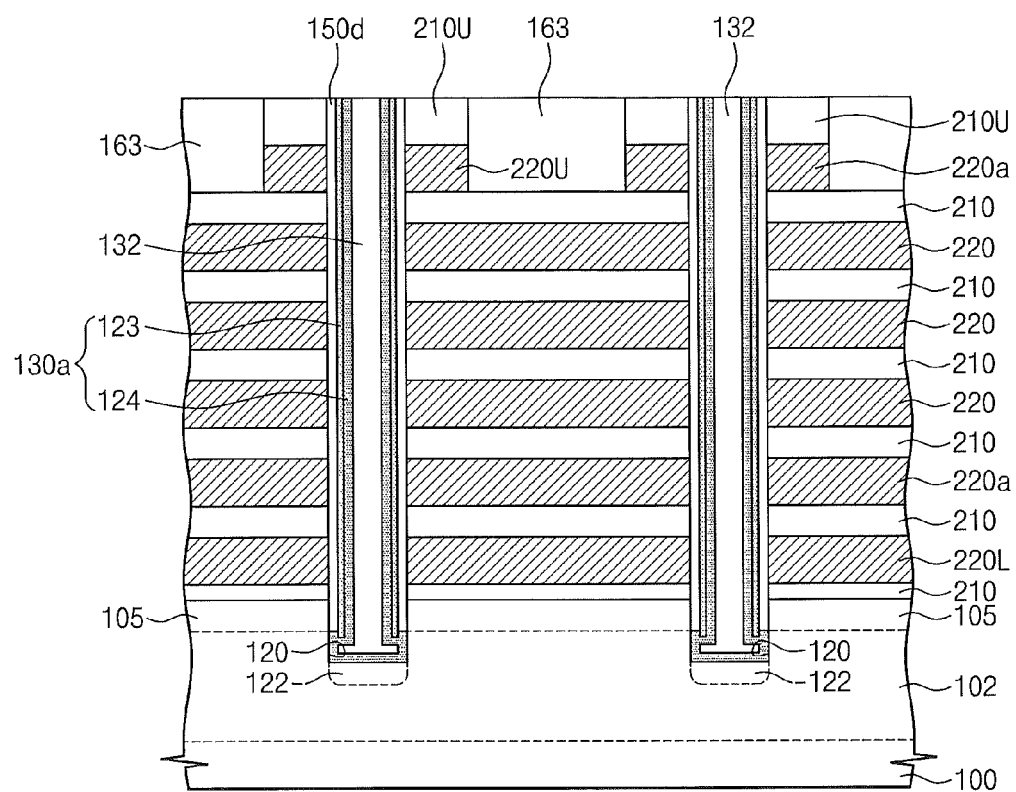

FIGS. 10A to 10C are cross-sectional views taken along line I-I' of FIG. 1A for describing even other modification example of a method of fabricating 3D semiconductor memory device according to an embodiment of the inventive concept. Referring to FIG. 10A, insulation layers 210 and gate layers 220 may be alternately and repeatedly stacked on the common source region 105 in the substrate 100. The insulation layers 210 and gate layers 220L, 220a and 220 may have a flat plate shape. Referring to FIG. 10B, an uppermost gate pattern 220U and an uppermost insulation pattern 210U may be formed by patterning an uppermost insulation layer and an uppermost gate layer. The uppermost gate pattern 220U and the uppermost insulation pattern 210U may have a line shape that is extended in one direction as illustrated in FIG. 5A. A lower interlayer dielectric 163 may be formed on the substrate 100, and the lower interlayer dielectric 163 may be planarized. An opening 115 and a recess region 120 may be formed by sequentially patterning the uppermost insulation pattern 210U, the uppermost gate pattern 220U, the insulation layers 210, the gate layers 220L, 220a and 220 and the common source region 105. The recess region 120 may be formed in self-alignment in the opening 115. By providing a first conductive dopant through the bottom surface of the recess region 120, a high concentration region 122 may be formed. Subsequently, a gate dielectric layer 150d may be conformally formed over the substrate 100, and a first semiconductor layer may be conformally formed on the gate dielectric layer 150d. By blanket-isotropic-etching the first semiconductor layer and the gate dielectric layer 150d until the bottom surface of the recess region 120 is exposed, a first semiconductor pattern 123 may be formed in the opening 115 and the recess region 120.

Referring to FIG. 10C, a second semiconductor layer may be conformally formed over the substrate 100, and a filling dielectric layer may be formed on the second semiconductor. By planarizing the filling dielectric layer and the second semiconductor layer, a second semiconductor pattern 124 and a filling dielectric pattern 132 may be formed in the opening 115 and the recess region 120. The first and second semiconductor patterns 123 and 124 may configure a vertical active pattern 130a. Subsequently, the tipper dielectric layer 165, contact plug 167 and bit line 170 of FIG. 5B may be formed. Thus, the 3D semiconductor memory device of FIGS. 5A and 5B can be implemented. According to the above-described method, the uppermost gate pattern 220U may be formed, and thereafter the vertical active pattern 130a may be formed. Unlike this, after the opening 115, the recess region 120 and the vertical active pattern 130a may be formed, and then the uppermost gate pattern 220U may be formed.

When forming the uppermost gate pattern 220U, a stack-structure having a line shape may be formed by sequentially patterning the gate layers 220, 220a and 220L and insulation layers 110 under the uppermost gate pattern 220U. In this case, the 3D semiconductor memory device of FIGS. 4A and 4B can be implemented. In other words, the 3D semiconductor memory device of FIGS. 4A and 4B may be implemented in the method that has been described above with reference to FIGS. 9A to 9D or a modified method of a portion of the fabricating method of FIGS. 10A to 10C.

Figure 11:
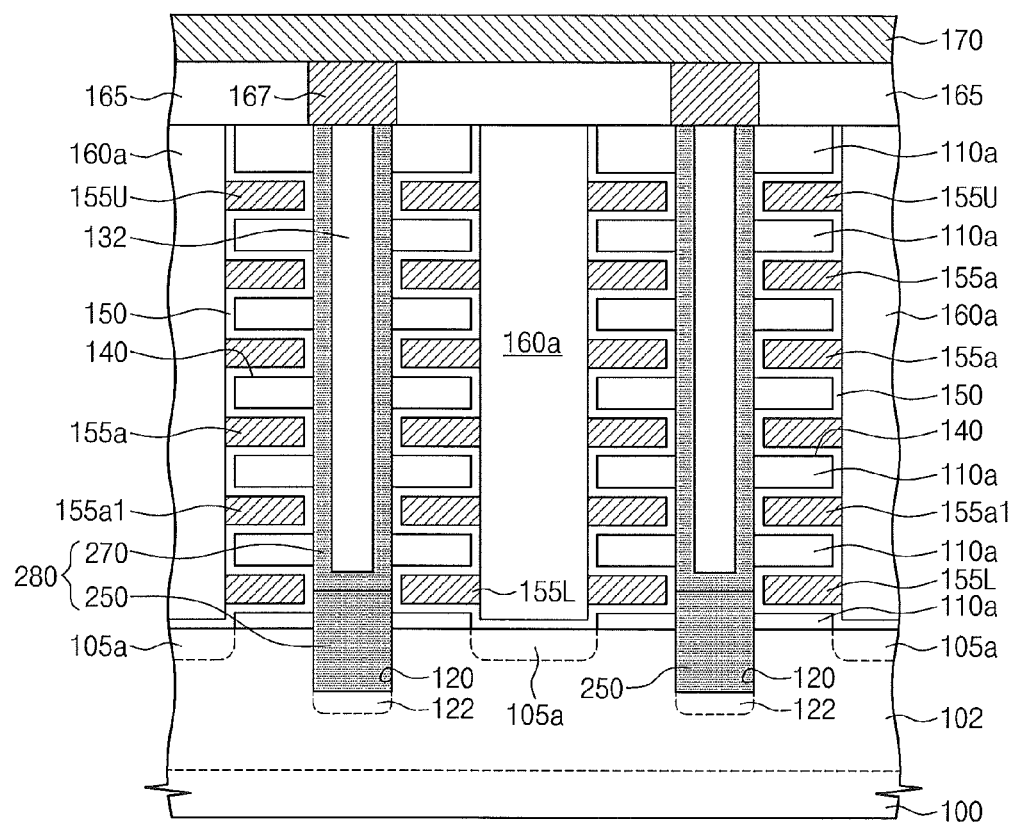
FIG. 11 is a cross-sectional view illustrating a 3D semiconductor memory device according to another embodiment of the inventive concept.

FIG. 11 is a cross-sectional view illustrating a 3D semiconductor memory device according to another embodiment of the inventive concept. Referring to FIG. 11, a well region 102 doped with a first conductive dopant may be disposed in a substrate 100. A stack-structure may be disposed on the well region 102. The stack-structure may include insulation patterns 110a and gate patterns 155L, 155a1, 155a and 155U that are alternately and repeatedly stacked on the well region 102. A plurality of the stack-structures may be disposed on the well region 102. The stack-structures may be spaced apart from each other. As illustrated in FIG. 1a, the stack-structures may be extended in parallel.

A vertical active pattern 280 may pass through the stack-structure. Also, the vertical active pattern 280 may be extended into a recess region 120 that is formed in the substrate 100 under the vertical active pattern 280. The vertical active pattern 280 may include a lower active pattern 250 and an upper active pattern 270 that are sequentially stacked. The lower active pattern 250 may fill the recess region 120. The upper active pattern 270 may contact the inner surface (i.e., inner sidewall and bottom surface) of the recess region 120. The lower active pattern 250 is disposed in the recess region 120 and contacts the well region 102. The upper surface of the lower active pattern 250 may be disposed on a level higher than that of the upper surface of the substrate 100. According to an embodiment of the inventive concept, as illustrated in FIG. 11, the upper surface of the lower active pattern 250 may be higher than the lower surface of the lowermost gate pattern 155L and lower than the upper surface of the lowermost gate pattern 155L. However, the inventive concept is not limited thereto.

The upper active pattern 270 contacts the upper surface of the lower active pattern 250. According to an embodiment of the inventive concept, the lower active pattern 250 may have a pillar shape, and the upper active pattern 270 may have a pipe shape or a macaroni shape. In this case, the inside of the upper active pattern 270 may be filled with a filling dielectric pattern 132. The lower and upper active patterns 250 and 270 may include a semiconductor material. For example, the lower and upper active patterns 250 and 270 may include the same semiconductor material as that of the substrate 100. As an example, when the substrate 100 is a silicon substrate, the lower and upper active patterns 250 and 270 may include silicon. According to an embodiment of the inventive concept, the lower active pattern 250 may have a single crystalline state. The upper active pattern 270 may have a polycrystalline state. The lower active pattern 250 may be doped with a dopant having the same type as that of the well region 102. The upper active pattern 270 may be doped with a dopant having the same type as that of the well region 102, or may have an undoped state.

A high concentration region 122 may be disposed under the bottom surface of the recess region 120. The high concentration region 122 may correspond to a portion of the well region 102, and it may have a higher dopant concentration than another portion of the well region 102. A gate dielectric layer 150 may be disposed between a sidewall of the vertical active pattern 280 and each of the gate patterns 155L, 155a1, 155a and 155U. As described above in first embodiment of the inventive concept, the gate dielectric layer 150 may be extended horizontally and cover the upper surface and lower surface of each of the gate patterns 155L, 155a1, 155a and 155U.

According to an embodiment of the inventive concept, a common source regions 105a may be disposed in the substrate 100 of the both sides of the stack-structure, respectively. The common source region 105a may be laterally separated from the lower active pattern 250. The common source region 105a is doped with a second conductive dopant. A device isolation pattern 160a may be disposed between the stack-structures. The common source region 105a may be disposed under the device isolation pattern 160a. In operating of the 3D semiconductor memory device, a horizontal channel may be generated in the well region 102 under the lowermost gate pattern 155L. The common source region 105a may be electrically connected to vertical channels that are formed in the vertical active pattern 280 by the horizontal channel in the well region 102.

A contact plug 167 passing through the interlayer dielectric 165 may be connected to the upper end of the upper active pattern 270. A drain doped with the second conductive dopant may be disposed in the upper portion of the upper active pattern 270. The lower surface of the drain may be disposed on a level adjacent to the upper surface of the uppermost gate pattern 155U in the stack-structure.

According to the above-described 3D semiconductor memory device, the lower active pattern 250 included in the vertical active pattern 280 fills the recess region 120 to contact the well region 102. Therefore, reliability for the operations of a vertical cell string can be improved. Particularly, reliability for the erasing operation of cell transistors can be enhanced. Also, the vertical active pattern 280 may be divided into the lower active pattern 250 and the upper active pattern 270. Accordingly, an independent and additional process may be performed in the lower active pattern 250. For example, a dopant concentration may be adjusted in the lower active pattern 250. Thus, it is very easy to control the characteristic of the 3D semiconductor memory device. As a result, the 3D semiconductor memory device can be implemented which has excellent reliability and is optimized for high integration.

Next, the modification examples of the 3D semiconductor memory device will be described below with reference to the accompanying drawings.

Figure 12A:
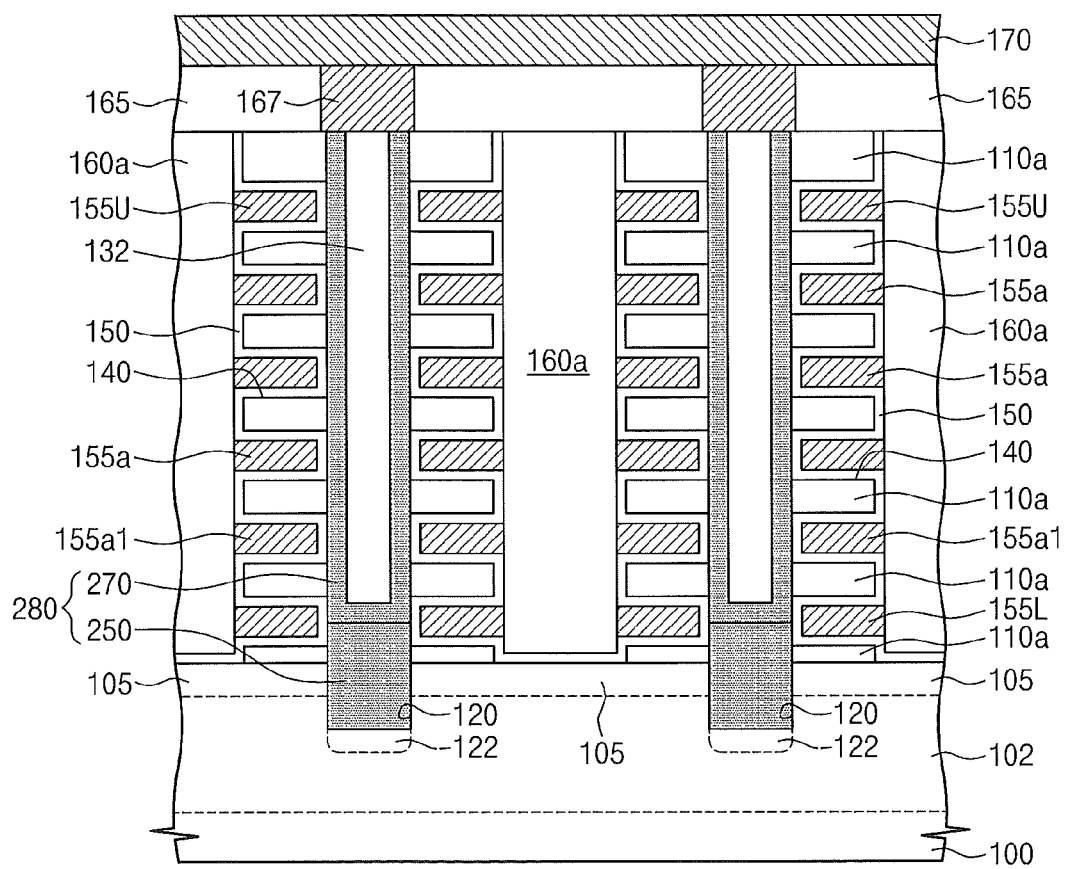
FIG. 12A is a cross-sectional view illustrating a modification example of a 3D semiconductor memory device according to another embodiment of the inventive concept.

FIG. 12A is a cross-sectional view illustrating a modification example of a 3D semiconductor memory device according to another embodiment of the inventive concept. Referring to FIG. 12A, a common source region 105 may be extended to the substrate 100 under the stack-structures. For example, the entire lower surface of the lowermost gate pattern 155L may substantially overlap with the common source region 105. In this case, the bottom of the recess region 120 may be disposed on a level lower than the lower surface of the common source region 105. The common source region 105 may contact a sidewall of the lower active pattern 250.

Figure 12B:
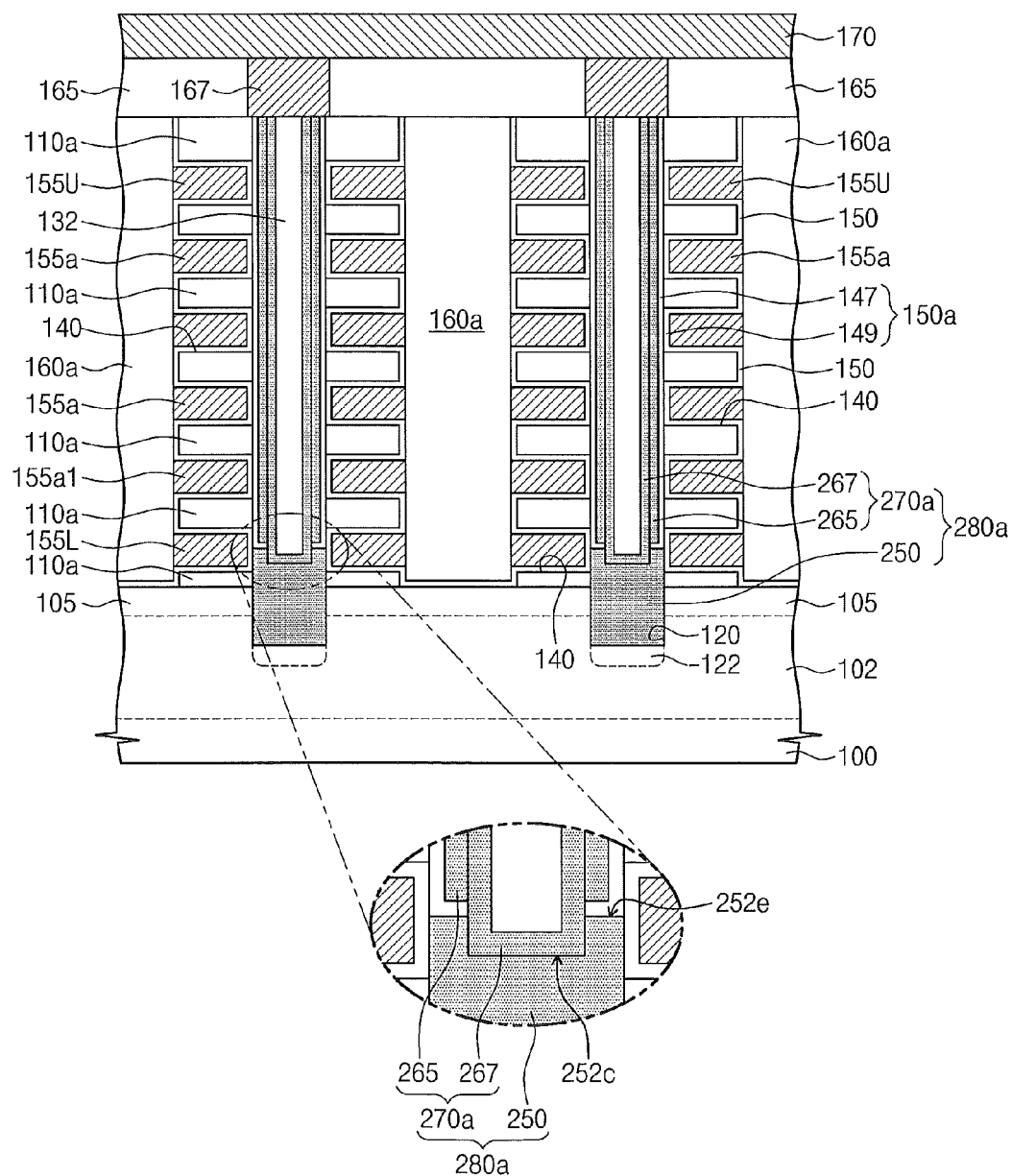
FIG. 12B is a cross-sectional view illustrating other modification example of a 3D semiconductor memory device according to another embodiment of the inventive concept.

FIG. 12B is a cross-sectional view illustrating other modification example of a 3D semiconductor memory device according to another embodiment of the inventive concept. Referring to FIG. 12B, a vertical active pattern 280a may include a lower active pattern 250 and an upper active pattern 270a that are sequentially stacked. A gate dielectric layer 150a may be disposed between the upper active pattern 270a and each of the gate patterns 155a1, 155a and 155U disposed next to the upper active pattern 270a. The gate dielectric layer 150a may include a first and a second sub-layers 147 and 149. As described above in first embodiment of the inventive concept, the first sub-layer 147 may be extended vertically and be disposed between the upper active pattern 270a and the insulation pattern 110a. The second sub-layer 149 may be extended horizontally and cover the lower surface and upper surface of each of the gate patterns 155a1, 155a and 155U.

When the upper surface of the lower active pattern 250 is disposed on a level between the levels of the lower and upper surfaces of the lowermost gate pattern 155L, the first sub-layer 147 may not exist between the lower active pattern 250 and the lowermost gate pattern 155L. The upper active pattern 270a may include a first semiconductor pattern 265 and a second semiconductor pattern 267. The first semiconductor pattern 265 may be disposed between the first sub-layer 147 and the second semiconductor pattern 267. The first semiconductor pattern 265 may be separated from the upper surface of the lower active pattern 250 by a portion of the first sub-layer 147. The second semiconductor pattern 267 contacts the first semiconductor pattern 265. Also, the second semiconductor pattern 267 contacts the upper surface of the lower active pattern 250.

The upper surface of the lower active pattern 250 may be divided into a center portion 252c contacting the second semiconductor pattern 267 and an edge portion 252e contacting the first sub-layer 147. Herein, the center portion 252c of the upper surface of the lower active pattern 250 may be disposed on a level lower than that of the edge portion 252e. The upper active pattern 270a including the first and second semiconductor patterns 265 and 267 may have a pipe shape or a macaroni shape. In this case, the inside of the upper active pattern 270a may be filled with a filling dielectric pattern 132. The first and second semiconductor patterns 265 and 267 may have a poly-crystalline state. In the modification example, the first and second sub-layers 147 and 149 may be replaced by the first and second sub-layers 147a and 149a of FIG. 3C or the first and second sub-layers 147b and 149b of FIG. 3C. Unlike this, as described above in first embodiment of the inventive concept, the first and second sub-layers 147 and 149 may be formed by another combination of a tunnel dielectric layer, a charge storage layer and a blocking dielectric layer.

Figure 12C:
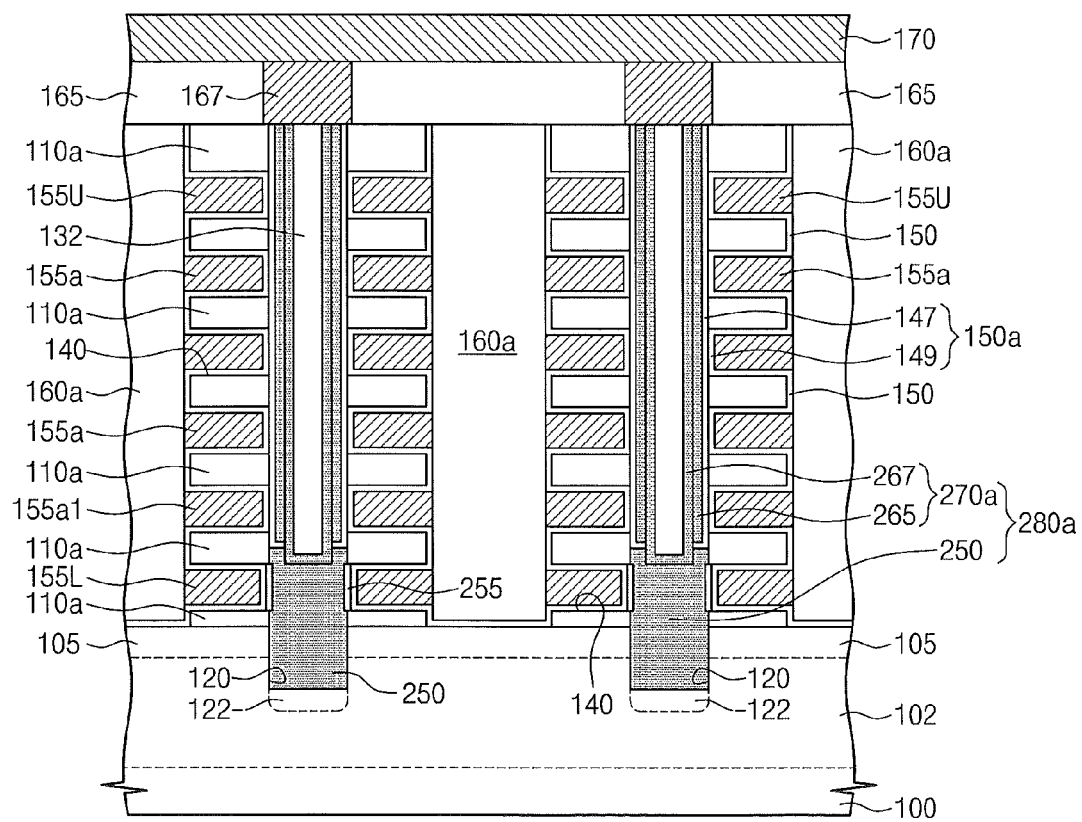
FIG. 12C is a cross-sectional view illustrating still other modification example of a 3D semiconductor memory device according to another embodiment of the inventive concept.

FIG. 12C is a cross-sectional view illustrating still other modification example of a 3D semiconductor memory device according to another embodiment of the inventive concept. Referring to FIG. 12C, at least edge portion of the upper surface of the lower active pattern 250 may be disposed on a level higher than the upper surface of the lowermost gate pattern 155L. In this case, an oxide layer 255 may be disposed between the sidewall of the lower active pattern 250 and the lowermost gate pattern 155L. The oxide layer 255 may include oxide formed by oxidizing the sidewall of the lower active pattern 250. Therefore, the width of a first portion of the lower active pattern 250 next to the oxide layer 255 may be less than that of a second portion of the lower active pattern 250 disposed in the recess region 120.

When the gate dielectric layer 150a includes the first and second sub-layers 147 and 149, the oxide layer 255 and a portion of the second sub-layer 149 may be disposed between the sidewall of the lower active pattern 250 and the lowermost gate pattern 155L. In other words, the first sub-layer 147 may not exist between the sidewall of the lower active pattern 250 and the lowermost gate pattern 155L. According to an embodiment of the inventive concept, when the first sub-layer 147 includes a charge storage layer, the charge storage layer may not exist between the sidewall of the lower active pattern 250 and the lowermost gate pattern 155L. Therefore, the reliability of a ground selection transistor including the lowermost gate pattern 155L can be improved. Moreover, the lower active pattern 250 may have a single crystalline state. Accordingly, the reliability of the ground selection transistor can be more enhanced.

Figure 12D:
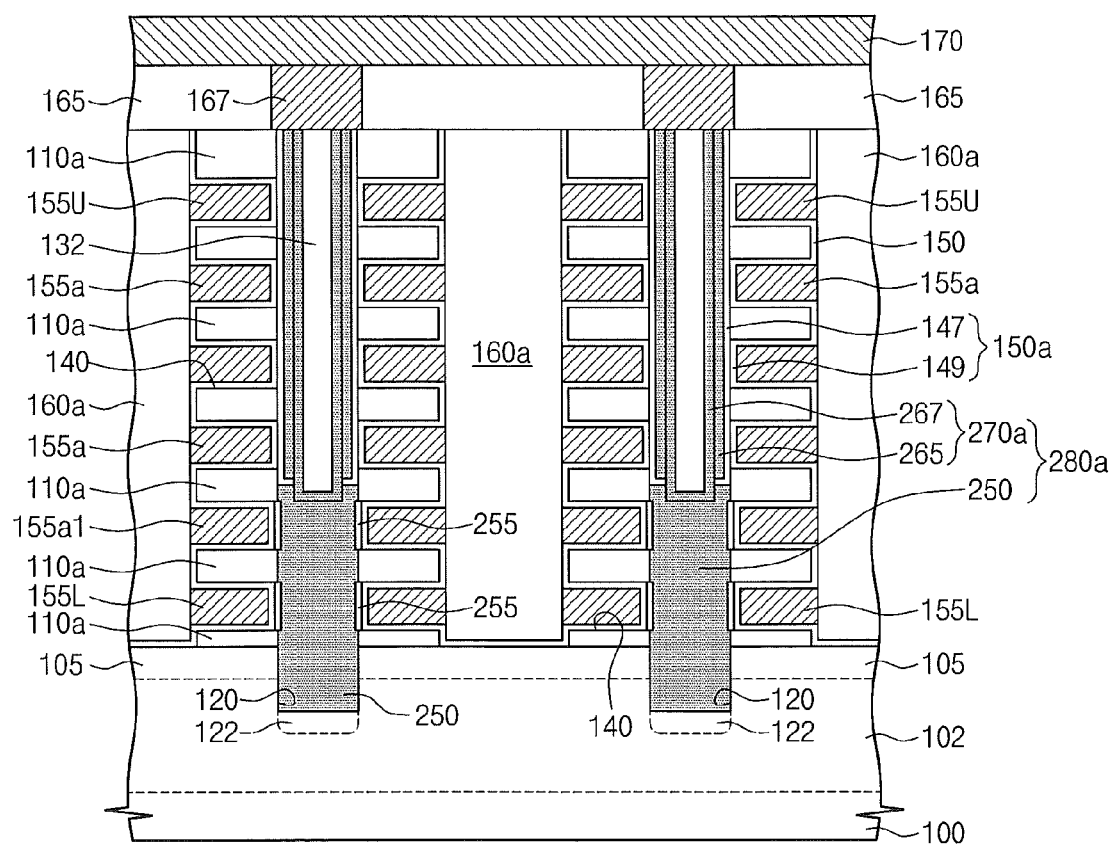
FIG. 12D is a cross-sectional view illustrating even other modification example of a 3D semiconductor memory device according to another embodiment of the inventive concept.

FIG. 12D is a cross-sectional view illustrating even other modification example of a 3D semiconductor memory device according to another embodiment of the inventive concept. Referring to FIG. 12D, at least the edge portion of the upper surface of a lower active pattern 250 may be disposed on a level higher than the upper surface of a gate pattern 155a1 that is stacked secondarily from the substrate 100 and lower than the lower surface of a gate pattern that is stacked thirdly from the substrate 100. The secondarily-stacked gate pattern 155a1 and the thirdly-stacked gate pattern are disposed over the lowermost gate pattern 155L. In this case, an oxide layer 255 may also be disposed between the secondarily-stacked gate pattern 155a1 and the side wall of the lower active pattern 250.

According to the modification example, a transistor including the secondarily-stacked gate pattern 155a1 may be used as a dummy transistor or a second ground selection transistor. In this case, a cell gate (for example, the thirdly-stacked gate pattern 155a) adjacent to the secondarily-stacked gate pattern 155a1 may correspond to a dummy cell gate. As described above, a dummy cell transistor including the dummy cell gate has the same type as that of a cell transistor storing data, but it may not serve as a cell transistor. As an example, in operating of the cell string, the dummy cell transistor may perform only a turn-on/off function. However, the inventive concept is not limited thereto. The thirdly-stacked gate pattern may be used as a cell transistor.

Figure 12E:
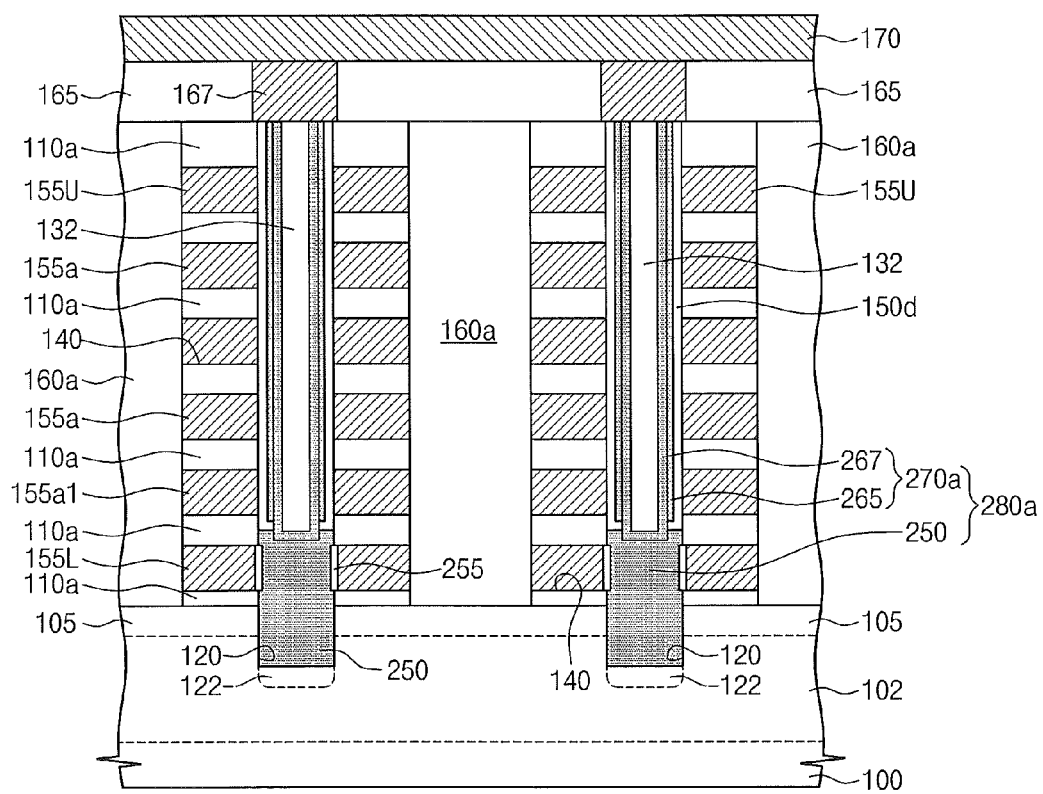
FIG. 12E is a cross-sectional view illustrating yet other modification example of a 3D semiconductor memory device according to another embodiment of the inventive concept.

FIG. 12E is a cross-sectional view illustrating yet other modification example of a 3D semiconductor memory device according to another embodiment of the inventive concept. Referring to FIG. 12E, the entirety of a gate dielectric layer 150d between the sidewall of the upper active pattern 270a and each of the gate patterns 155a1, 155a and 155U may be substantially extended vertically and be disposed between an upper active pattern 270a and an insulation pattern 110a. In this case, only an oxide layer 255 may be disposed between the sidewall of the lower active pattern 250 and the lowermost gate pattern 155L.

Figure 12F:
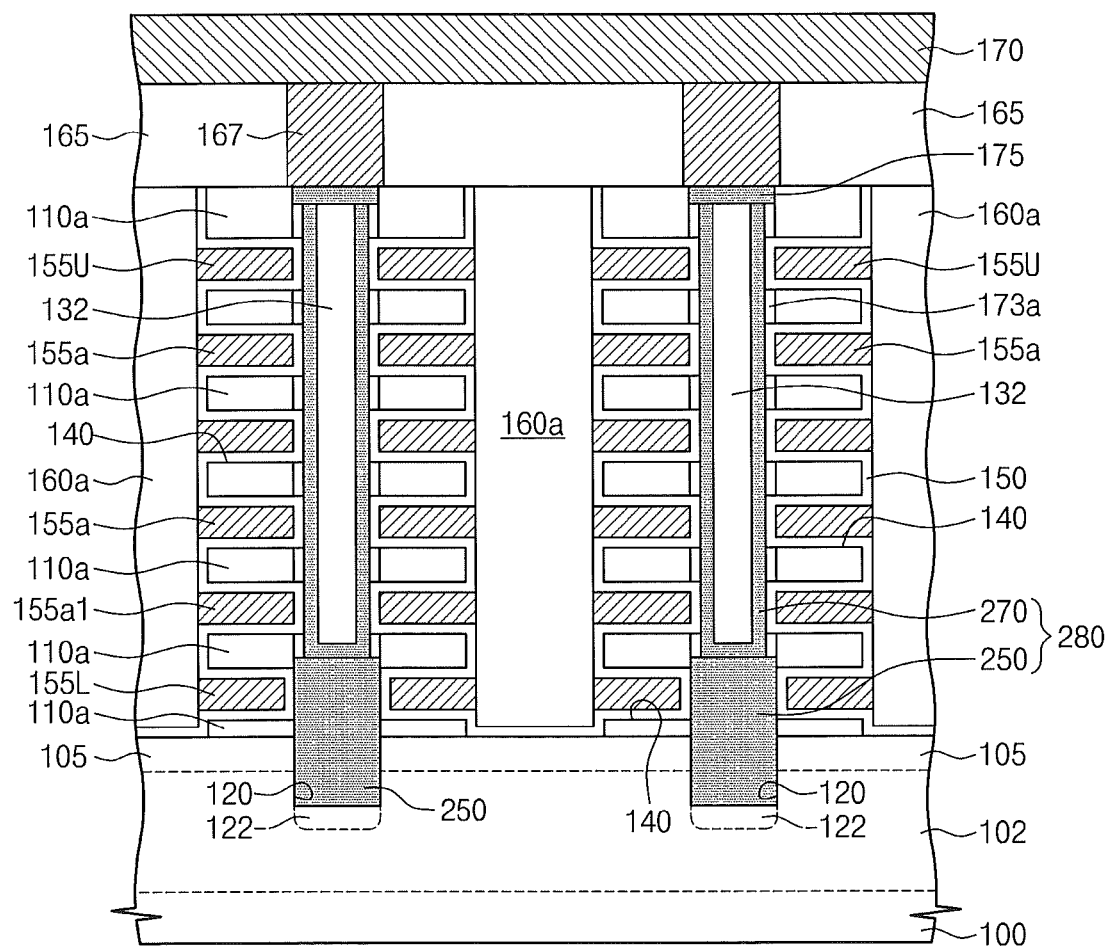
FIG. 12F is a cross-sectional view illustrating further modification example of a 3D semiconductor memory device according to another embodiment of the inventive concept.

FIG. 12F is a cross-sectional view illustrating further modification example of a 3D semiconductor memory device according to another embodiment of the inventive concept. Referring to FIG. 12F, protection dielectric patterns 173a may be disposed between the upper active pattern 270a and the insulation patterns 110a. In a fabricating process, the protection dielectric pattern 173a may include a dielectric material for protecting the upper active pattern 270. According to an embodiment of the inventive concept, the protection dielectric pattern 173a may not exist between the lower active pattern 250 and the inner sidewall of the recess region 120.

The elements of the above-described modification examples may be combined without clash or replaced. For example, the common source region 105a of FIG. 11 may be replaced with the common source region 105 of FIGS. 12B to 12F. For example, in the 3D semiconductor memory devices of FIGS. 11 and 12A to 12F, the heights of the upper surfaces of the lower active patterns 250 may be replaced.

Figure 13A:
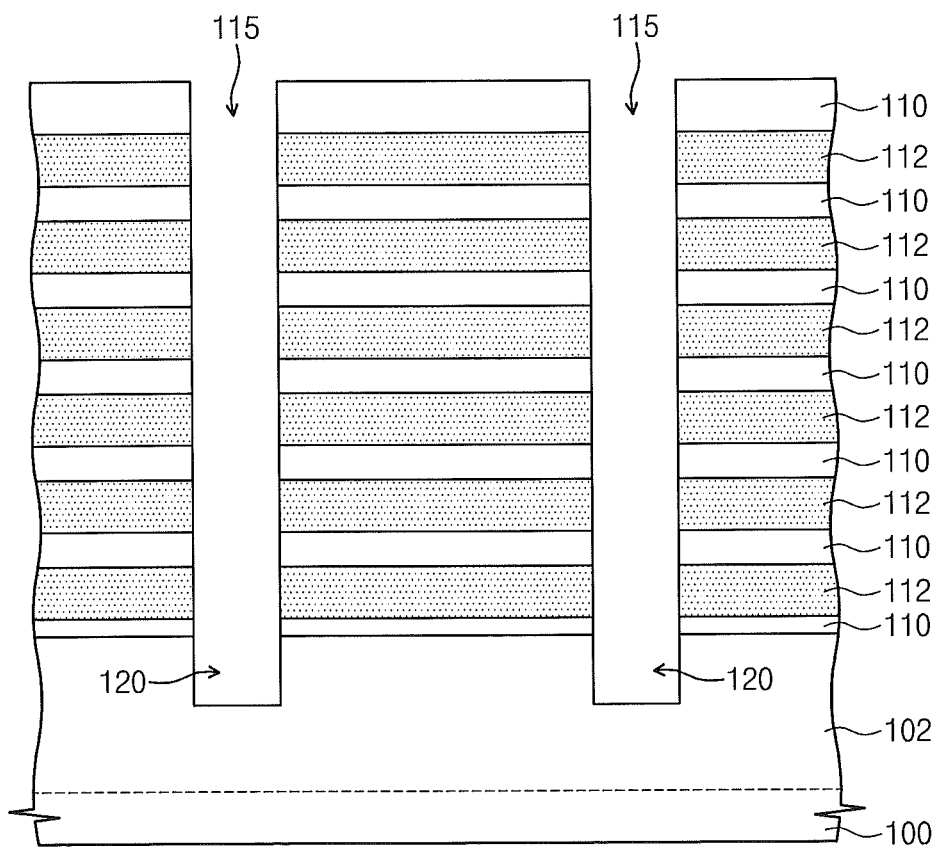
FIGS. 13A to 13E are cross-sectional views for describing a method of fabricating 3D semiconductor memory device according to another embodiment of the inventive concept.

FIGS. 13A to 13E are cross-sectional views for describing a method of fabricating 3D semiconductor memory device according to another embodiment of the inventive concept. Referring to FIG. 13A, a well region 102 may be formed by providing a first conductive dopant to the substrate 100. Insulation layers 110 and sacrificial layers 112 that are alternately and repeatedly stacked may be formed on the well region 102. A recess region 120 and an opening 115 that are sequentially stacked may be formed by sequentially patterning the insulation layers 110, the sacrificial layers 112 and the substrate 100. The opening 115 may pass through the insulation layers 110 and the sacrificial layers 112, and the recess region 120 may be self-aligned in the opening 115 and be formed in the substrate 100. The recess region 120 may expose the well region 102.

Figure 13B:
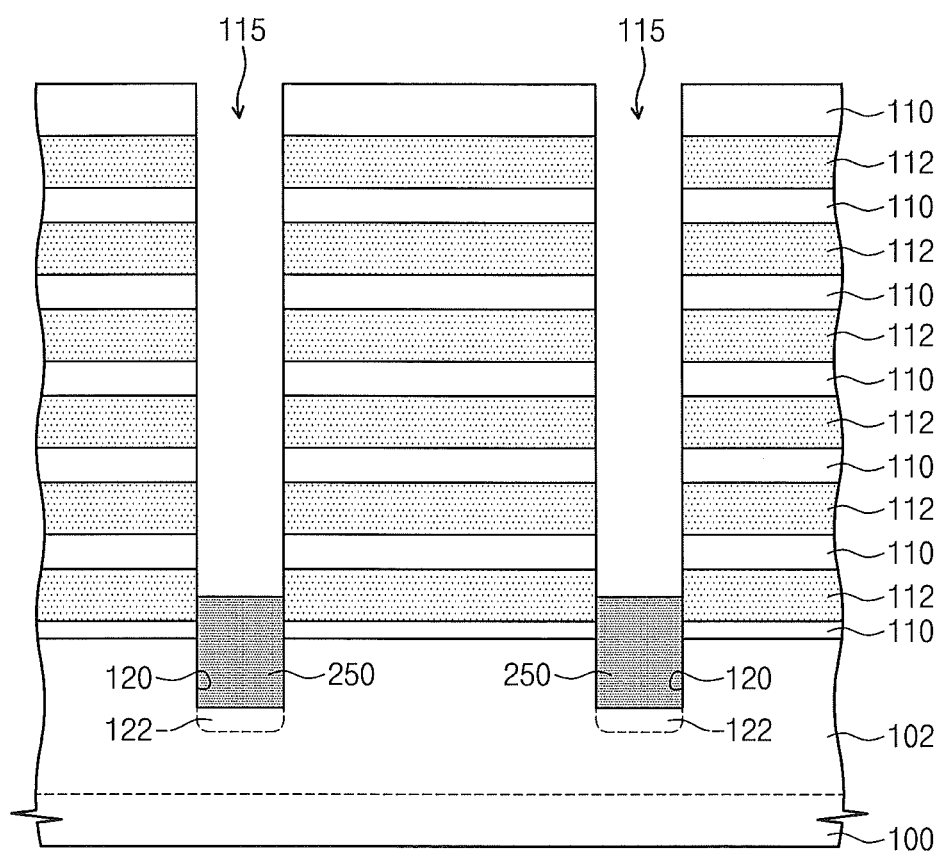

Referring to FIG. 13B, a high concentration region 122 may be formed by providing the first conductive dopant through the bottom of the recess region 120.

A lower active pattern 250 filling the recess region 120 may be formed. The upper surface of the lower active pattern 250 may be higher than the upper surface of the substrate 100. Therefore, a portion of the lower active pattern 250 may fill the lower portion of the opening 115. The lower active pattern 250 contacts the well region 102. The lower active pattern 250 may be formed in a selective epitaxial growth process that uses the substrate 100 exposed by the recess region 120 as a seed layer. Therefore, the lower active pattern 250 may be formed in a single crystalline state. The lower active pattern 250 may be formed in a pillar shape. The lower active pattern 250 may be doped with the first conductive dopant. The lower active pattern 250 may be doped by an in-situ process when the selective epitaxial growth process is performed. Unlike this, the lower active layer 250 may be doped by an ion-implanting process.

Figure 13C:
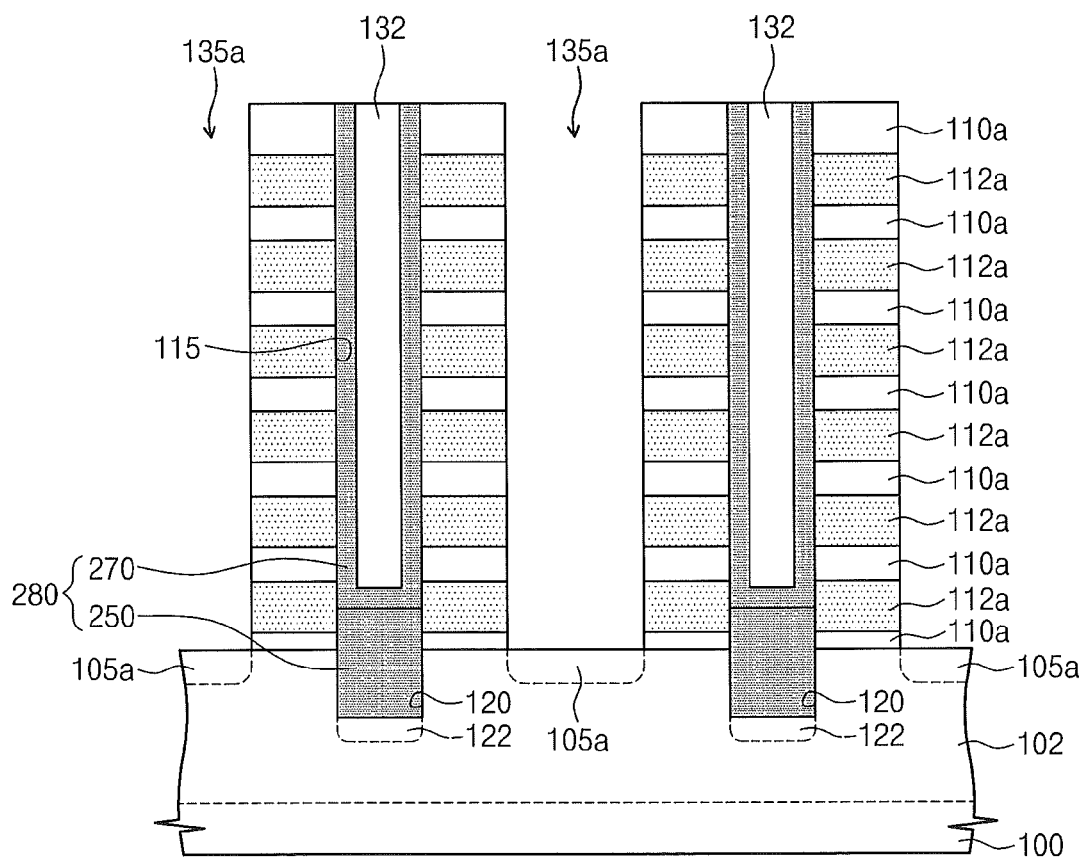

Referring to FIG. 13C, a semiconductor layer may be conformally formed on the substrate 100 having the lower active pattern 250, and a filling dielectric layer filling the opening 115 may be formed on the semiconductor layer. The semiconductor layer may be conformally formed on the inner sidewall of the opening 115 and the upper surface of the lower active pattern 250. The semiconductor layer may contact the lower active pattern 250. The semiconductor layer may be formed in a chemical vapor deposition process and/or an atomic layer deposition process. Therefore, the semiconductor layer may be formed in a poly-crystalline state.

By planarizing the filling dielectric layer and the semiconductor layer, an upper active pattern 270 and a filling dielectric pattern 132 may be formed in the opening 115. The lower and upper active patterns 250 and 270 may configure a vertical active pattern 280. Subsequently, a trench 135, insulation patterns 110a and sacrificial patterns 110a may be formed by sequentially patterning the insulation layers 110 and the sacrificial layers 112. The vertical active pattern 280 passes through the insulation patterns 110a and the sacrificial patterns 112a. Subsequently, by providing a second conductive dopant into the well region 102 under the trench 135, a common source region 105a may be formed.

Figure 13D:
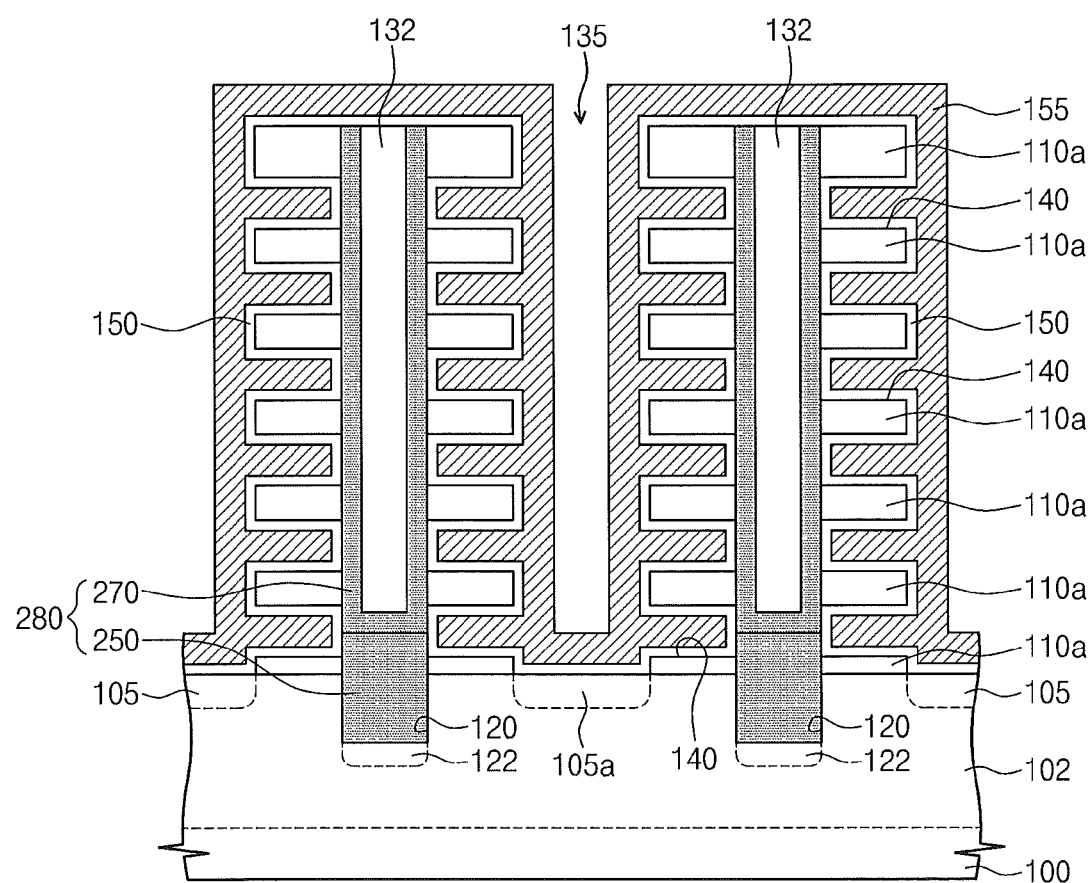

Referring to FIG. 13D, by removing sacrificial patterns 112a exposed to the trench 135, empty regions 140 may be formed. According to an embodiment of the inventive concept, at least a portion of an lowermost empty regions 140 may expose a portion of the sidewall of the lower active pattern 250. A gate dielectric layer 150 may be conformally formed on the substrate 100 having the empty regions 140, and a gate conductive layer 155 filling the empty regions 140 may be formed.

Figure 13E:
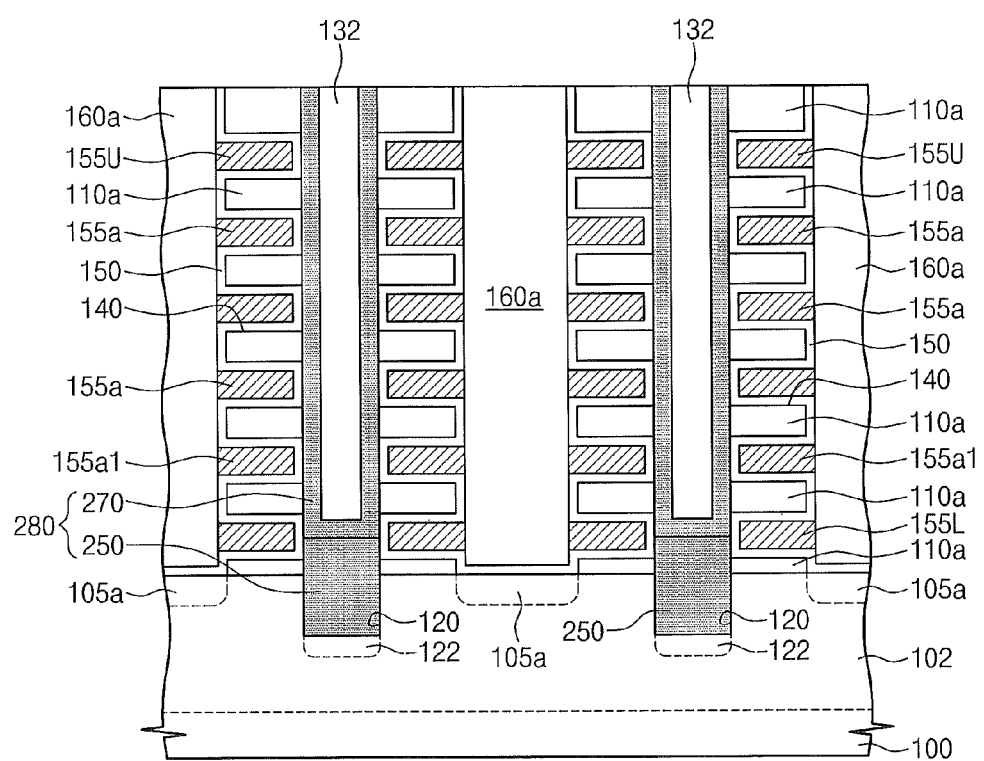

Referring to FIG. 13E, gate patterns 155L, 155a1, 155a and 155U, that are respectively disposed in the empty regions 140, may be formed by etching the gate conductive layer 155. Subsequently, a device isolation pattern 160a filling the trench 135 may be formed. The 3D semiconductor memory device of FIG. 11 may be implemented by forming the interlayer dielectric 165, contact plug 167 and bit line 170 of FIG. 11.

According to the above-described 3D semiconductor memory device, the opening 115 and the recess region 120 are formed in self-alignment, and the lower active pattern 250 fills the recess region 120 to contact the well region 102. After, the lower active pattern 250 is formed, and then the upper active pattern 270 may be formed. Therefore, the doping concentration of the lower active pattern 250 may be independently adjusted. As a result, the 3D semiconductor memory device having superior reliability can be implemented. The features of the method of fabricating 3D semiconductor memory device that is illustrated in FIG. 12A will be described below with reference to FIG. 14.

Figure 14:
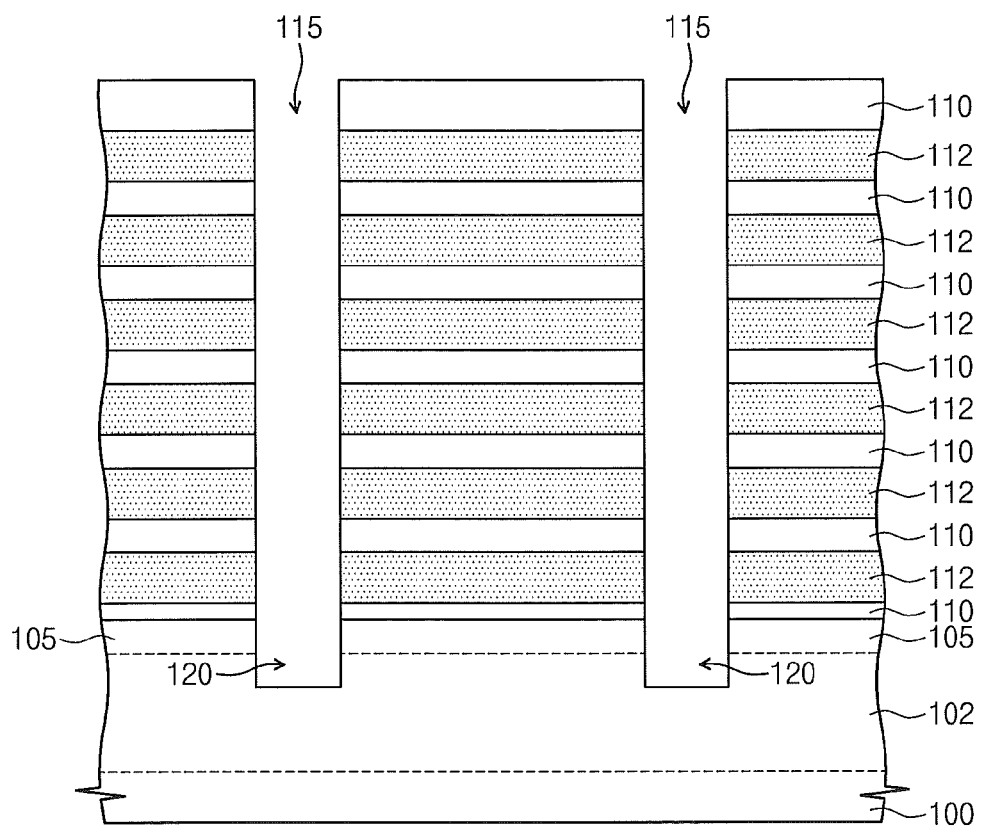
FIG. 14 is a cross-sectional view illustrating a modification example of a method of fabricating 3D semiconductor memory device according to another embodiment of the inventive concept.

FIG. 14 is a cross-sectional view illustrating a modification example of a method of fabricating 3D semiconductor memory device according to another embodiment of the inventive concept. Referring to FIG. 14, a second conductive dopant is injected into a substrate 100 having a well region 102, such that a common source region 105 may be formed. Insulation layers 110 and sacrificial layers 112 that are alternately and repeatedly stacked may be formed on the common source region 105. An opening 115 and a recess region 120 may be formed by sequentially patterning the insulation layers 110, the sacrificial layers 112 and the substrate 100. The recess region 120 may pass through the common source region 105, and thus the bottom surface of the recess region 120 may be lower than the lower surface of the common source region 105. The bottom surface of the recess region 120 may expose the well region 102, and the inner sidewall of the recess region 120 may expose the common source region 105. Successive processes may be performed identically to the process that has been described above with reference to FIG. 13A through FIG. 13E. However, the process of forming the common source region 105a that has been described above with reference to FIG. 13C may be omitted.

Figure 15A:
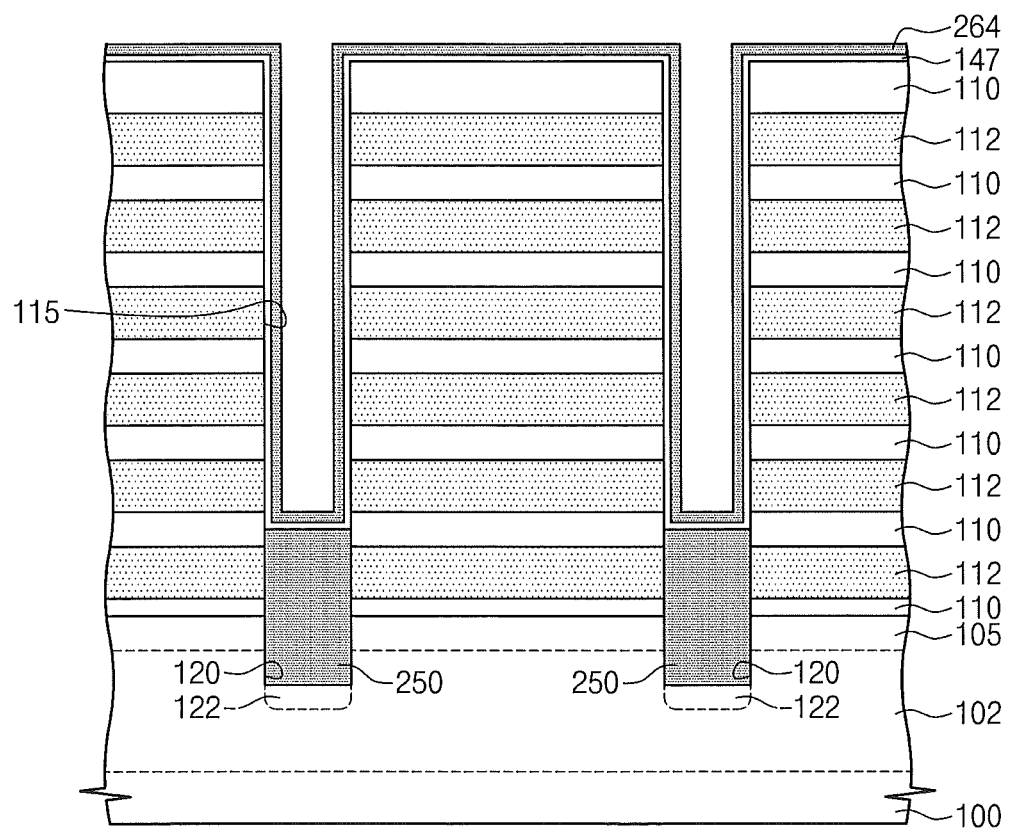
FIGS. 15A to 15F are cross-sectional views illustrating other modification example of a method of fabricating 3D semiconductor memory device according to another embodiment of the inventive concept.

FIGS. 15A to 15F are cross-sectional views illustrating other modification example of a method of fabricating 3D semiconductor memory device according to another embodiment of the inventive concept. A fabricating method according to the modification example may include the method that has been described above with reference to FIG. 14. Referring to FIGS. 14 and 15A, a lower active pattern 250 filling the recess region 120 may be formed on the substrate 100 having the opening 115 and the recess region 120. The lower active pattern 250 may be formed identically to the process that has been described above with reference to FIG. 13B. The level of the upper surface of the lower active pattern 250 may be adjusted. In FIG. 15A, the upper surface of the lower active pattern 250 may be higher than the level of the upper surface of a lowermost sacrificial layer and lower than the level of the lower surface of a sacrificial layer just on the lowermost sacrificial layer. A first sub-layer 147 may be conformally formed on the substrate 100 having the lower active pattern 250. A first semiconductor layer 264 may be conformally formed on the first sub-layer 147. The first semiconductor layer 264 may be formed in a chemical vapor deposition process and/or an atomic layer deposition process. The first semiconductor layer 264 may be formed in a poly-crystalline state.

Figure 15B:
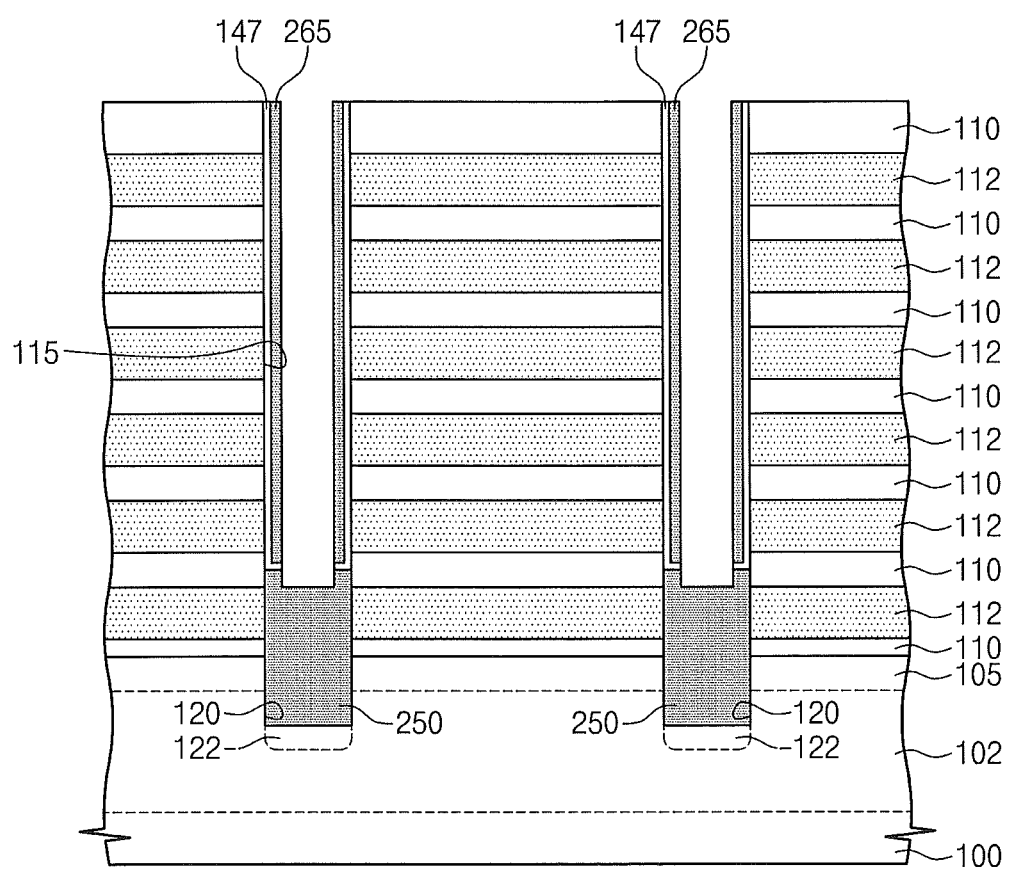

Referring to FIG. 15B, the first semiconductor layer 264 and the first sub-layer 147 may be blanket-anisotropic-etched until the upper surface of the lower active pattern 250 is exposed. Therefore, a first semiconductor pattern 265 may be formed in the opening 115. According to an embodiment of the inventive concept, the center portion of the exposed upper surface of the lower active pattern 250 may be recessed lower than the edge portion of the upper surface of the lower active pattern 250.

Figure 15C:
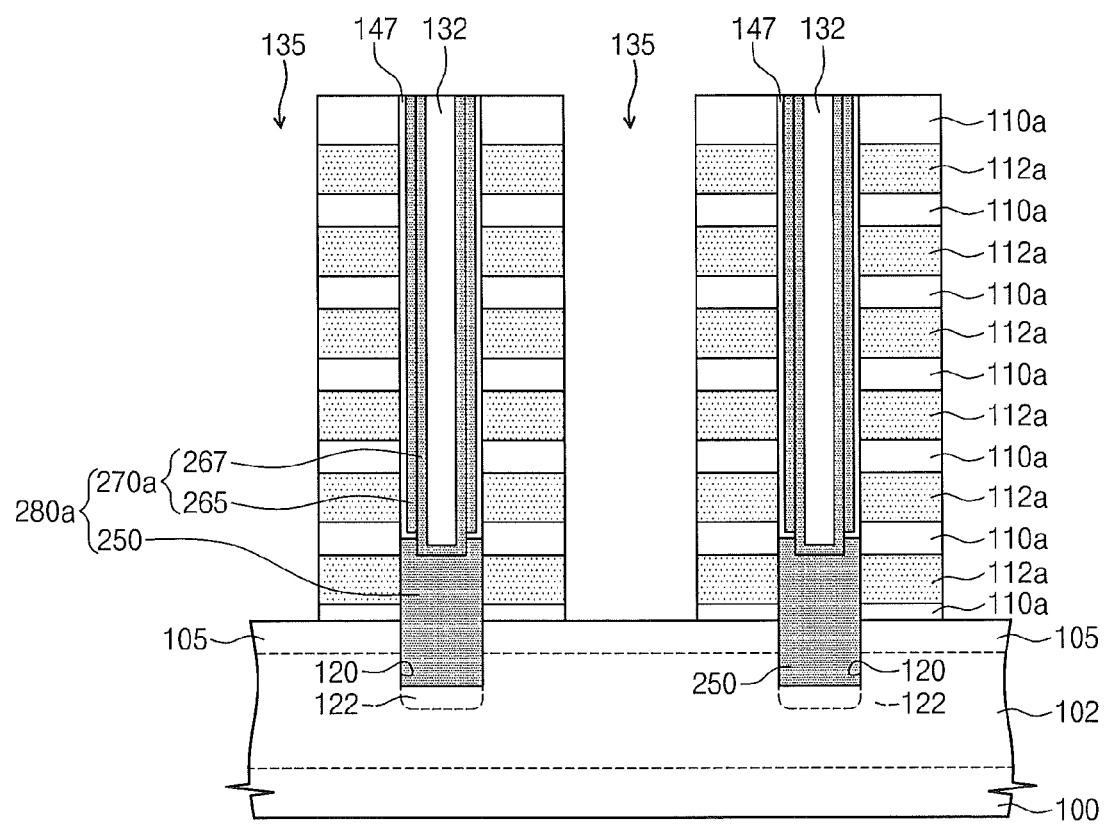

Referring to FIG. 15C, a second semiconductor layer may be conformally formed on the substrate 100 having the first semiconductor pattern 265, and a filling dielectric layer may be formed on the second semiconductor layer. The second semiconductor layer may contact the first semiconductor pattern 265 and the center portion of the upper surface of the lower active pattern 250. By planarizing the filling dielectric layer and the second semiconductor layer, a second semiconductor pattern 267 and a filling dielectric pattern 132 may be formed in the opening 115. The first and second semiconductor patterns 265 and 267 may configure an upper active pattern 270a, and the lower and upper active patterns 250 and 270a may configure a vertical active pattern 280a. Subsequently, a trench 135, insulation patterns 110a and sacrificial patterns 112a may be formed by sequentially patterning the insulation layers 110 and the sacrificial layers 112.

Figure 15D:
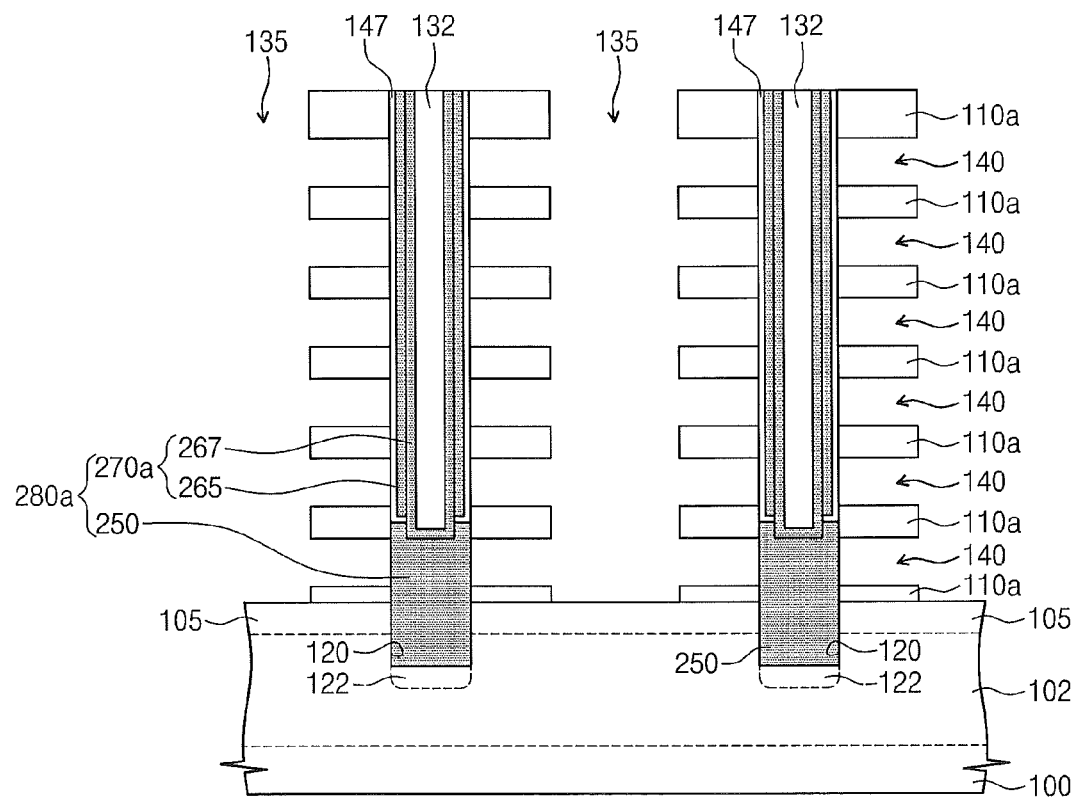

Referring to FIG. 15D, empty regions 140 may be formed by removing the sacrificial patterns 112a. According to an embodiment of the inventive concept, the lowermost empty region of the empty regions 140 may expose the sidewall of the lower active pattern 250, and empty regions on the lowermost empty region may expose the first sub-layer 147. However, the inventive concept is not limited thereto. The number of empty regions for exposing the sidewall of the lower active pattern 250 may vary with the height of the edge portion of the upper surface of the lower active pattern 250.

Figure 15E:
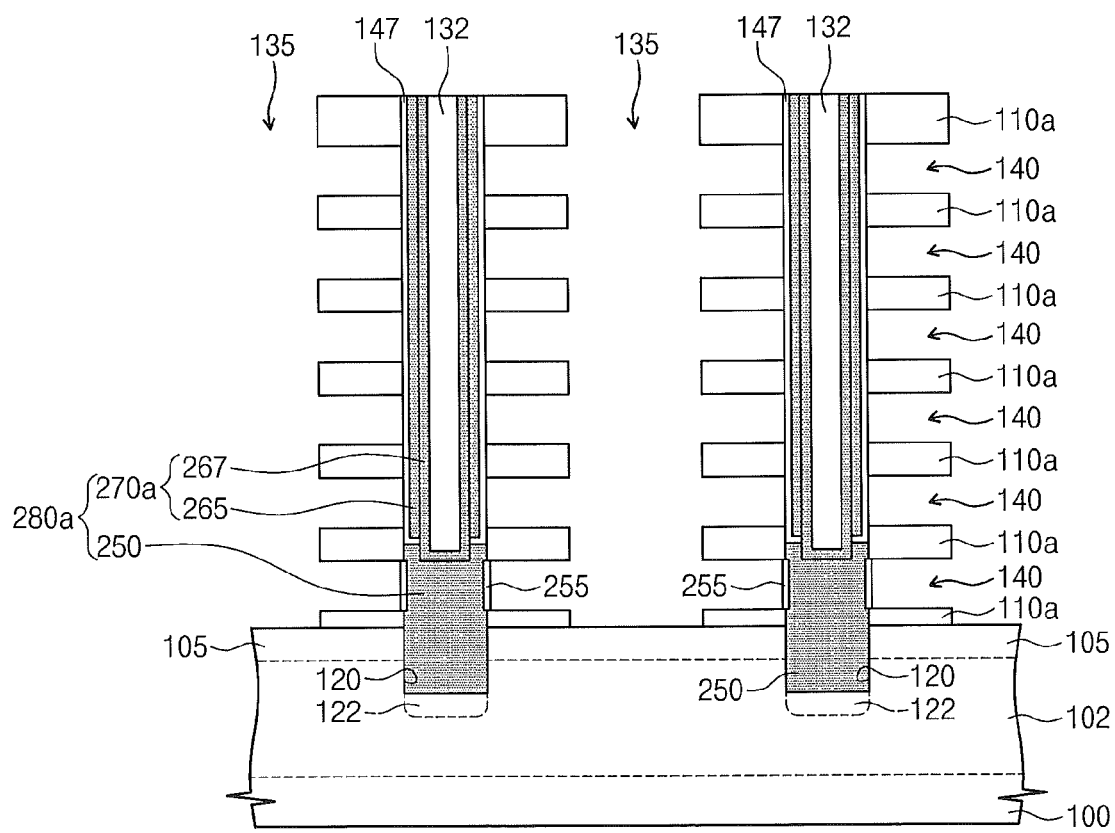

Referring to FIG. 15E, an oxide layer 255 may be formed by performing an oxidizing process in the exposed sidewall of the lower active pattern 250. When the lower active pattern 250 is formed of silicon, the oxide layer 255 may be formed of a silicon oxide. The sidewall of the upper active pattern 270a may not be oxidized by the first sub-layer 147.

Figure 15F:
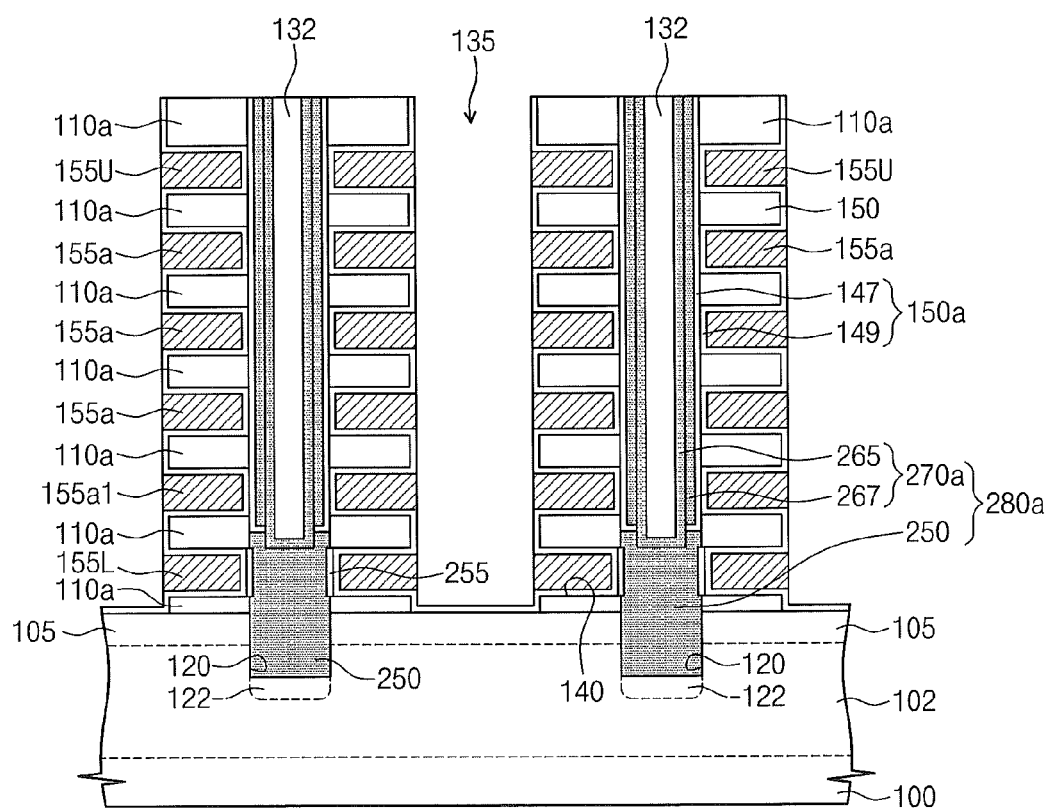

Referring to FIG. 15F, subsequently, a second sub-layer 149 may be conformally formed over the substrate 100, and gate patterns 155L, 155a1, 155a and 155U respectively filling the empty regions 140 may be formed. Subsequently, an isolation pattern 160a, an interlayer dielectric layer 165, a contact plug 167 and a bit line 170 may be formed. Therefore, the 3D semiconductor memory device of FIG. 12C can be implemented. In the fabricating method of FIGS. 15A to 15F, the level of the upper surface of the lower active pattern 250 may be higher than the level of the upper surface of a sacrificial layer that is stacked secondarily from the upper surface of the substrate 100 and lower than the level of the lower surface of a thirdly-stacked sacrificial layer. In this case, the 3D semiconductor memory device of FIG. 12D can be implemented. In the fabricating method of FIGS. 15A to 15F, when the level of the upper surface of the lower active pattern 250 is disposed between the levels of the upper and lower surfaces of the lowermost sacrificial layer and the oxidizing process is omitted, the 3D semiconductor memory device of FIG. 12B can be implemented. In the fabricating method of FIGS. 15A to 15F, when the first sub-layer 147 is replaced by the gate dielectric layer 150d and forming of the second sub-layer 149 is omitted, the 3D semiconductor memory device of FIG. 12E can be implemented. Next, a method of fabricating the 3D semiconductor memory device that is illustrated in FIG. 12F will be described below with reference to the accompanying drawings. The method may include the method that has been described above with reference to FIG. 14.

Figure 16A:
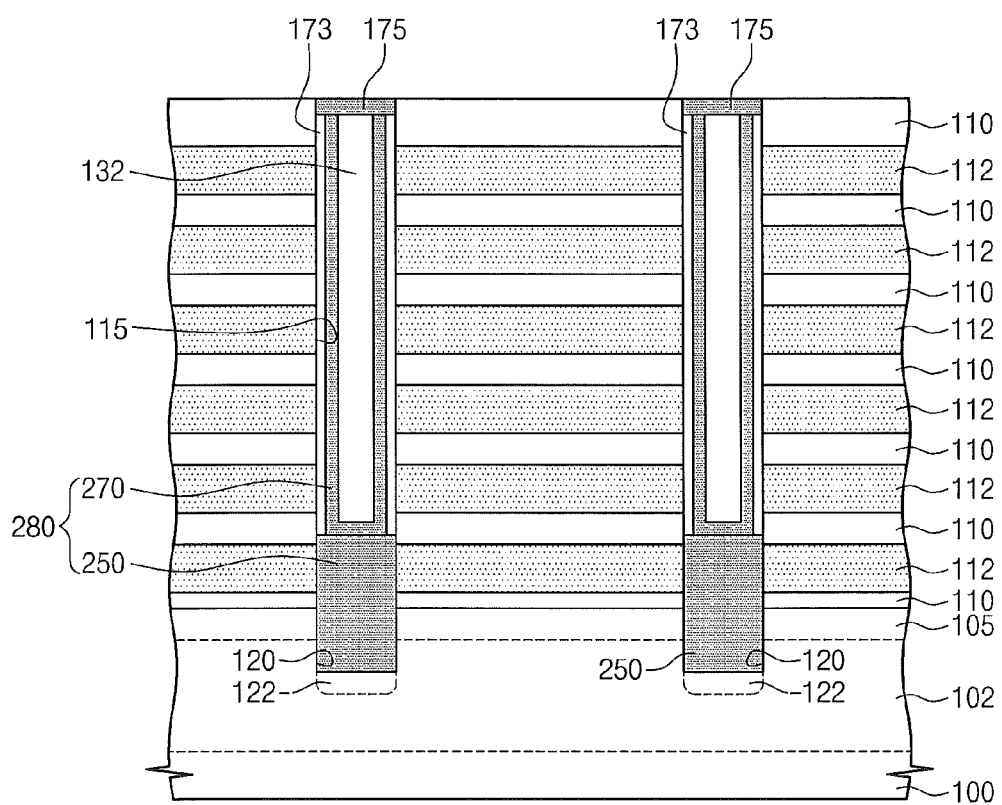
FIGS. 16A and 16B are cross-sectional views illustrating still other modification example of a method of fabricating 3D semiconductor memory device according to another embodiment of the inventive concept.
Figure 16B:
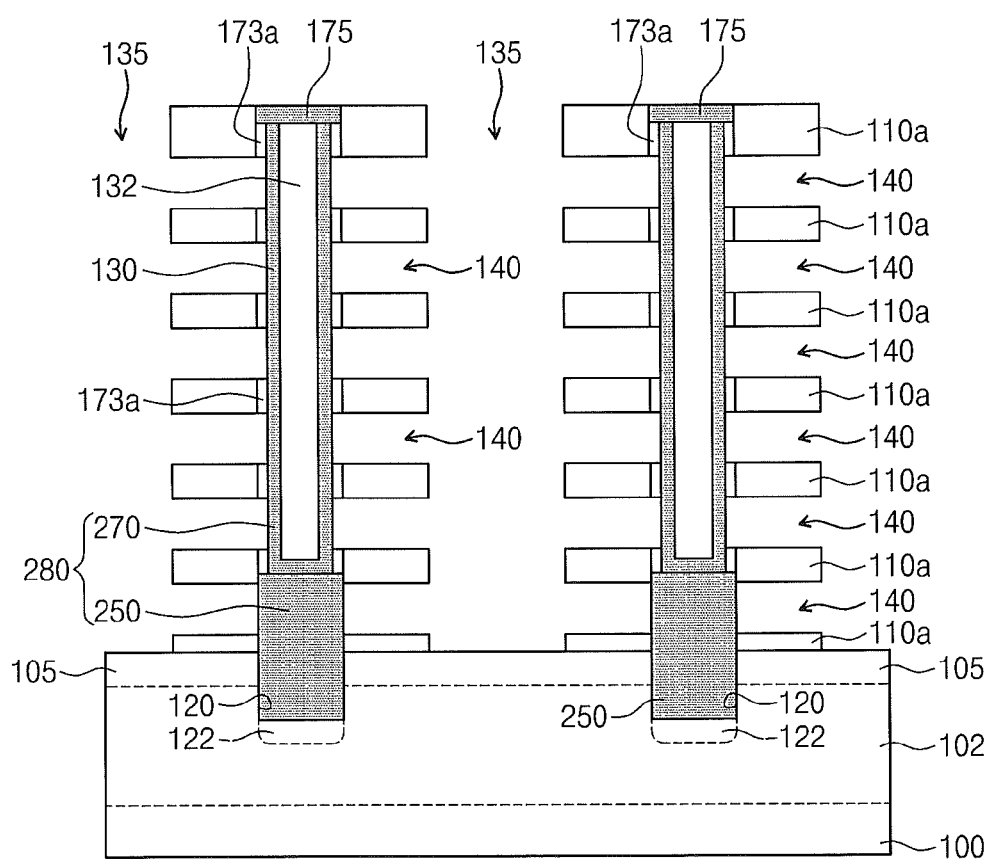

FIGS. 16A and 16B are cross-sectional views illustrating still other modification example of a method of fabricating 3D semiconductor memory device according to another embodiment of the inventive concept. Referring to FIGS. 14 and 16A, after a lower active pattern 250 may be formed, a protection dielectric layer may be conformally formed on the substrate 100. The protection dielectric layer may be blanket-anisotropic-etched until the upper surface of the lower active pattern 250 is exposed. Therefore, a protection dielectric layer 173 may be formed to have a spacer shape in the sidewall of the opening 115. Subsequently, a semiconductor layer may be conformally formed, and a filling dielectric layer may be formed. The filling dielectric layer and the semiconductor layer may be planarized, such that an upper active pattern 270 and a filling dielectric pattern 132 may be formed in the opening 115.

Subsequently, the upper ends of the protection dielectric layer 173, upper active pattern 270 and filling dielectric pattern 132 may be recessed, and then a capping semiconductor pattern 175 may be formed. The capping semiconductor pattern 175 may be formed in the same process as the process that has been described above with reference to FIG. 7B. Referring to FIG. 16B, a trench 135, insulation patterns 110a and sacrificial patterns 112a may be formed by sequentially patterning insulation layers 110 and sacrificial layers 112. Empty regions 140 may be formed by removing the sacrificial patterns 112a. At this point, the protection dielectric layer 173 may be used an etch stop layer. Subsequently, by removing some portions of the protection dielectric layer 173 exposed to the empty regions 140, some portions of the upper active pattern 270 may be exposed. Subsequently, the 3D semiconductor memory device of FIG. 12F can be implemented by performing the method that has been described above with reference to FIGS. 13D and 13E. According to an embodiment of the inventive concept, after forming the empty regions 140 of FIG. 16B and before forming a gate dielectric layer, an oxidizing process may be performed in the exposed sidewall of the lower active pattern 250.

The 3D semiconductor memory devices according to embodiments of the inventive concept may be implemented as various types of packages. For example, the 3D semiconductor memory devices according to embodiments of the inventive concept may be packaged in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP).

A package on which the 3D semiconductor memory device according to embodiments of the inventive concept is mounted may further include at least one semiconductor device (for example, a controller, a memory device and/or a hybrid device) performing another function.

Figure 17:
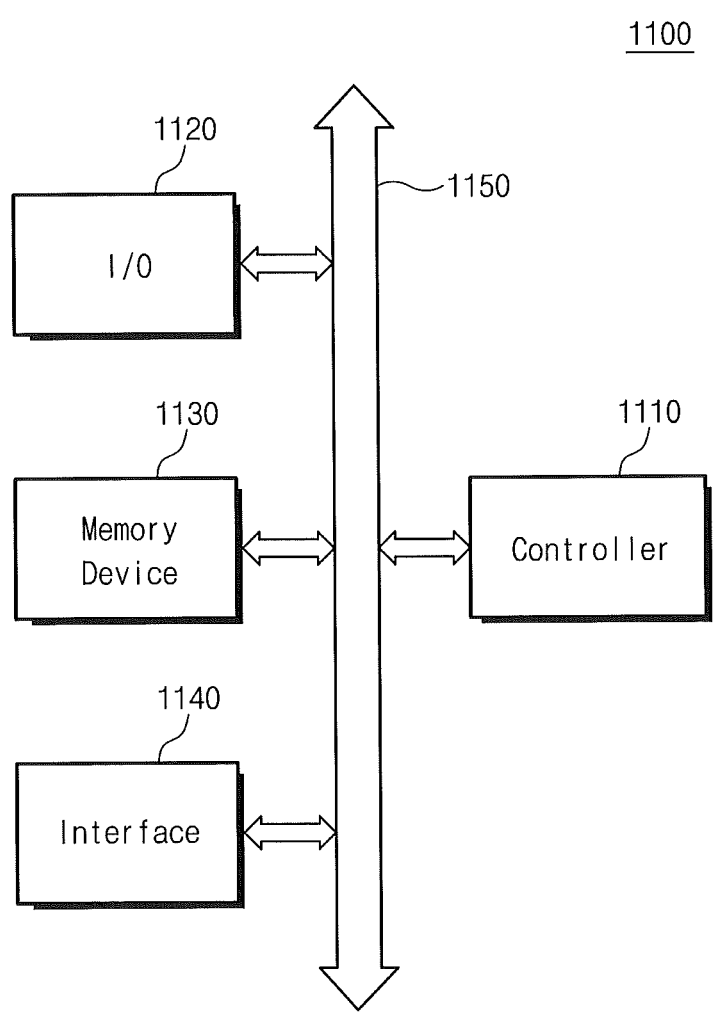
FIG. 17 is a block diagram schematically illustrating an example of an electronic system including a 3D semiconductor memory device according to an embodiment of the inventive concept.

FIG. 17 is a block diagram schematically illustrating an example of an electronic system including a 3D semiconductor memory device according to an embodiment of the inventive concept. Referring to FIG. 17, an electronic system 1100 according to an embodiment of the inventive concept may include a controller 1110, an input/output (I/O) unit 1120, a memory device 1130, an interface 1140, and a bus 1150. The controller 1110, the input/output (I/O) unit 1120, the memory device 1130 and/or the interface 1140 may be connected through the bus 1150. The bus 1150 corresponds to a path for transferring data.

The controller 1110 may include at least one of a microprocessor, a digital signal processor, a microcontroller, and logical devices for performing a function similar to the functions of the elements. The input/output unit 1120 may include a keypad, a keyboard, a display device and others. The memory device 1130 may store data and/or commands. The memory device 1130 may include at least one of the 3D semiconductor memory devices according to embodiments of the inventive concept. Also, the memory device 1130 may further include another type of semiconductor memory device (for example, Phase-change Random Access Memory (PRAM), Magnetoresistive Random Access Memory (MRAM), Dynamic Random Access Memory (DRAM) and/or Static Random Access Memory (SRAM)). The interface 1140 may transmit data to a communication network or receive data from the communication network. The interface 1140 may have a wired type or a wireless type. For example, the interface 1140 may include an antenna or a wired/wireless transceiver. Although not shown, the electronic system 1100 is a working memory device for improving the function of the controller 1110, and may further include a high-speed DRAM and/or a high-speed SRAM.

The electronic system 1100 may be applied to Personal Digital Assistants (PDAs), portable computers, web tablets, wireless phones, mobile phones, digital music players, memory cards, and all electronic devices for transmitting/receiving information at a wireless environment.

Figure 18:
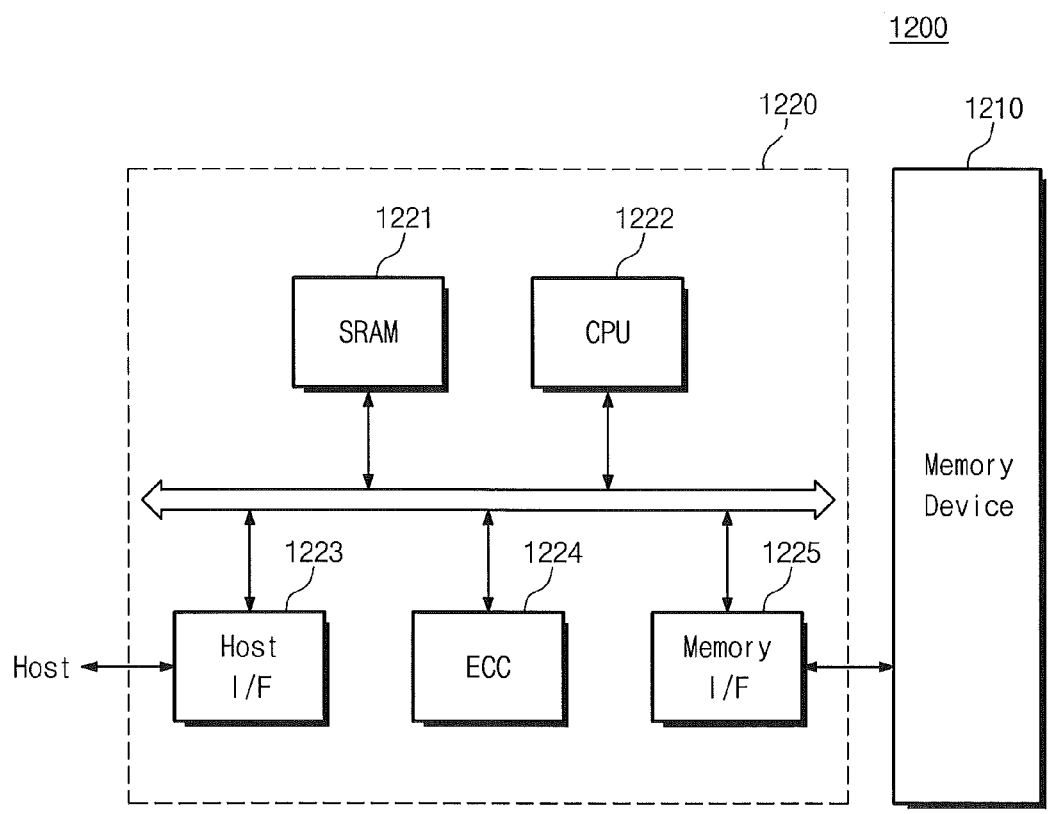
FIG. 18 is a block diagram schematically illustrating an example of a memory card including a 3D semiconductor memory device according to an embodiment of the inventive concept.

FIG. 18 is a block diagram schematically illustrating an example of a memory card including a 3D semiconductor memory device according to an embodiment of the inventive concept. Referring to FIG. 18, a memory card 1200 according to an embodiment of the inventive concept may include a memory device 1210. The memory device 1210 may include at least one of the 3D semiconductor memory devices according to embodiments of the inventive concept. Also, the memory device 1210 may further include another type of semiconductor memory device (for example, PRAM, MRAM, DRAM and/or SRAM). The memory card 1200 may include a memory controller 1220 for controlling data exchange between a host and the memory device 1210.

The memory controller 1220 may include a processing unit 1222 for controlling the overall operation of the memory card 1200. Also, the memory controller 1220 may include an SRAM 1221 that is used as the working memory of the processing unit 1222. Furthermore, the memory controller 1220 may further include a host interface 1223 and a memory interface 1225. The host interface 1223 may include a data exchange protocol between the memory card 1200 and the host. The memory interface 1225 may connect the memory controller 1220 and the memory device 1210. In addition, the memory controller 1220 may further include an error correction block (ECC) 1224. The error correction block 1224 may detect and correct the error of data that is read from the memory device 1210. Although not shown, the memory card 1200 may further include a ROM that stores code data for interfacing with the host. The memory card 1200 may be used as a portable data memory card. On the contrary, the memory card 1200 may be implemented as a Solid State Disk (SSD) that may replace the hard disk of a computer system.

According to the above-described 3D semiconductor memory device, the vertical active pattern can be disposed in the recess region of the common source region and be connected to the well region. Therefore, the distance between the vertical active pattern and the common source region can be minimized, and also, the vertical active pattern can be connected to the well region. As a result, the 3D semiconductor memory device which has excellent reliability and is optimized for high integration can be implemented.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

The invention claimed is:

1. A nonvolatile memory device, comprising:
a substrate having a well region of second conductivity type therein and a common source region of first conductivity type on the well region, said common source region forming a P-N rectifying junction with the well region;
a recess in said substrate, said recess extending entirely through the common source region and at least partially into the well region; and
a vertical stack of nonvolatile memory cells on said substrate, said vertical stack of nonvolatile memory cells comprising:
a vertical stack of spaced-apart gate electrodes on said substrate;
a vertical active region on sidewalls of the vertical stack of spaced-apart gate electrodes and on a sidewall of the recess; and
gate dielectric layers extending between respective ones of the vertical stack of spaced-apart gate electrodes and said vertical active region;
wherein at least one of a sidewall and bottom of said recess defines an interface between said vertical active region and the well region at a point in said substrate extending below the P-N rectifying junction between the common source region and the well region.

2. The memory device of claim 1, wherein each of said gate dielectric layers comprises a composite of a tunnel insulating layer in contact with said vertical active region, a charge storage layer on the tunnel insulating layer, a barrier dielectric layer on the charge storage layer and a blocking insulating layer extending between the barrier dielectric layer and a respective gate electrode; and wherein the barrier dielectric layer comprises a material having a greater bandgap relative to the blocking insulating layer.

3. The memory device of claim 1, wherein said recess has a protective dielectric layer on a sidewall thereof; and wherein the protective dielectric layer extends between said vertical active region and the common source region.

4. The memory device of claim 3, wherein a bottom of said recess defines an interface between said vertical active region and the well region.

5. The memory device of claim 1, wherein said vertical active region has a cylindrical shape.

6. The memory device of claim 5, wherein said vertical active region comprises a plurality of concentrically-arranged semiconductor layers of first conductivity type having equivalent or different dopant concentrations therein.

7. The memory device of claim 6, wherein each of said gate dielectric layers comprises a composite of a tunnel insulating layer in contact with said vertical active region, a charge storage layer on the tunnel insulating layer, a barrier dielectric layer on the charge storage layer and a blocking insulating layer extending between the barrier dielectric layer and a respective gate electrode; and wherein the barrier dielectric layer comprises a material having a greater bandgap relative to the blocking insulating layer.

8. The memory device of claim 6, wherein said vertical stack of spaced-apart gate electrodes has an opening extending therethrough that is aligned to said recess; wherein said gate dielectric layers have a cylindrical shape; and wherein said gate dielectric layers are concentrically-arranged relative to the plurality of concentrically-arranged semiconductor layers.

9. The memory device of claim 1, wherein said vertical active region comprises an active region plug filling the recess and a cylindrically-shaped active layer on the active region plug.

10. The memory device of claim 9, wherein the cylindrically-shaped active layer comprises a plurality of concentrically-arranged semiconductor layers of first conductivity type having equivalent or different doping concentrations therein.

11. The memory device of claim 9, further comprising a vertical stack of at least two spaced-apart gate electrodes of ground selection transistors extending opposite the active region plug.

12. The memory device of claim 11, wherein the ground selection transistors have respective gate dielectric layers on a side of the active region plug; and wherein the gate dielectric layers of said vertical stack of nonvolatile memory cells comprise different materials relative to the gate dielectric layers of the ground selection transistors.

13. The memory device of claim 9, further comprising at least one gate electrode of a ground selection transistor extending opposite the active region plug.

14. The memory device of claim 13, wherein the ground selection transistor has a gate dielectric layer on a sidewall of the active region plug; and wherein the gate dielectric layers of said vertical stack of nonvolatile memory cells comprise different materials relative to the gate dielectric layer of the ground selection transistor.

* * * * *